US011003009B2

(12) United States Patent
Yamazaki et al.

(10) Patent No.: US 11,003,009 B2
(45) Date of Patent: May 11, 2021

(54) DISPLAY DEVICE AND ELECTRONIC DEVICE

(71) Applicant: Semiconductor Energy Laboratory Co., Ltd., Kanagawa-ken (JP)

(72) Inventors: Shunpei Yamazaki, Tokyo (JP); Daisuke Kubota, Kanagawa (JP); Naoto Kusumoto, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 0 days.

(21) Appl. No.: 16/549,166

(22) Filed: Aug. 23, 2019

(65) Prior Publication Data

US 2019/0384079 A1     Dec. 19, 2019

Related U.S. Application Data

(62) Division of application No. 15/616,179, filed on Jun. 7, 2017, now Pat. No. 10,394,069.

(30) Foreign Application Priority Data

Jun. 10, 2016  (JP) .............................. JP2016-116264
Jun. 23, 2016  (JP) .............................. JP2016-124684

(51) Int. Cl.
*G02F 1/1335*      (2006.01)
*G02F 1/13357*     (2006.01)
(Continued)

(52) U.S. Cl.
CPC ............. *G02F 1/1335* (2013.01); *G02B 5/30* (2013.01); *G02B 5/3016* (2013.01);
(Continued)

(58) Field of Classification Search
None
See application file for complete search history.

(56) References Cited

U.S. PATENT DOCUMENTS 6,714,268 B2 ‡   3/2004   Wang ..................... G09G 3/20
                                                        257/40
6,888,522 B1     5/2005   Shibata et al.
(Continued)

FOREIGN PATENT DOCUMENTS

CN      100592547 C     2/2010
JP      2000-347184 A  12/2000
(Continued)

OTHER PUBLICATIONS

Ohide, T. et al., "Application of Transfer Technology to Manufacturing of Transmissive OLED and Reflective LC Hybrid (TR-Hybrid) Display," SID DIGEST '16: SID International Symposium Digest of Technical Papers, May 22, 2016, pp. 1002-1004.‡
(Continued)

*Primary Examiner* — Ashok Patel
(74) *Attorney, Agent, or Firm* — Husch Blackwell LLP

(57) ABSTRACT

A display device includes a first region and a second region adjacent to the first region. A display element included in the first region has a function of reflecting visible light and a function of emitting visible light. A display element included in the second region has a function of emitting visible light. In an electronic device including the display device, the first region is located on a first surface (e.g., top surface) on which a main image is displayed, and the second region is located on a second surface (e.g., side surface) on which an auxiliary image is displayed.

4 Claims, 36 Drawing Sheets

(51) Int. Cl.

| | |
|---|---|
| *F21S 2/00* | (2016.01) |
| *G02F 1/1333* | (2006.01) |
| *G02F 1/1347* | (2006.01) |
| *G09G 3/36* | (2006.01) |
| *G09G 3/32* | (2016.01) |
| *H01L 31/14* | (2006.01) |
| *G02B 5/30* | (2006.01) |
| *G09G 3/3233* | (2016.01) |
| *G09F 9/00* | (2006.01) |

(52) U.S. Cl.
CPC .... *G02F 1/13471* (2013.01); *G02F 1/133514* (2013.01); *G02F 1/133555* (2013.01); *G09G 3/32* (2013.01); *G09G 3/3233* (2013.01); *G09G 3/3648* (2013.01); *H01L 31/14* (2013.01); *F21S 2/00* (2013.01); *G02F 1/1333* (2013.01); *G02F 2001/13478* (2013.01); *G02F 2001/133626* (2013.01); *G02F 2201/44* (2013.01); *G02F 2203/01* (2013.01); *G02F 2203/02* (2013.01); *G02F 2203/09* (2013.01); *G09F 9/00* (2013.01); *G09G 2300/046* (2013.01); *G09G 2300/0842* (2013.01)

(56) References Cited

U.S. PATENT DOCUMENTS

| | | | | |
|---|---|---|---|---|
| 7,038,641 | B2 ‡ | 5/2006 | Hirota | G02B 6/0055 345/10 |
| 7,084,936 | B2 ‡ | 8/2006 | Kato | G02F 1/133553 |
| 7,102,704 | B2 ‡ | 9/2006 | Mitsui | G02F 1/133603 349/62 |
| 7,176,991 | B2 ‡ | 2/2007 | Mitsui | G02F 1/133603 349/11 |
| 7,239,361 | B2 ‡ | 7/2007 | Kato | G02F 1/133553 313/46 |
| 7,248,235 | B2 ‡ | 7/2007 | Fujii | G02F 1/133555 345/76 |
| 7,385,654 | B2 ‡ | 6/2008 | Mitsui | G02F 1/133603 349/62 |
| 7,674,650 | B2 ‡ | 3/2010 | Akimoto | H01L 29/78693 438/10 |
| 7,745,986 | B2 | 6/2010 | Ito et al. | |
| 8,415,208 | B2 ‡ | 4/2013 | Takayama | H01L 21/76251 438/14 |
| 8,516,728 | B2 ‡ | 8/2013 | Jung | G09F 9/301 40/610 |
| 8,610,118 | B2 ‡ | 12/2013 | Yamazaki | G02F 1/133305 257/40 |
| 8,610,155 | B2 ‡ | 12/2013 | Hatano | H01L 27/3251 257/99 |
| 8,736,162 | B2 | 5/2014 | Jin et al. | |
| 9,122,088 | B2 ‡ | 9/2015 | Omote | G06F 3/044 |
| 9,430,180 | B2 ‡ | 8/2016 | Hirakata | G06F 3/0412 |
| 9,448,592 | B2 | 8/2016 | Jin et al. | |
| 9,830,840 | B2 ‡ | 11/2017 | Yoshizumi | G06F 1/1652 |
| 9,875,015 | B2 | 1/2018 | Yamazaki et al. | |
| 10,054,988 | B2 | 8/2018 | Jin et al. | |
| 10,142,547 | B2 | 11/2018 | Yamazaki et al. | |
| 10,528,084 | B2 | 1/2020 | Jin et al. | |
| 10,592,094 | B2 | 3/2020 | Yamazaki et al. | |
| 2003/0201960 | A1 ‡ | 10/2003 | Fujieda | G02F 1/133603 345/87 |
| 2003/0201974 | A1 ‡ | 10/2003 | Yin | G06F 1/1616 345/15 |
| 2006/0072047 | A1 ‡ | 4/2006 | Sekiguchi | G02F 1/1335 349/25 |
| 2008/0180618 | A1 ‡ | 7/2008 | Fujieda | G02F 1/133603 349/11 |
| 2010/0171905 | A1 ‡ | 7/2010 | Huang | G02F 1/133371 349/69 |
| 2010/0248403 | A1 ‡ | 9/2010 | Hatano | H01L 51/56 438/28 |
| 2010/0277443 | A1* | 11/2010 | Yamazaki | G02F 1/1368 345/204 |
| 2010/0317409 | A1 ‡ | 12/2010 | Jiang | G06F 1/1652 455/56 |
| 2013/0002133 | A1 ‡ | 1/2013 | Jin | H01L 51/524 313/51 |
| 2013/0180882 | A1 ‡ | 7/2013 | Hamers | G06F 1/1652 206/73 |
| 2013/0194761 | A1 ‡ | 8/2013 | Kim | G06F 1/1652 361/74 |
| 2014/0099999 | A1 ‡ | 4/2014 | Hatano | H01L 27/3251 455/56 |
| 2014/0158997 | A1 | 6/2014 | Ahn et al. | |
| 2015/0146069 | A1 ‡ | 5/2015 | Yamazaki | H04N 5/23293 348/333.01 |
| 2017/0177116 | A1 ‡ | 6/2017 | Jinbo | G09G 3/3648 |
| 2018/0004047 | A1 ‡ | 1/2018 | Yamazaki | G02F 1/133345 |
| 2019/0075243 | A1 | 3/2019 | Yamazaki et al. | |
| 2020/0142448 | A1 | 5/2020 | Jin et al. | |

FOREIGN PATENT DOCUMENTS

| | | |
|---|---|---|
| JP | 2001-066593 A | 3/2001 |
| JP | 2002-196702 A | 7/2002 |
| JP | 2002-328630 A | 11/2002 |
| JP | 2003-076302 A | 3/2003 |
| JP | 2003-098983 A | 4/2003 |
| JP | 2003-157026 A ‡ | 5/2003 |
| JP | 2003-157029 A | 5/2003 |
| JP | 2003-174153 A | 6/2003 |
| JP | 2003-228304 A ‡ | 8/2003 |
| JP | 2013-221965 A ‡ | 10/2003 |
| JP | 2003-316295 A ‡ | 11/2003 |
| JP | 2003-316302 A | 11/2003 |
| JP | 2003-322850 A ‡ | 11/2003 |
| JP | 2004-296162 A ‡ | 10/2004 |
| JP | 2006-349788 ‡ | 12/2006 |
| JP | 2006-349788 A | 12/2006 |
| JP | 2007-232882 A ‡ | 9/2007 |
| JP | 4161574 B2 | 10/2008 |
| JP | 2013-015835 A | 1/2013 |
| JP | 2013-221965 A | 10/2013 |
| TW | 201531902 | 8/2015 |
| TW | 201531903 | 8/2015 |
| WO | WO 2004/053819 A1 | 6/2004 |
| WO | WO 2004-053819 A1 ‡ | 6/2004 |
| WO | WO 2005/086257 A1 | 9/2005 |
| WO | WO 2015/079356 A1 | 6/2015 |
| WO | WO 2015/079361 A1 | 6/2015 |

OTHER PUBLICATIONS

Sakuishi, T. et al., "Transmissive OLED and Reflective LC Hybrid (TR-Hybrid) Display with High Visibility and Low Power Consumption," SID Digest '16: SID International Symposium Digest of Technical Papers, May 22, 2016, vol. 47, pp. 735-738.‡

Kusunoki, K. et al., "Transmissive OLED and Reflective LC Hybrid (TR-Hybrid) Display," SID Digest '16: SID International Symposium Digest of Technical Papers, May 22, 2016, vol. 47, pp. 57-60.‡

Lee, J-H, et al., "High Ambient-Contrast-Ratio Display Using Tandem Reflective Liquid Crystal Display and Organic Light-Emitting Device," Optics Express, Nov. 14, 2005, vol. 13, No. 23, pp. 9431-9438.‡

Shieh, H-P., "Transflective Display by Hybrid OLED and LCD," LEOS 2005 (IEEE Lasers and Electro-Optics Society Annual Meeting), Oct. 22, 2005, pp. 650-651, IEEE.‡

Taiwanese Office Action re Application No. TW 105137657, dated Apr. 27, 2020.

(56) References Cited

OTHER PUBLICATIONS

Ohide, T. et al., "Application of Transfer Technology to Manufacturing of Transmissive OLED and and Reflective LC Hybrid (TR-Hybrid) Display," SID Digest '16: SID International Symposium Digest of Technical Papers, May 22, 2016, vol. 47, pp. 1002-1004.

\* cited by examiner
‡ imported from a related application

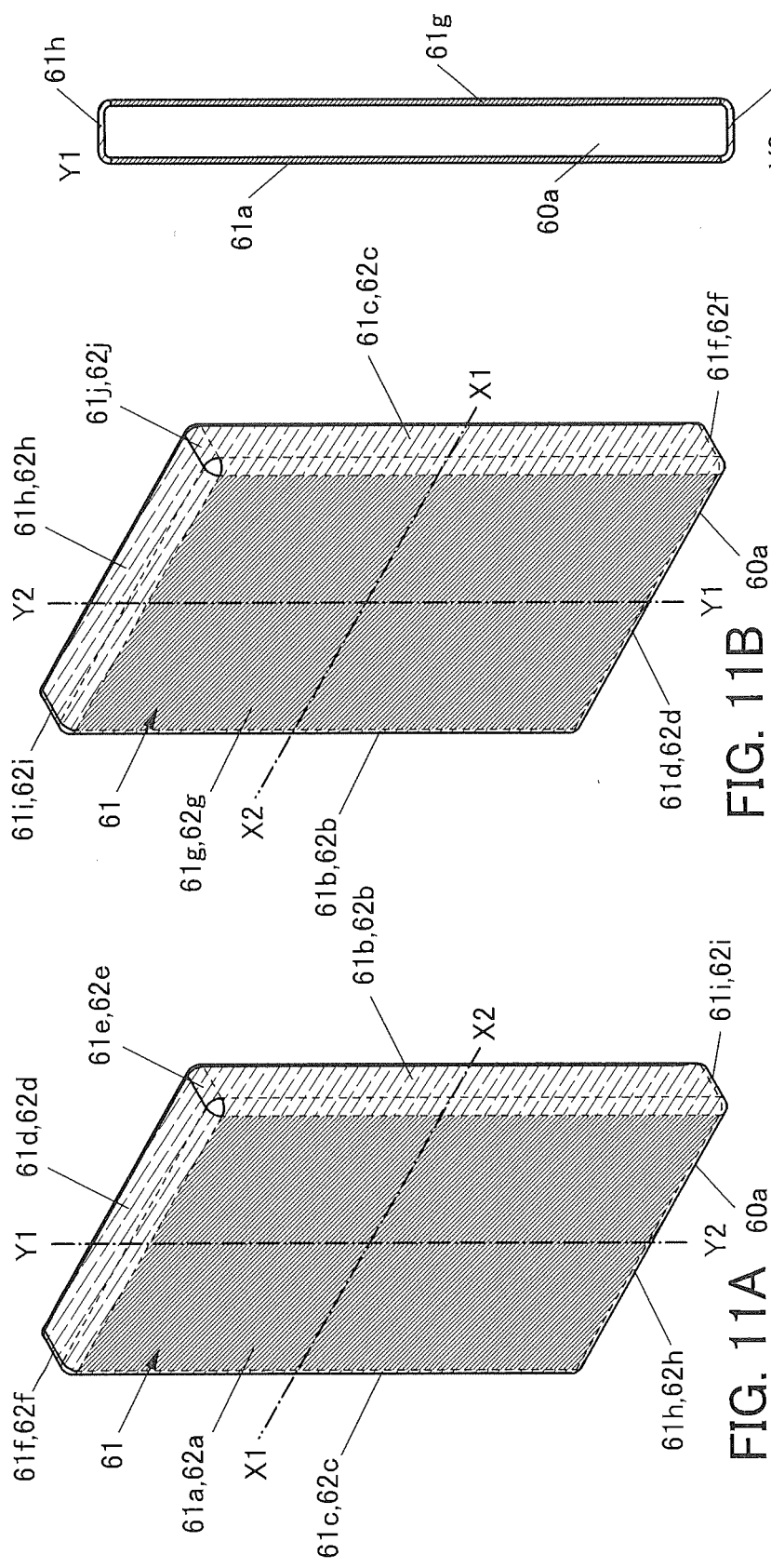
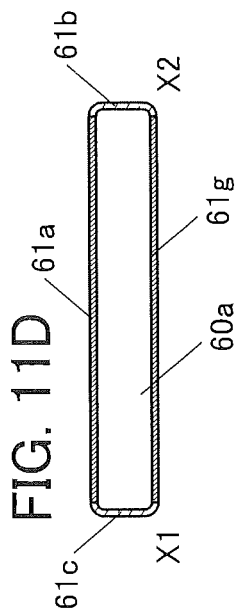

FIG. 26A
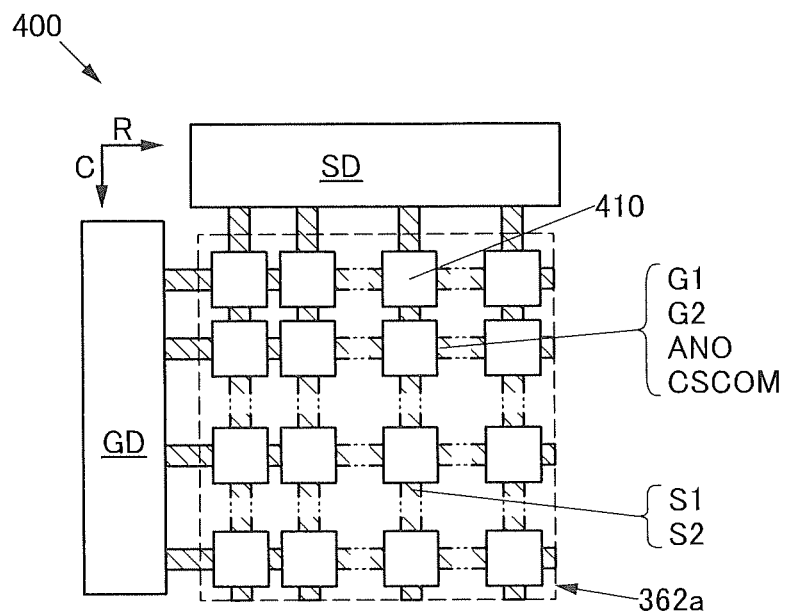
FIG. 26B1
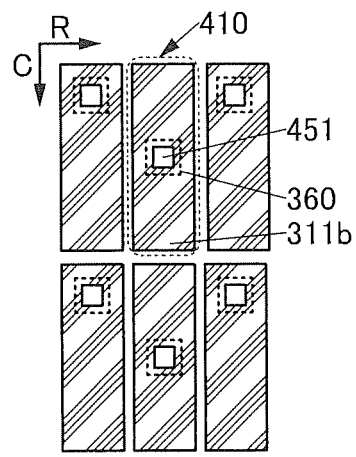
FIG. 26B2
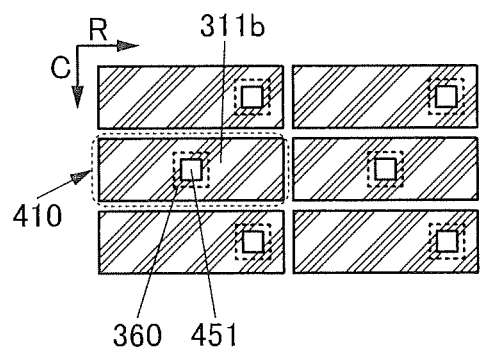

DISPLAY DEVICE AND ELECTRONIC DEVICE

This application is a divisional of copending U.S. application Ser. No. 15/616,179, filed on Jun. 7, 2017 which is incorporated herein by reference.

TECHNICAL FIELD

The present invention relates to an object, a method, or a manufacturing method. The present invention relates to a process, a machine, manufacture, or a composition of matter. In particular, one embodiment of the present invention relates to a semiconductor device, a light-emitting device, a display device, an electronic device, a lighting device, a driving method thereof, or a manufacturing method thereof. In particular, one embodiment of the present invention relates to a display device (display panel) capable of displaying images on a curved surface. Another embodiment of the present invention relates to an electronic device, a light-emitting device, or a lighting device that includes a display device capable of displaying images on a curved surface, or a manufacturing method thereof.

In this specification and the like, a semiconductor device refers to every device that can function by utilizing semiconductor characteristics. A transistor, a semiconductor circuit, an arithmetic device, a memory device, and the like are each one embodiment of the semiconductor device. A light-emitting device, a display device, an electronic device, a lighting device, and an electronic device may include a semiconductor device.

BACKGROUND ART

It is known that active matrix liquid crystal display devices are classified into two major types: a transmissive type and a reflective type.

In a transmissive liquid crystal display device, a backlight such as a cold cathode fluorescent lamp or a light-emitting diode (LED) is used, and optical modulation action of liquid crystal is utilized to select one of the two states: a state where light from the backlight passes through liquid crystal to be output to the outside of the liquid crystal display device and a state where light is not output to the outside of the liquid crystal display device, whereby a bright or dark image is displayed. Furthermore, those images are combined to display an image.

In a reflective liquid crystal display device, a state in which external light, that is, incident light is reflected at a pixel electrode and output to the outside of the device or a state in which incident light is not output to the outside of the device is selected using optical modulation action of liquid crystal, whereby a bright or dark image is displayed. Furthermore, those images are combined to display an image. Compared to the transmissive liquid crystal display device, the reflective liquid crystal display device has an advantage of low power consumption since the backlight is not used.

Patent Document 1 discloses a flexible active matrix light-emitting device in which a transistor and an organic EL element are provided over a film substrate.

REFERENCE

Patent Document

[Patent Document 1] Japanese Published Patent Application No. 2003-174153

DISCLOSURE OF INVENTION

The power consumption of electronic devices including display devices is required to be reduced. In particular, the power consumption of display devices of devices using batteries as power sources is required to be reduced because the display devices consume a large amount of power.

Portable electronic devices are desired to include display devices capable of displaying images with high visibility regardless of whether they are used indoors or they are used outdoors.

An object of one embodiment of the present invention is to provide a display device with high visibility. Another object is to provide a display device capable of performing display by diverse methods. Another object is to provide a low-power display device.

Another object is to provide a novel display device. Another object is to provide an electronic device including the display device (display panel). Another object is to provide a novel electronic device.

Note that the description of these objects does not disturb the existence of other objects. In one embodiment of the present invention, there is no need to achieve all the objects. Objects other than the above objects are apparent from and can be derived from the description of the specification and the like.

Embodiments of the present invention relate to a display device having a function of emitting visible light, a display device having a function of emitting visible light and a function of reflecting visible light, and an electronic device including either of the display devices.

One embodiment of the present invention is a display device including a first display region and a second display region. The first display region and the second display region are adjacent to each other. The first display region includes a first pixel. The second display region includes a second pixel. The first pixel includes a first display element and a second display element. The second pixel includes a third display element. The first display element has a function of reflecting visible light. The second display element and the third display element each have a function of emitting visible light.

A polarizing plate is located in the first display region.

It is preferred that the first display element be a reflective liquid crystal element and the second display element and the third display element be light-emitting elements.

The first pixel and the second pixel each preferably include a transistor including an oxide semiconductor in a semiconductor layer where a channel is formed.

The first display region preferably has a function of displaying an image using one or both of first light reflected by the first display element and second light emitted by the second display element.

Another embodiment of the present invention is an electronic device including the above display device and a housing. The housing includes a first surface and a second surface. The first surface and the second surface are continuous. The second surface has a curvature. The first display region is located on the first surface. The second display region is located on the second surface.

A touch sensor is preferably provided so as to overlap with the display device.

Another embodiment of the present invention is a display device including a first display region, a second display region, a third display region, and a fourth display region. The first to fourth display regions are substantially quadrangular. The first display region has a first side and a second side at right angle to the first side. The second display region has a third side and a fourth side at right angle to the third side. The third display region has a fifth side and a sixth side at right angle to the fifth side. The fourth display region has a seventh side and an eighth side opposite to the seventh side. The first side and the third side are in contact with each other. The second side and the fifth side are in contact with each other. The fourth side and the seventh side are in contact with each other. The sixth side and the eighth side are in contact with each other. The second to fourth display regions have curved surfaces.

Lengths of the first side and the third side are equal. Lengths of the second side and the fifth side are equal. A length of the fourth side is larger than that of the seventh side. A length of the sixth side is larger than that of the eighth side. Lengths of the seventh side and the eighth side are equal.

The first display region includes a first pixel. The second display region includes a second pixel. The third display region includes a third pixel. The fourth display region includes a fourth pixel. The first to fourth pixels each include a first display element. The first display element has a function of emitting visible light.

The first pixel further includes a second display element. The second display element has a function of reflecting visible light.

It is preferred that the first display element be a light-emitting element and the second display element be a reflective liquid crystal element.

The first to fourth pixels each preferably include a transistor including an oxide semiconductor in a semiconductor layer where a channel is formed.

Another embodiment of the present invention is an electronic device including the above display device and a housing. The housing includes a first surface, a second surface, a third surface, and a fourth surface. The first to fourth surfaces are continuous. The second to fourth surfaces each have a curvature. The first display region is located on the first surface. The second display region is located on the second surface. The third display region is located on the third surface. The fourth display region is located on the fourth surface.

A touch sensor is preferably provided so as to overlap with the display device.

Note that in this specification, the display device includes any of the following modules in its category: a module in which a connector such as a flexible printed circuit (FPC) or a tape carrier package (TCP) is attached to a display panel; a module having a TCP provided with a printed wiring board at the end thereof; and a module having an integrated circuit (IC) directly mounted by a chip on glass (COG) method on a substrate over which a display element is formed.

With one embodiment of the present invention, a display device with high visibility can be provided. Alternatively, a display device capable of performing display by diverse methods can be provided. Alternatively, a low-power display device can be provided. Alternatively, a novel display device can be provided. Alternatively, an electronic device including the display device (display panel) can be provided. Alternatively, a novel electronic device can be provided.

Note that the description of these effects does not preclude the existence of other effects. One embodiment of the present invention does not need to have all the effects. Other effects are apparent from and can be derived from the description of the specification, the drawings, the claims, and the like.

BRIEF DESCRIPTION OF DRAWINGS

FIGS. 11A to 11D illustrate the structure of an electronic device.
FIG. 26A illustrates a circuit of a display device,
and FIGS. 26B1 and 26B2 are top views of pixels.

BEST MODE FOR CARRYING OUT THE INVENTION

Figure 1A:
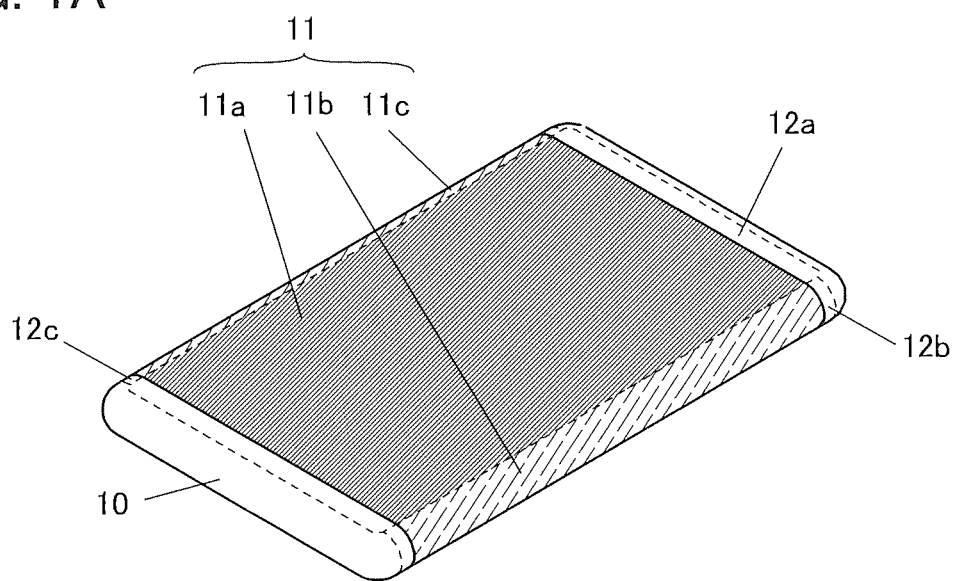
FIGS. 1A and 1B illustrate the structure of an electronic device.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. Thus, the present invention should not be construed as being limited to the description in the following embodiments.

Note that in structures of the present invention described below, the same portions or portions having similar functions are denoted by the same reference numerals in different drawings, and the description thereof is not repeated. Note that the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, the scale of each component is not necessarily limited to that in the drawings.

Note that in this specification and the like, ordinal numbers such as "first" and "second" are used in order to avoid confusion among components and do not limit the number.

Embodiment 1

In this embodiment, a display device and an electronic device of embodiments of the present invention will be described with reference to drawings.

A display device of one embodiment of the present invention includes a first region and a second region adjacent to the first region. The first region is provided with a display element having a function of reflecting visible light and a display element having a function of emitting visible light. The second region is provided with a display element having a function of emitting visible light.

In an electronic device, the first region is provided for a first surface (e.g., top surface) on which a main image is displayed, and the second region is provided for a second surface (e.g., side surface) on which an auxiliary image is displayed.

In the second region, display is performed as needed and thus is not performed in normal times, which allows a reduction in power consumption. Furthermore, the structure of the display element in the second region can be simplified, leading to an increase in manufacturing yield.

[Examples of Electronic Device]

Figure 1B:
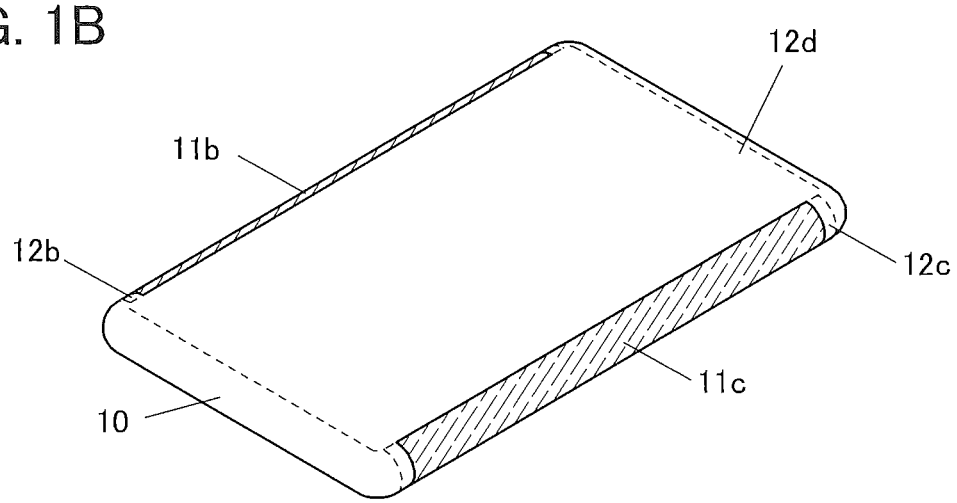

FIG. 1A is a schematic perspective view illustrating the top surface side of an electronic device including the display device of one embodiment of the present invention described below, and FIG. 1B is a schematic perspective view illustrating the bottom surface side thereof.

The electronic device illustrated in FIGS. 1A and 1B can be used as a smart phone or a tablet terminal and includes a housing 10 and a display device 11 provided along a surface of the housing 10. Note that the housing 10 includes a transparent protective cover and the display device 11 may be provided along the inside of the protective cover.

For example, the housing 10 is a substantial hexahedron whose top surface is substantially rectangular, and has a surface 12a (top surface), a surface 12d (bottom surface) opposite to the surface 12a, a surface 12b (side surface) adjacent to the surface 12a and the surface 12d, a surface 12c (side surface) opposite to the surface 12b (side surface), and the other two side surfaces.

The display device 11 includes a display region 11a overlapping with the surface 12a, a display region 11b overlapping with the surface 12b, and a display region 11c overlapping with the surface 12c. The display region 11a is provided with a display element having a function of reflecting visible light and a display element having a function of emitting visible light. The display region 11b and the display region 11c are each provided with a display element having a function of emitting visible light.

The surface 12b and the surface 12c overlapping with the display region 11b and the display region 11c, respectively, each preferably have a curvature. For example, it is preferred that a corner be formed neither between the top surface and the side surface nor between the side surface and the bottom surface and the surfaces be continuous. Furthermore, the side surfaces are each preferably a curved surface such that the slope of a tangent line is continuous from the top surface to the bottom surface of the housing 10.

With such a shape, the electronic device can be held and operated with a hand more stably. The side surfaces can each be viewed from a wide range of angles; thus, high visibility of images that are displayed in the display region 11b and the display region 11c can be achieved.

As illustrated in FIGS. 1A and 1B, the display region 11b is provided along the surface 12b. The display region 11c is provided along the surface 12c. Note that the display region 11b and the display region 11c may be provided so as to cover part of the surfaces 12b and 12c instead of the entire surfaces 12b and 12c. Alternatively, the display region 11b and the display region 11c may extend to the surface 12d.

Figure 2A:
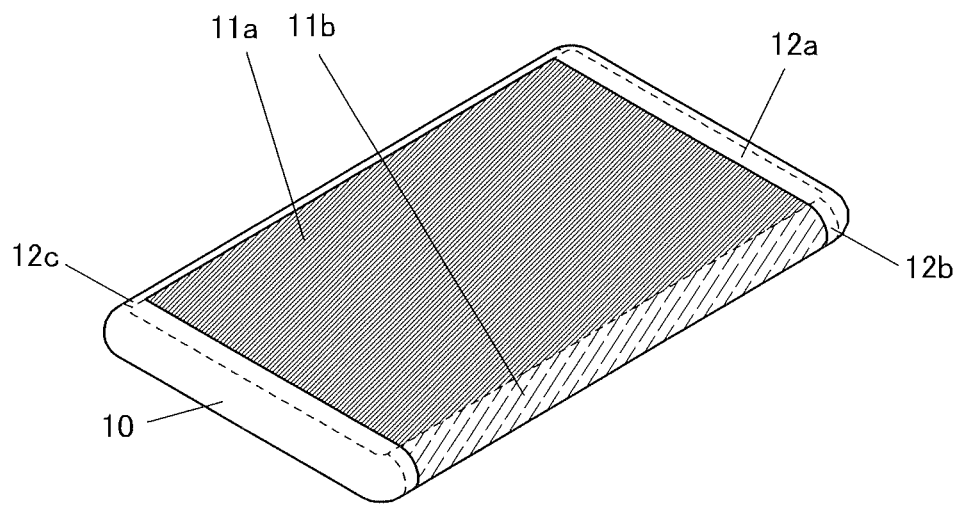
FIGS. 2A and 2B illustrate the structure of an electronic device.

Although two side surfaces are provided with display regions in FIGS. 1A and 1B, a structure may be employed in which the surface 12b is provided with the display region 11b and the surface 12c is not provided with the display region 11c as in FIG. 2A.

Figure 2B:
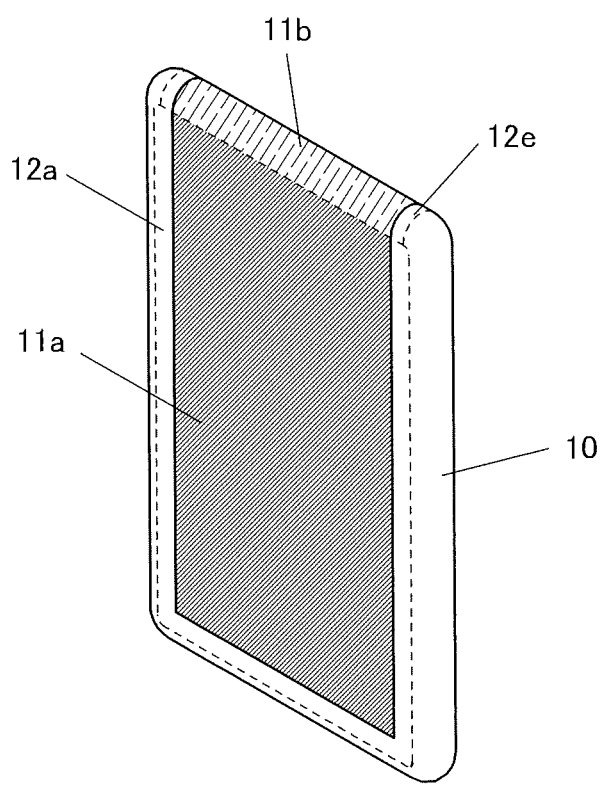

Although side surfaces in the long axis direction of the housing 10 are provided with display regions in FIGS. 1A and 1B and FIG. 2A, a surface 12e, which is a side surface in the short axis direction of the housing 10, may be provided with the display region 11b as in FIG. 2B.

Figure 3A:
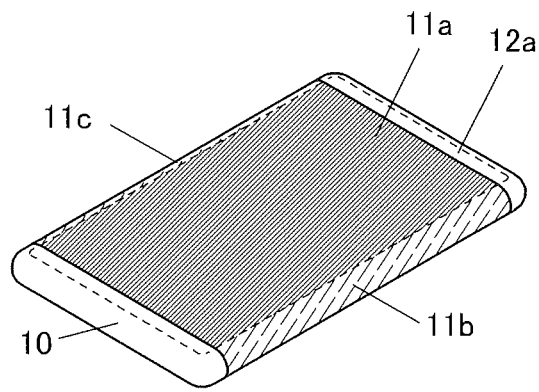
FIGS. 3A to 3D illustrate the structures of electronic devices.
Figure 3B:
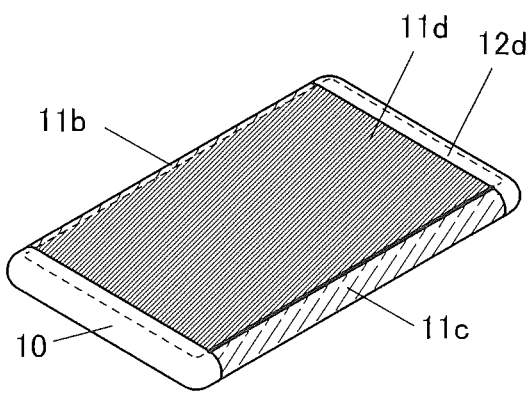

The bottom surface of the housing 10 may be provided with a display region. For example, the surface 12d may be provided with a display region 11d as illustrated in a schematic perspective view of the top surface side in FIG. 3A and a schematic perspective view of the bottom surface side in FIG. 3B. A display element provided in the display region 11d can have a function of reflecting visible light and a function of emitting visible light like the display element provided in the display region 11a.

The display device 11 including the display regions 11a to 11d has flexibility. Thus, a structure in which an end portion of the display region 11d is in contact with an end portion of the display region 11c as in FIG. 3B or a structure in which an end portion of the display region 11d and an end portion of the display region 11c overlap with each other can be employed. The latter structure allows a joint (shown by a solid line in FIG. 3B) to be less visible, and it is substantially possible to display a continuous image on four surfaces of the housing 10. Alternatively, an electronic device can be used without discrimination between the front and back sides.

Although the display device 11 has flexibility, the display device 11 in the state of being incorporated in the housing 10 is not necessarily flexible.

Figure 3C:
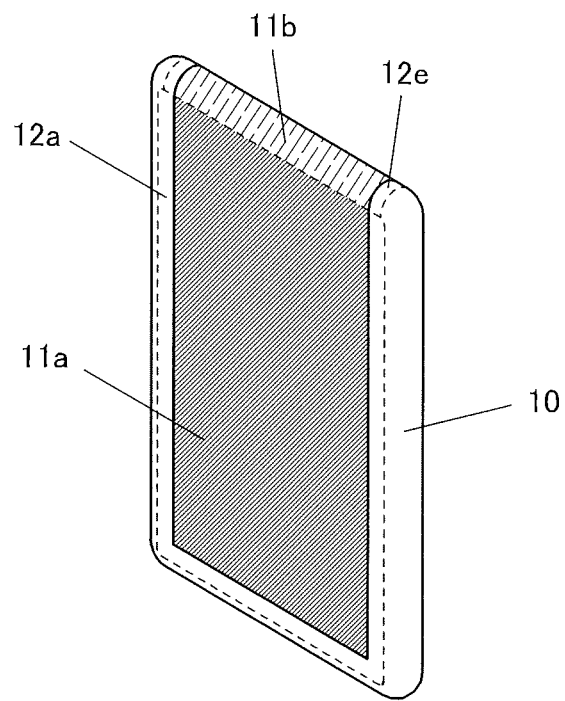
Figure 3D:
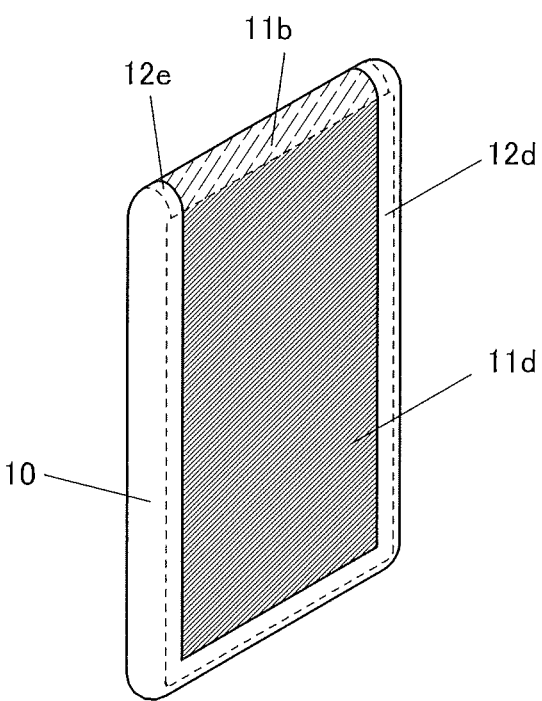

The surface 12d may be provided with the display region as illustrated in a perspective view of the first surface (top surface) side in FIG. 3C and a perspective view of the second surface (bottom surface) side in FIG. 3D. A structure can be obtained in which the surface 12e, which is a side surface in the short axis direction of the housing 10, is provided with the display region 11b and the display region 11a and the display region 11d are provided so as to be adjacent to the display region 11b.

The surface of the housing 10 may be provided with a hardware button, an external connection terminal, and the like in addition to the display device 11.

With the structure described above, display can be performed not only on one surface (e.g., the top surface) of the housing, as in conventional electronic devices, but also on a side surface adjacent to the one surface of the housing. It is particularly preferred that a display region be provided along two or more side surfaces because images can be displayed in more various ways.

For example, the display region 11a provided along the surface 12a of the housing 10, the display region 11b provided along the surface 12b, and the display region 11c provided along the surface 12c can display different images or the like by being used as individual display regions. Alternatively, the display regions 11a to 11c can display one image or the like across any two or more of the display regions. For example, an image displayed in the display region 11a may be displayed also in the display region 11b or the like, as a continuous image.

Figure 4:
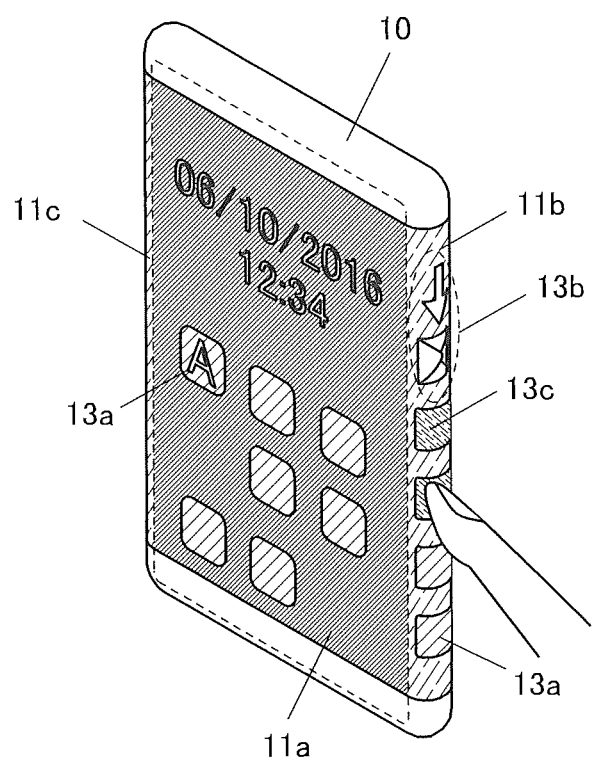
FIG. 4 illustrates an example of a use state of an electronic device.

FIG. 4 shows an example of a use state of the electronic device illustrated in FIGS. 1A and 1B. In FIG. 4, text information and a plurality of icons 13a associated with application software or the like are displayed in the display region 11a. Notification information 13b, icons 13c associated with the operation of the electronic device, or the like, and the icons 13a associated with application software or the like are displayed in the display region 11b.

For example, the notification information 13b and transmitter information (e.g., the name, phone number, e-mail address, and the like of a transmitter) can be displayed in not only the display region 11a but also the display region 11b or the like when a phone call or a text message is received. In FIG. 4, notification of incoming mail is displayed in the display region 11b, as the notification information 13b.

In a standby time of the electronic device, display may be off (for example, black display may be performed) in the display region 11a, and information may be displayed in only the display region 11b or the like. In the case where, only the display region 11a is ceaselessly used to, for example, watch a moving image, display may be off (for example, black display may be performed) in the display region 11b, and information may be displayed in only the display region 11a. Display in the display region that is not used is set off, whereby power consumption can be reduced.

It is preferred that a touch sensor be provided at a position overlapping with the display device 11, specifically, in regions overlapping with the display regions. As a touch sensor, for example, a sheet-like capacitive touch sensor may be provided to overlap with the display device 11. Alternatively, as a touch sensor, a so-called in-cell touch panel that has a touch sensor function may be provided as the display device 11 itself. As an in-cell touch panel, a capacitive touch sensor or an optical touch sensor using a photoelectric conversion element may be used.

An electronic device of one embodiment of the present invention can perform display on not only the top surface but also one or more side surfaces of the housing; thus, images can be displayed in various ways compared with a conventional electronic device. Furthermore, when provided with a touch sensor in each of the display regions, an electronic device can be operated in various ways and intuitively compared with a conventional electronic device.

Although an example of the case where images are displayed in various ways using the display device 11 is described here, one embodiment of the present invention is not limited thereto. For example, depending on circumstances or conditions, information is not necessarily displayed. As an example, the display device 11 may be used as a lighting device. When used as a lighting device, the display device 11 can be utilized as interior lighting having an attractive design. Alternatively, the display device 11 can be used as lighting with which various directions can be illuminated. Still alternatively, the display device 11 may be used as a light source such as a backlight or a front light. In other words, the display device 11 may be used as a lighting device for the display device.

[Structure Examples of Display Panel]

Next, a structure example of a display device which can be used for the electronic device of one embodiment of the present invention will be described with reference to drawings.

Figure 5A:
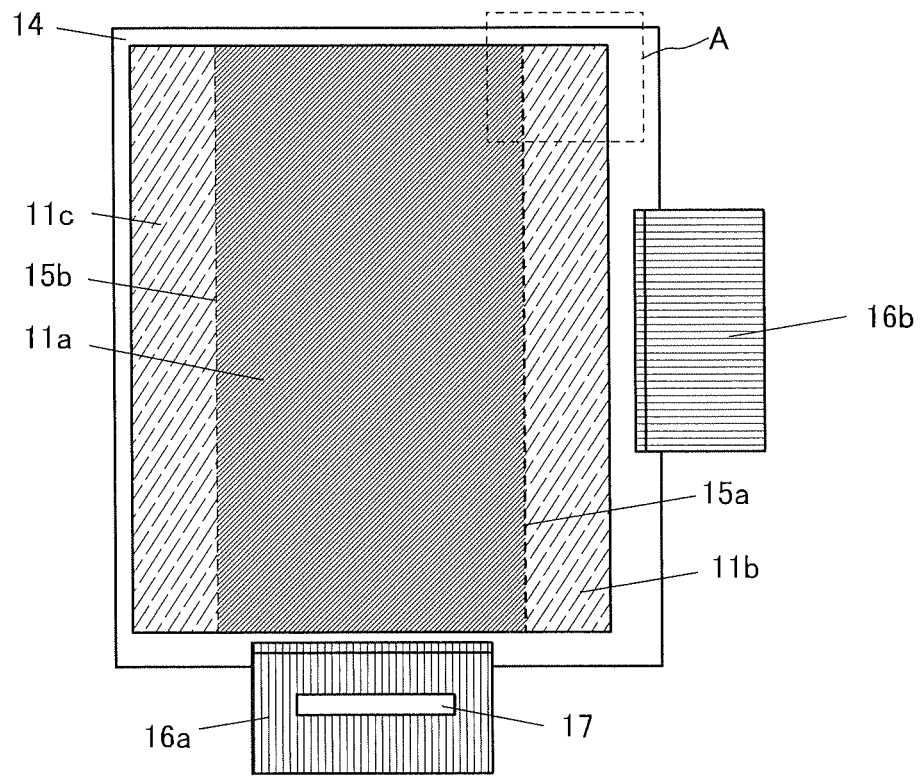
FIGS. 5A and 5B illustrate the structure of a display device.

FIG. 5A is a schematic top view of the display device 11. The display device 11 includes a flexible substrate 14 and a plurality of pixels over the substrate 14. The display device 11 includes the display regions 11a to 11c.

The outline of the display region 11a is a quadrangle. The display region 11b is provided in contact with one (side 15a) of four sides forming the outline of the display region 11a. The width of the display region 11a preferably coincides with that of the display region 11b in the direction parallel to the side 15a.

The display region 11c is provided in contact with one (side 15b) of the four sides forming the outline of the display region 11a. The width of the display region 11a preferably coincides with that of the display region 11c in the direction parallel to the side 15b.

Part of the substrate 14 is provided with an FPC 16a and FPC 16b which supply signals and electric power for driving the pixels. Although an IC 17 is mounted on the FPC 16a in FIG. 5A, the IC 17 is not necessarily provided. The FPC 16b has a function of supplying a signal and electric power to, for example, the driver circuits. The FPC 16b is not provided in some cases.

The IC 17 may be directly mounted on the substrate 14. Here, the width of the FPC 16a is preferably smaller than that of the display region 11a. In that case, particularly when the display region 11b and the display region 11c are bent and the display region 11a is flat, a junction portion of the FPC 16a and the substrate 14 is not bent and therefore, the FPC 16a can be prevented from being separated.

Figure 5B:
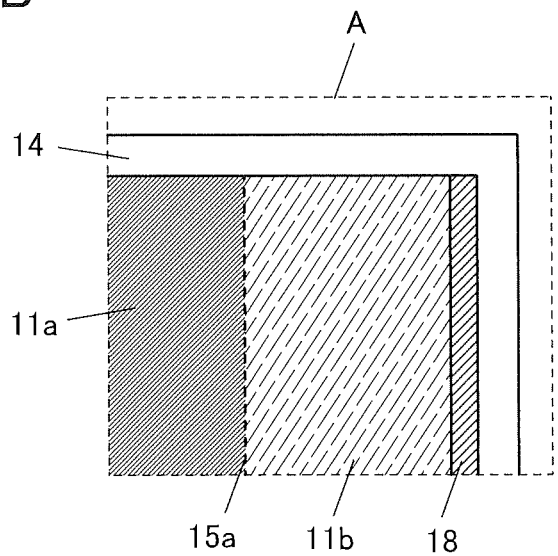

FIG. 5B is a schematic top view in which a region A in FIG. 5A is enlarged.

FIG. 5B illustrates a structure including a driver circuit 18 which outputs a signal for driving pixels included in the display regions 11a to 11c to the display regions 11a to 11c. The driver circuit 18 is provided along a side of the display region 11b that is opposite to the side 15a. The driver circuit 18 is electrically connected to the FPC 16b through a wiring, for example.

As the driver circuit 18, for example, a circuit serving as a gate driver circuit or a source driver circuit can be used; preferably, a gate driver circuit is used. In that case, the IC 17 preferably has a function of a source driver circuit.

Although a so-called driver integrated type display device including a driver circuit over the substrate 14 is described here, a driver circuit is not necessarily provided.

Figure 6A:
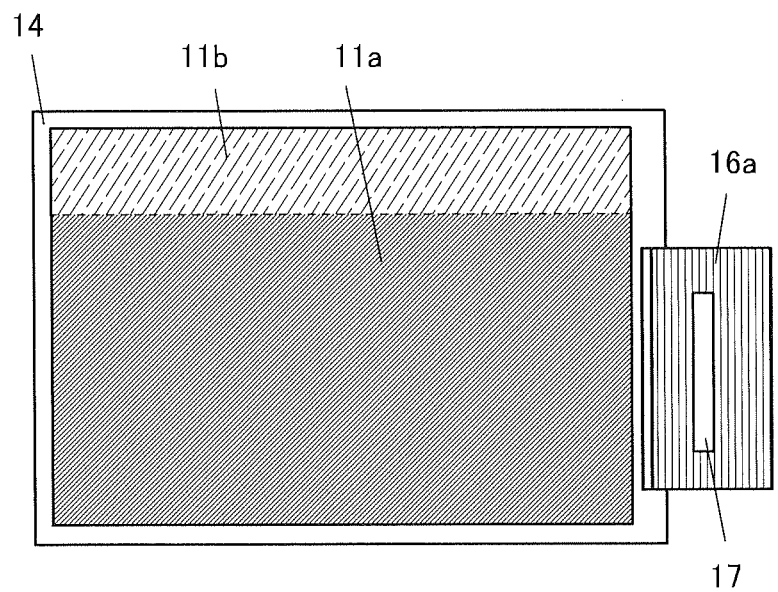
FIGS. 6A and 6B illustrate the structures of display devices.
Figure 6B:
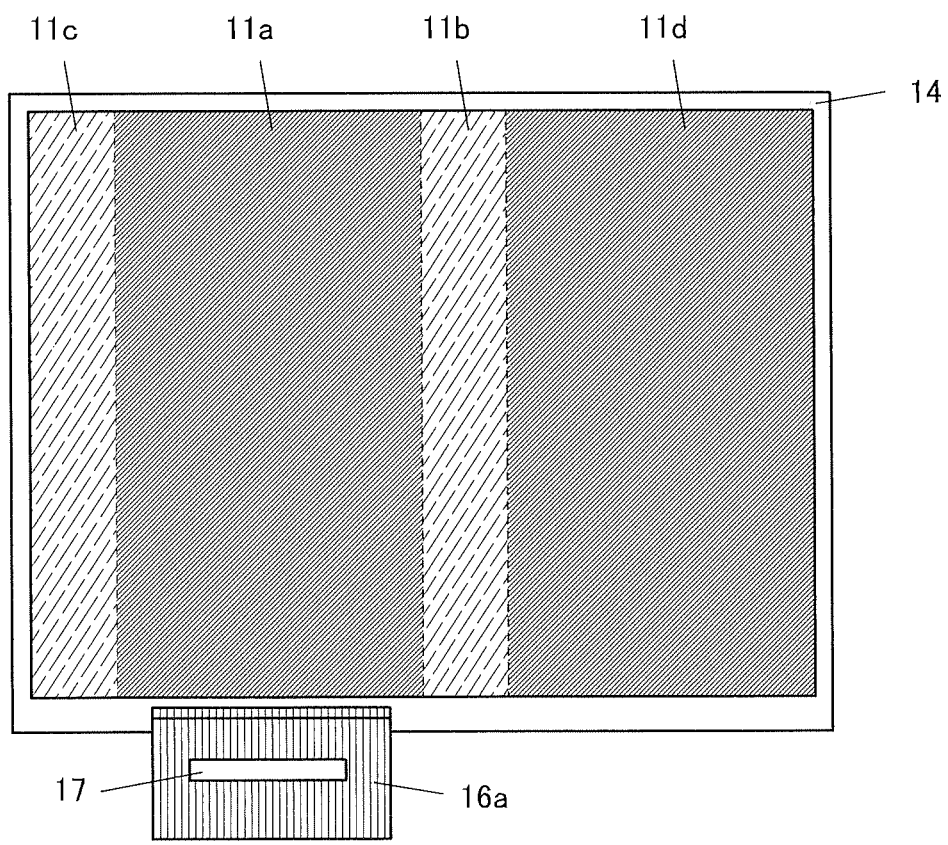

Although FIGS. 5A and 5B illustrate the structure in which three display regions, the display regions 11a to 11c, are provided, two display regions of the display regions 11a and 11b may be provided as illustrated in FIG. 6A. Alternatively, four display regions of the display regions 11a to 11d may be provided as illustrated in FIG. 6B. A driver circuit can have a structure similar to that in FIG. 5B. Note that in FIGS. 6A and 6B, the FPC 16*b* is omitted.

The display region 11*a* includes a plurality of pixels, and the pixels are each provided with a display element having a function of reflecting visible light and a display element having a function of emitting visible light. As the display element having a function of reflecting visible light, a reflective liquid crystal element including a mirror that reflects light incident from the outside can be used, for example. As the display element having a function of emitting visible light, a light-emitting element can be used, for example.

A transmissive liquid crystal element and a light-emitting element are display elements having high visibility in an environment with a relatively low illuminance (e.g., an outdoor environment at night or an indoor environment under interior light), but have poor visibility in an environment with a relatively high illuminance (e.g., in an outdoor environment under sunlight). To increase the visibility of display of a display device including a transmissive liquid crystal element in an environment with high illuminance, the illuminance of a backlight is increased. To increase the visibility of display of an electronic device including a light-emitting element, the emission intensity of the light-emitting element is increased.

Accordingly, a display device including only a transmissive liquid crystal element and a display device including only a light-emitting element consume a large amount of power in some cases when used in an environment with a high illuminance. Even with the use of any of the above methods to increase visibility, sufficiently high visibility cannot necessarily be achieved.

In a display device of one embodiment of the present invention, a reflective liquid crystal element having excellent visibility even in an environment with a high illuminance is used. The higher the intensity of external light is, the higher the visibility of a reflective liquid crystal element is. In addition, no backlight is used, leading to low power consumption. The display device of one embodiment of the present invention also includes a light-emitting element and thus has excellent visibility in an environment with a low illuminance. That is to say, the reflective liquid crystal element is driven in an environment with a high illuminance and the light-emitting element is driven in an environment with a low illuminance, whereby a display element with low power consumption and high visibility regardless of the illuminance of the outside can be obtained. Note that display may be performed by driving both the reflective liquid crystal element and the light-emitting element, depending on the illuminance of the outside.

The display regions 11*b* and 11*c* each include a plurality of pixels, and the pixels are each provided with a display element having a function of emitting visible light. As the display element having a function of emitting visible light, a light-emitting element can be used, for example.

In the display regions 11*b* and 11*c*, display is performed as needed and thus is not performed in normal times, which allows a reduction in power consumption. Furthermore, the structures of the display elements in the display regions 11*b* and 11*c* can be simplified, leading to an increase in manufacturing yield.

An oxide semiconductor is preferably used for semiconductor layers of semiconductor devices such as the transistors used in the pixels in the display regions and the driver circuit of the display device 11. As the oxide semiconductor, for example, a cloud-aligned composite oxide semiconductor (CAC-OS) that is described later can be used.

In particular, an oxide semiconductor having a wider band gap than silicon is preferably used. When a semiconductor material having a wider band gap and a lower carrier density than silicon is used, the off-state current of the transistor can be reduced.

Charge accumulated in a capacitor through the transistor can be retained for a long time because of the low off-state current of the transistor. The use of such a transistor in each pixel allows a driver circuit to stop while the gray levels of images displayed in display regions are maintained. As a result, an electronic device with extremely low power consumption can be obtained.

Alternatively, a polycrystalline semiconductor may be used for semiconductor devices such as transistors used for the pixels included in the display regions or driver circuits in the display device 11. For example, polycrystalline silicon or the like is preferably used. Polycrystalline silicon can be formed at a lower temperature than single crystal silicon and has higher field effect mobility and higher reliability than amorphous silicon. When such a polycrystalline semiconductor is used for a pixel, the aperture ratio of the pixel can be improved. Even when a very large number of pixels are provided, a gate driver circuit and a source driver circuit can be formed over a substrate where the pixels are formed, so that the number of components of an electronic device can be reduced.

Figure 7A:
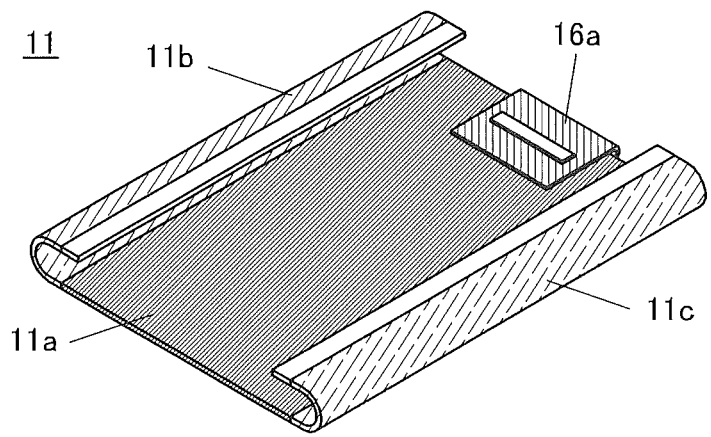
FIGS. 7A to 7C illustrate the structure of a display device and a touch sensor.
Figure 7B:
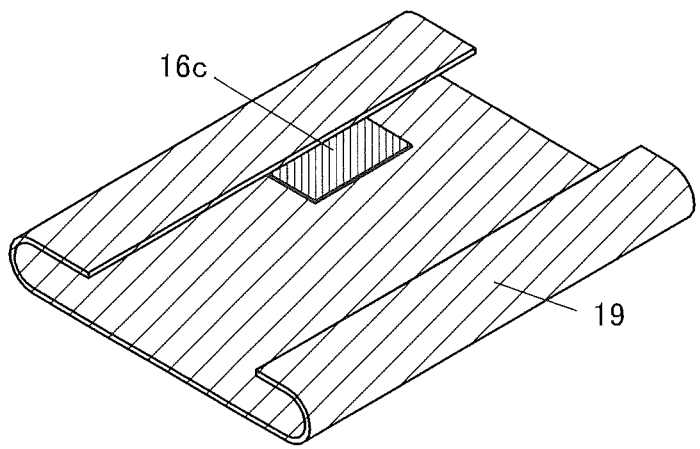
Figure 7C:
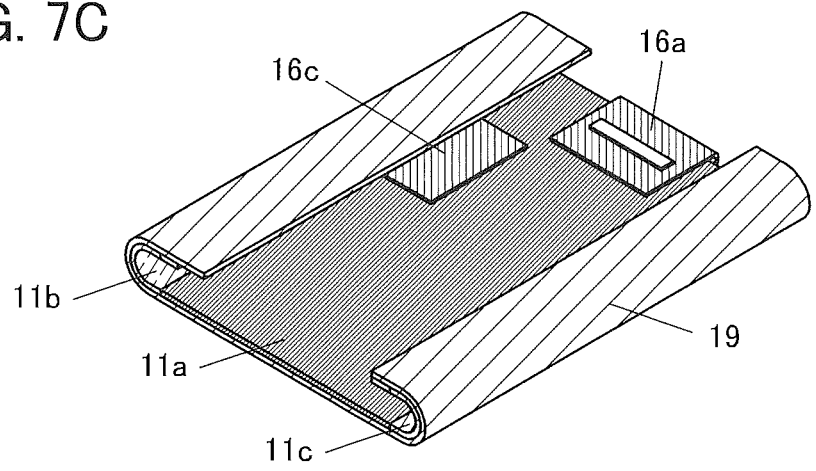

Here, FIGS. 7A to 7C illustrate an example where a sheet-like touch sensor is provided to overlap with the display device 11.

FIG. 7A illustrates a state where part of the display device 11 provided with the FPC 16*a* is bent. FIG. 7B illustrates a state where a sheet-like touch sensor 19 is bent along a curved surface of the display device 11. The touch sensor 19 is provided with an FPC 16*c*.

FIG. 7C illustrates a state where the display device 11 and the touch sensor 19 overlap with each other. Here, as illustrated in FIG. 7C, it is preferable that the FPC 16*a* provided for the display device 11 and the FPC 16*c* provided for the touch sensor 19 not overlap with each other. Therefore, the display device 11 and the touch sensor 19 preferably do not have the same shape, and in a region to which the FPC 16*a* or the FPC 16*c* is attached, the display device 11 and the touch sensor 19 preferably have different shapes so as not to overlap with each other.

As described above, the display device 11 and the sheet-like touch sensor 19 are provided so as to overlap with each other and incorporated in the housing 10; thus, a touch function can be added to not only the top surface but also part of a side surface and the bottom surface of the housing.

At least part of this embodiment can be implemented in combination with any of the other embodiments described in this specification as appropriate.

Embodiment 2

In this embodiment, a display device and an electronic device different from those in Embodiment 1 will be described with reference to drawings. Note that the detailed description of elements which are the same as those in Embodiment 1 is omitted.

A display device of one embodiment of the present invention includes a first display region, a second display region, a third display region, and a fourth display region. The first to fourth display regions are substantially quadrangular. The first display region is in contact with the second display region and the third display region. The second display region is in contact with the fourth display region. The third display region is in contact with the fourth display region.

The first to fourth display regions are each provided with a display element having a function of emitting visible light. The first display region may further be provided with a display element having a function of reflecting visible light.

In an electronic device, the first display region is provided for a surface (e.g., the top surface) on which a main image is displayed, and the second to fourth display regions are provided for a second surface (e.g., a side surface or a curved surface at a corner) on which an auxiliary image is displayed.

In the second to fourth display regions, display is performed as needed and thus is not performed in normal times, which allows a reduction in power consumption. Meanwhile, in a standby time, display may be performed in only one of the second to fourth display regions, and the first display region may be put in a non-display state to reduce power consumption. Furthermore, the area of the display regions can be increased in the electronic device; thus, high visibility and easy operability can be achieved.

[Example of Electronic Device]

Figure 8A:
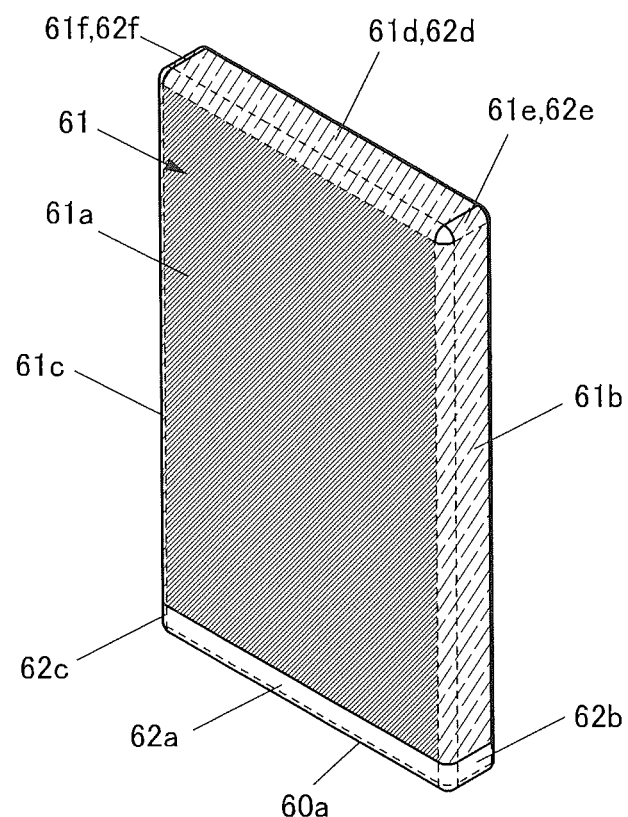
FIGS. 8A and 8B illustrate the structure of an electronic device.
Figure 8B:
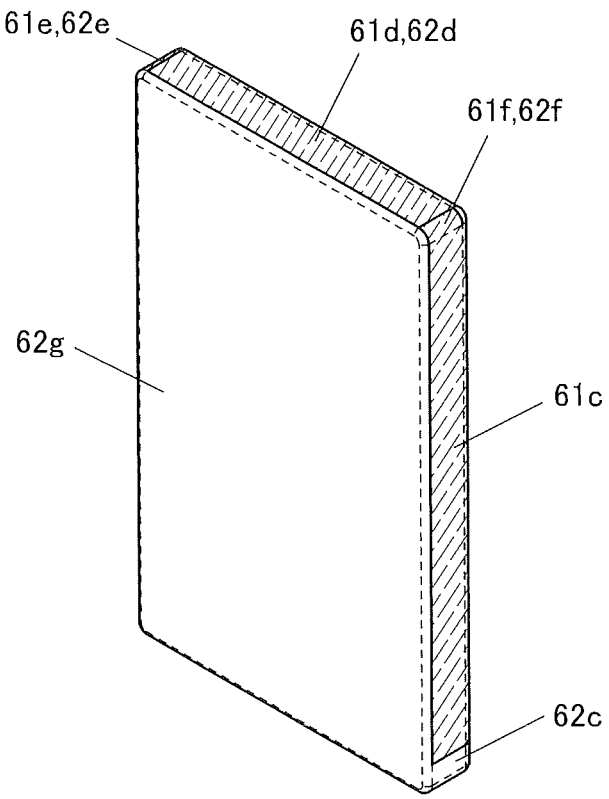

FIG. 8A is a schematic perspective view illustrating the top surface side of an electronic device including the display device of one embodiment of the present invention, which is described below, and FIG. 8B is a schematic perspective view illustrating the bottom surface side thereof.

The electronic device illustrated in FIGS. 8A and 8B can be used as a smart phone or a tablet terminal and includes a housing 60a and a display device 61 provided along a surface of the housing 60a. Note that the display device 61 may be covered with a protective cover including a transparent region and the display device 61 may be provided along the inside of the protective cover.

For example, the housing 60a is a substantial hexahedron whose top surface is substantially rectangular, and has a surface 62a (top surface), a surface 62g (bottom surface) opposite to the surface 62a, a surface 62b (first side surface), and a surface 62c (second side surface), a surface 62d (third side surface), and a fourth side surface that are adjacent to the surface 62a and the surface 62g. In the case where corners of the housing have a curvature as illustrated in FIGS. 8A and 8B, the corners have a curved surface. Here, a curved surface between the surface 62b and the surface 62d is referred to as a surface 62e. A curved surface between the surface 62c and the surface 62d is referred to as a surface 62f. Note that curved surfaces between the top surface and the first side surface, between the top surface and the second side surface, and between the top surface and the third side surface belong to the first side surface, the second side surface, and the third side surface, respectively.

The display device 61 includes a display region 61a overlapping with the surface 62a, a display region 61b overlapping with the surface 62b, a display region 61c overlapping with the surface 62c, a display region 61d overlapping with the surface 62d, a display region 61e overlapping with the surface 62e, and a display region 61f overlapping with the surface 62f.

The display regions 61a to 61f are each provided with a display element having a function of emitting visible light. The display region 61a may further be provided with a display element having a function of reflecting visible light.

The surface 62b, the surface 62c, and the surface 62d overlapping with the display region 61b, the display region 61c, and the display region 61d, respectively, each preferably have a curvature. For example, it is preferred that a corner be formed neither between the top surface and the side surface nor between the side surface and the bottom surface and the surfaces be continuous.

With such a shape, the electronic device can be held and operated with a hand more stably. The side surfaces can each be viewed from a wide range of angles; thus, high visibility of images that are displayed in the display region 61b, the display region 61c, and the display region 61d can be achieved.

As illustrated in FIGS. 8A and 8B, the display region 61b is provided along the surface 62b. The display region 61c is provided along the surface 62c. The display region 61d is provided along the surface 62d. Note that the display region 61b, the display region 61c, and the display region 61d may be provided so as to cover part of the surfaces 62b, 62c, and 62d instead of the entire surfaces 62b, 62c, and 62d. Alternatively, any one or all of the display region 61b, the display region 61c, and the display region 61d may extend to the surface 62g.

Although the top surface, three side surfaces, and two curved surfaces (corners) (six surfaces in total) are provided with display regions in FIGS. 8A and 8B, any one to five of the surfaces may be provided with the display region/regions.

Figure 9A:
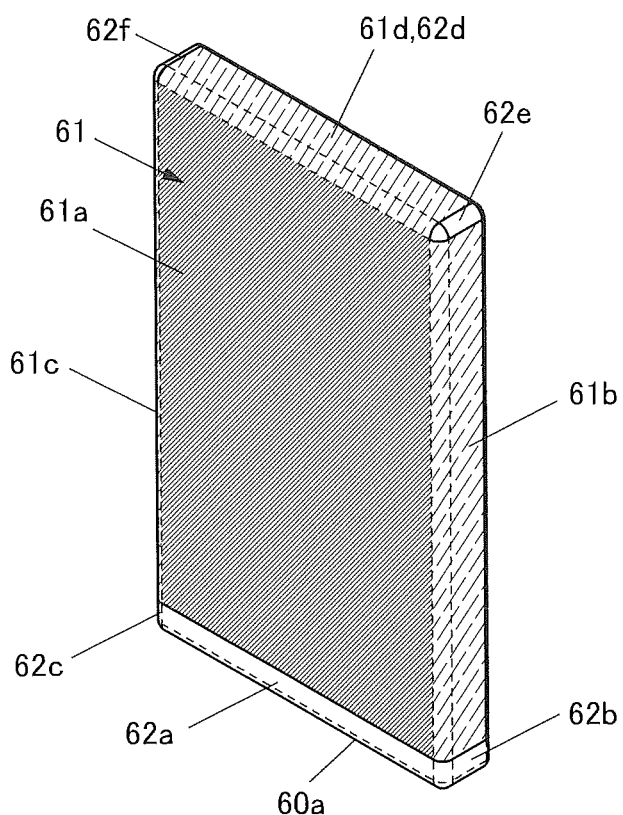
FIGS. 9A and 9B illustrate the structure of an electronic device.
Figure 9B:
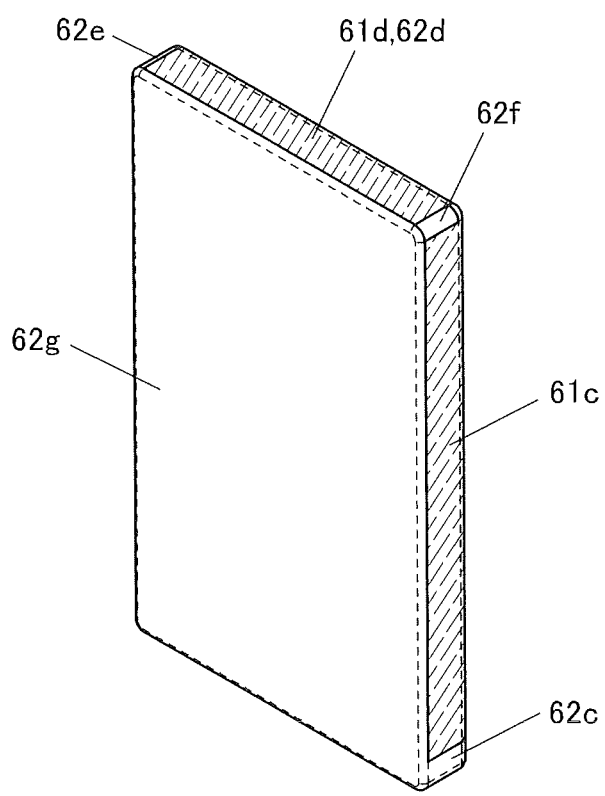

For example, a structure may be employed in which curved surfaces at corners (the surface 62e and the surface 62f) are not provided with display regions as in FIGS. 9A and 9B. In the case of such a structure, the curvature radius of each of the curved surfaces between the top surface and the first side surface of the housing 60a, between the top surface and the second side surface of the housing 60a, and between the top surface and the third side surface of the housing 60a is preferably as small as possible. In that case, the area of the surfaces 62e and 62f can be small; thus, display that is substantially equivalent to that of the display device illustrated in FIGS. 8A and 8B can be performed.

Figure 10A:
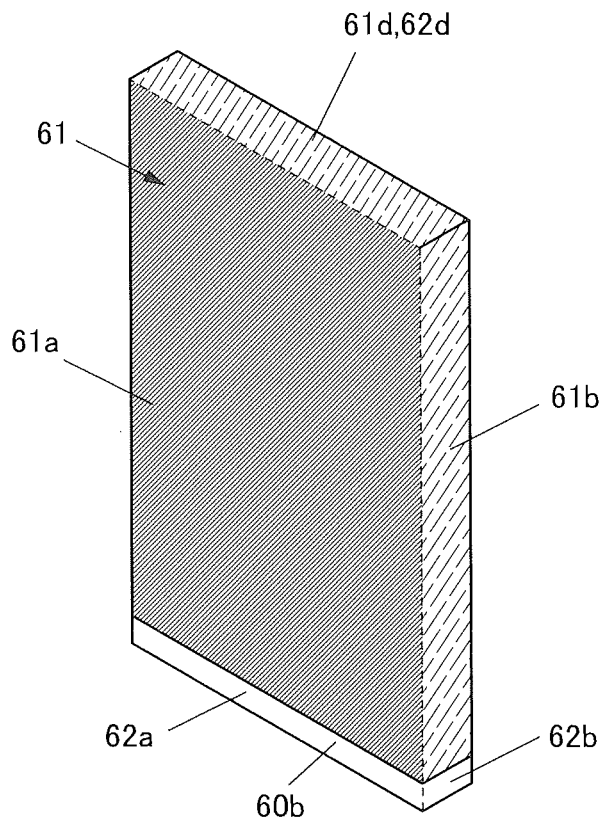
FIGS. 10A to 10C illustrate the structure of an electronic device.
Figure 10B:
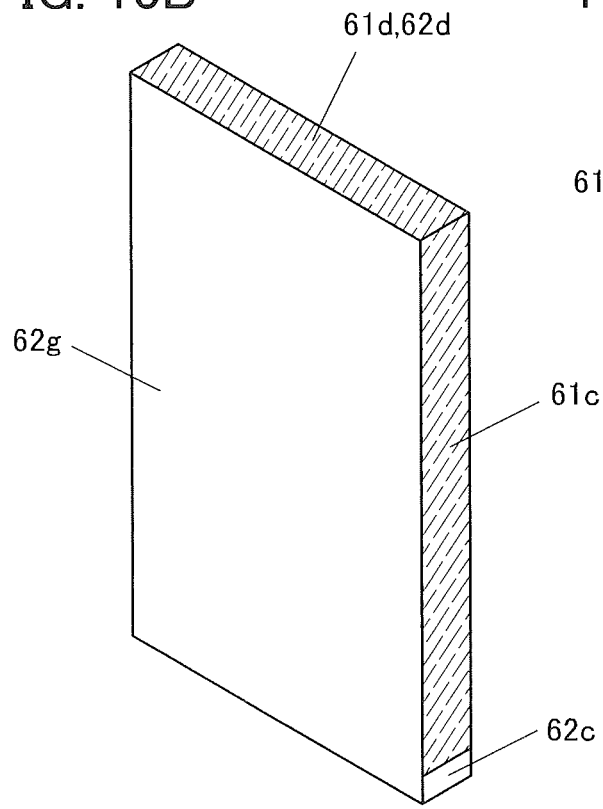
Figure 10C:
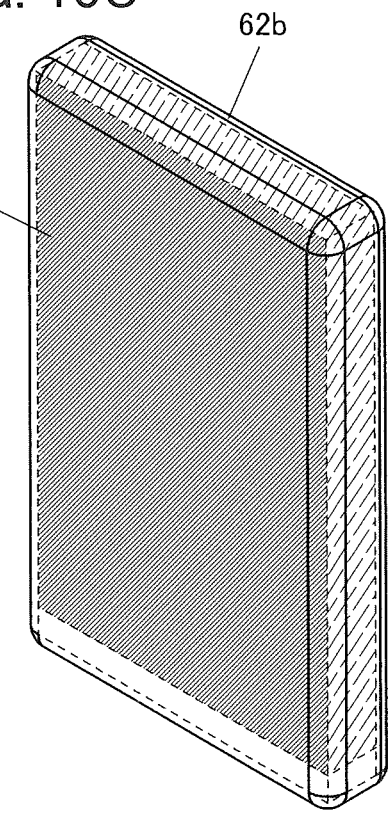

Alternatively, a structure without a curved surface between the top surface and each of the first to third side surfaces as in the housing 60b illustrated in FIGS. 10A and 10B may be employed. In other words, the housing may be a rectangular solid. In that case, the surfaces 62e and 62f are not formed, so that the display region 61d can be provided in contact with the display region 61b and the display region 61c and the top surface and the first to third side surfaces of the housing 60b can be provided with display regions without leaving a space. Note that in the case of the structure in FIGS. 10A and 10B, a transparent protective cover whose corners have curved surfaces as in FIG. 10C is preferably provided so that an electronic device can be held without difficulty and the risk of damage to the corners can be avoided.

The display device 61 has flexibility. Thus, a structure in which an end portion of the display region 61e is in contact with an end portion of the display region 61d as in FIG. 8A or a structure in which an end portion of the display region 61e and an end portion of the display region 61d overlap with each other can be employed. Such a structure allows a joint to be less visible, and it is substantially possible to display a continuous image in the display regions 61e and 61d.

Although the display device 61 has flexibility, the display device 61 in the state of being incorporated in the housing 60a or the housing 60b is not necessarily flexible. The surface of the housing 60a or the housing 60b may be provided with a hardware button, an external connection terminal, and the like in addition to the display device 61.

With the structure described above, display can be performed not only on one surface (e.g., the top surface) of the housing, as in conventional electronic devices, but also on a side surface adjacent to the one surface of the housing and a curved surface at a corner of the housing. It is particularly preferred that a display region be provided along two or more side surfaces because images can be displayed in more various ways.

For example, the display regions 61a to 61f can display different images or the like by being used as individual display regions. Alternatively, the display regions 61a to 61f can display one image or the like in any two or more of the display regions. For example, an image displayed in the display region 61a may be displayed also in the display region 61b or the like, as a continuous image. Furthermore, a continuous image may be displayed in the display regions 61d, 61e, and 61b.

Alternatively, the top and bottom surfaces and all the side surfaces of the housing may be provided with display regions. For example, almost all the surfaces except corners of the housing 60a may be provided with display regions as illustrated in FIGS. 11A to 11D. FIG. 11A is a schematic perspective view illustrating the top surface side, and FIG. 11B is a schematic perspective view illustrating the bottom surface side. FIG. 11C is a cross-sectional view taken along Y1-Y2 in FIGS. 11A and 11B, and FIG. 11D is a cross-sectional view taken along X1-X2 in FIGS. 11A and 11B.

The structure illustrated in FIGS. 11A and 11B corresponds to the structure in FIGS. 8A and 8B that additionally includes a display region 61g provided for the surface 62g (bottom surface), a display region 61h provided for a surface 62h (fourth side surface), a display region 61i provided for a surface 62i, which is a curved surface between the surfaces 62b and 62h, and a display region 61j provided for a surface 62j, which is a curved surface between the surfaces 62c and 62h. In FIGS. 8A and 8B, the one end side of the housing 60a is not covered with display regions, whereas in FIGS. 11A and 11B, the housing 60a is covered almost entirely with display regions.

Note that the display region 61g can have the same structure as the display region 61a. The display region 61h can have the same structure as the display region 61d. The display regions 61i and 61j can have the same structures as the display regions 61e and 61f.

With such a structure, a continuous image can be displayed on substantially all the surfaces of the housing 60a. Alternatively, an electronic device can be used without discrimination between the front and back sides, between the top and bottom sides, and between the right and left sides. Note that also in the structure illustrated in FIGS. 9A and 9B or FIGS. 10A to 10C, substantially all the surfaces of the housing can be provided with display regions as in the structure illustrated in FIGS. 11A and 11B.

In the structure illustrated in FIGS. 8A and 8B, a variety of elements can be provided at corners not covered with the display device 61. For example, a lamp 29a can be provided as in FIG. 36A. Alternatively, a camera 29b may be provided as in FIG. 36B. Alternatively, an audio device 29c such as a speaker or a microphone may be provided as in FIG. 36C. Alternatively, a charm hole 29d may be provided as in FIG. 36D. Note that the above different elements may be provided at different corners. In FIGS. 36A to 36D, display regions are not hatched for simplicity.

Figure 12:
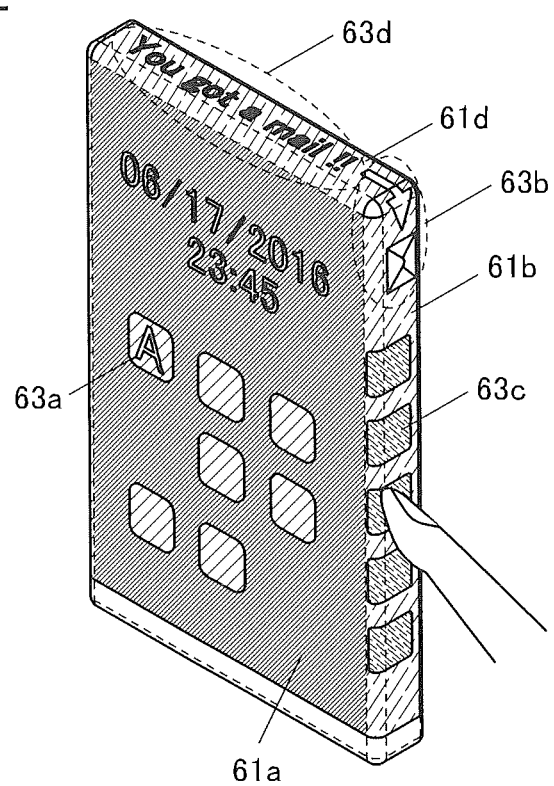
FIG. 12 illustrates an example of a use state of an electronic device.

FIG. 12 shows an example of a use state of the electronic device illustrated in FIGS. 8A and 8B. In FIG. 12, text information and a plurality of icons 63a associated with application software or the like are displayed in the display region 61a. Notification information 63b, icons 63c associated with the operation of the electronic device, or the like are displayed in the display region 61b, for example. In addition, notification information 63d is displayed in the display region 61d.

For example, notification information and transmitter information (e.g., the name, phone number, e-mail address, and the like of a transmitter) can be displayed in not only the display region 61a but also the display regions 61b and 61d or the like when a phone call or a text message is received. In FIG. 12, the notification information 63b and the notification information 63d are displayed in the display regions 61b and 61d, as notification of incoming mail. The notification information 63b and the notification information 63d can be displayed so as to roll across the display region 61b and the display region 61d.

In a standby time of the electronic device, display may be off (for example, black display may be performed) in the display region 61a, and information may be displayed in only the display region 61b or 61c, or the like. In the case where, only the display region 61a is ceaselessly used to, for example, watch a moving image, display may be off (for example, black display may be performed) in the display regions 61b and 61c and the like, and information may be displayed in only the display region 61a. Display in the display region that is not used is set off, whereby power consumption can be reduced.

It is preferred that a touch sensor be provided at a position overlapping with the display device 61, specifically, in regions overlapping with the display regions. As a touch sensor, for example, a sheet-like capacitive touch sensor may be provided to overlap with the display device 61. Alternatively, as a touch sensor, a so-called in-cell touch panel that has a touch sensor function may be provided as the display device 61 itself. As an in-cell touch panel, a capacitive touch sensor or an optical touch sensor using a photoelectric conversion element may be used.

An electronic device of one embodiment of the present invention can perform display on not only the top surface but also one or more side surfaces of the housing; thus, images can be displayed in various ways compared with a conventional electronic device. Furthermore, when provided with a touch sensor in each of the display regions, an electronic device can be operated in various ways and intuitively compared with a conventional electronic device.

Although an example of the case where images are displayed in various ways using the display device 61 is described here, one embodiment of the present invention is not limited thereto. For example, depending on circumstances or conditions, information is not necessarily displayed. As an example, the display device 61 may be used as a lighting device. When used as a lighting device, the display device 61 can be utilized as interior lighting having an attractive design. Alternatively, the display device 61 can be used as lighting with which various directions can be illuminated. Still alternatively, the display device 61 may be used as a light source such as a backlight or a front light. In other words, part of the display device 61 may be used as a lighting device for the display device.

[Structure Examples of Display Panel]

Next, a structure example of a display device which can be used for the electronic device of one embodiment of the present invention will be described with reference to drawings.

Figure 13A:
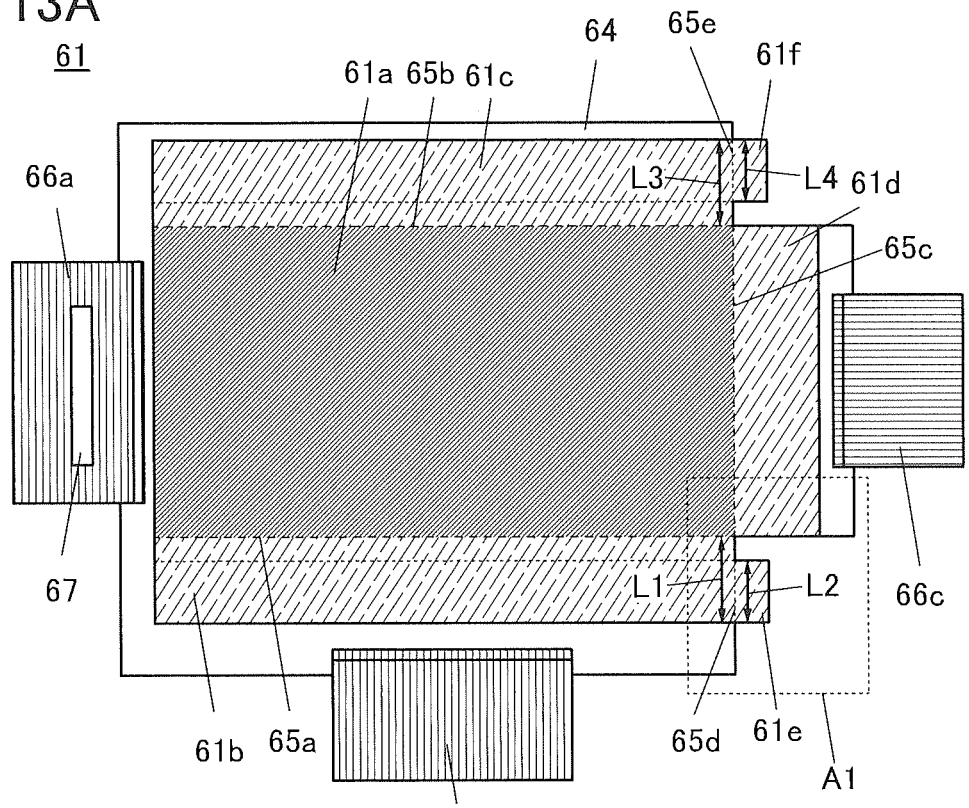
FIGS. 13A and 13B illustrate the structures of display devices.

FIG. 13A is a schematic top view of the display device 61 illustrated in FIGS. 8A and 8B. The display device 61 includes a flexible substrate 64 and a plurality of pixels over the substrate 64. The display device 61 includes the display regions 61a to 61f.

The outline of each of the display regions 61a to 61d is a substantial quadrangle. The angle at each vertex of the substantial quadrangle is a substantially right angle. The display region 61b is provided in contact with one (side 65a) of four sides forming the outline of the display region 61a. The width of the display region 61a and the width of the display region 61b in the direction parallel to the side 65a are preferably equal.

The display region 61c is provided in contact with one (side 65b) of four sides forming the outline of the display region 61a. The width of the display region 61a and the width of the display region 61c in the direction parallel to the side 65b are preferably equal.

The display region 61d is provided in contact with one (side 65c) of four sides forming the outline of the display region 61a. The width of the display region 61a and the width of the display region 61d in the direction parallel to the side 65c are preferably equal.

The display region 61e is provided in contact with one (side 65d) of four sides forming the outline of the display region 61b. A width L1 of the display region 61b in the direction parallel to the side 65d is preferably larger than a width L2 of the display region 61e in the direction parallel to the side 65d.

The display region 61f is provided in contact with one (side 65e) of four sides forming the outline of the display region 61c. A width L3 of the display region 61c in the direction parallel to the side 65e is preferably larger than a width L4 of the display region 61f in the direction parallel to the side 65e.

When the display device 61 has the structure described above, display regions can be provided along the surfaces of the housing 60a as illustrated in FIGS. 8A and 8B.

Part of the substrate 64 is provided with FPCs 66a, 66b, and 66c which supply signals and electric power for driving the pixels. Although an IC 67 is mounted on the FPC 66a in FIG. 13A, the IC 67 is not necessarily provided. The FPC 66b has a function of supplying a signal and electric power to, for example, the driver circuits. The FPCs 66b and 66c are not provided in some cases.

The IC 67 may be directly mounted on the substrate 64. Here, the width of the FPC 66a is preferably smaller than that of the display region 61a. In that case, particularly when the display region 61b and the display region 61c are bent and the display region 61a is flat, a junction portion of the FPC 66a and the substrate 64 is not bent and therefore, the FPC 66a can be prevented from being separated.

Figure 14A:
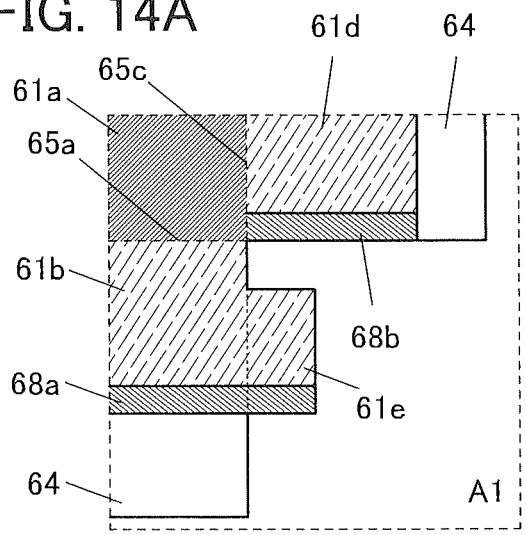
FIGS. 14A to 14F illustrate the structures of display devices.

FIG. 14A is a schematic top view in which a region A1 in FIG. 13A is enlarged. A driver circuit 68a that outputs signals for driving pixels included in the display regions 61a, 61b, and 61e is provided. In addition, a driver circuit 68b that outputs signals for driving pixels included in the display region 61d is provided.

The driver circuit 68a is provided along the side of the display region 61b that is opposite to the side 65a, and extends to the display region 61e. The driver circuit 68a is electrically connected to the FPC 66b through a wiring, for example. The driver circuit 68b is provided along the side of the display region 61d that is perpendicular to the side 65c. The driver circuit 68b is electrically connected to the FPC 66c through a wiring, for example.

Figure 14B:
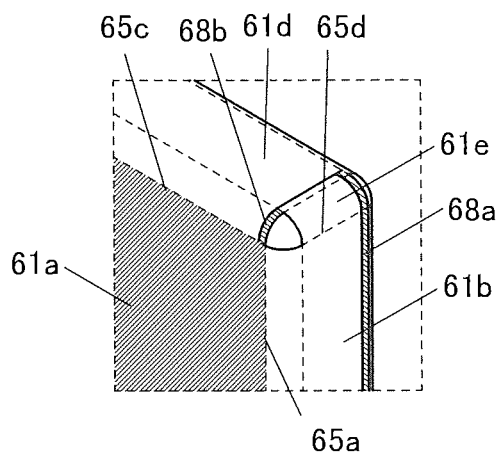

FIG. 14B illustrates the details of an example in which the region A1 and the vicinity thereof are provided along the housing 60a illustrated in FIG. 8A. Part of the driver circuit 68b can overlap with part of the display region 61e. Thus, the display region 61d and the display region 61e can be substantially continuous. Note that some display regions are not hatched for simplicity in FIG. 14B.

As the driver circuits 68a and 68b, for example, a circuit serving as a gate driver circuit or a source driver circuit can be used; preferably, a gate driver circuit is used. In that case, the IC 67 preferably has a function of a source driver circuit.

Although a so-called driver integrated type display device including a driver circuit over the substrate 64 is described here, a driver circuit is not necessarily provided. Although the example is described above in which the display region 61a is driven by the driver circuit 68a, the display region 61a may be driven by a driver circuit provided in the display region 61c and the display region 61f. Although the driver circuits are positioned at the end portions of the display regions, the driver circuits may be dispersed in pixels of the display regions. This can avoid the end portions of the display regions from being non-display regions.

Figure 13B:
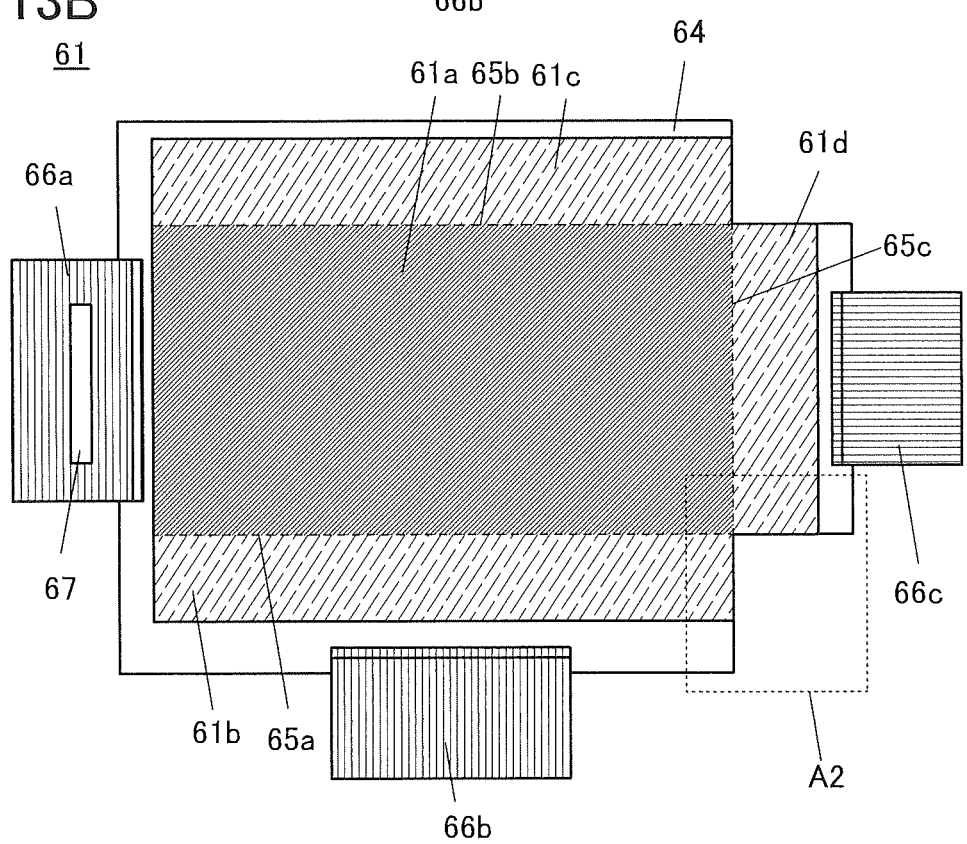

FIG. 13B is a schematic top view of the display device 61 illustrated in FIGS. 9A and 9B or FIGS. 10A and 10B. The display device 61 includes the flexible substrate 64 and a plurality of pixels over the substrate 64. The display device 61 includes the display regions 61a to 61d. The display device 61 in FIG. 13B has the same structure as the display device 61 in FIG. 13A except that the display regions 61e and 61f are not provided.

Figure 14C:
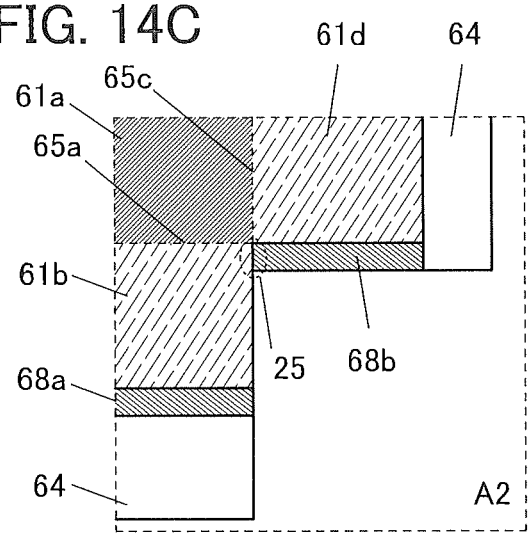

FIG. 14C is a schematic top view in which a region A2 in FIG. 13B is enlarged. A driver circuit 68a that outputs signals for driving pixels included in the display regions 61a and 61b is provided. In addition, a driver circuit 68b that outputs signals for driving pixels included in the display region 61d is provided.

The driver circuit 68a is provided along the side of the display region 61b that is opposite to the side 65a. The driver circuit 68a is electrically connected to the FPC 66b through a wiring, for example. The driver circuit 68b is provided along the side of the display region 61d that is perpendicular to the side 65c. The driver circuit 68b is electrically connected to the FPC 66c through a wiring, for example.

Figure 14D:
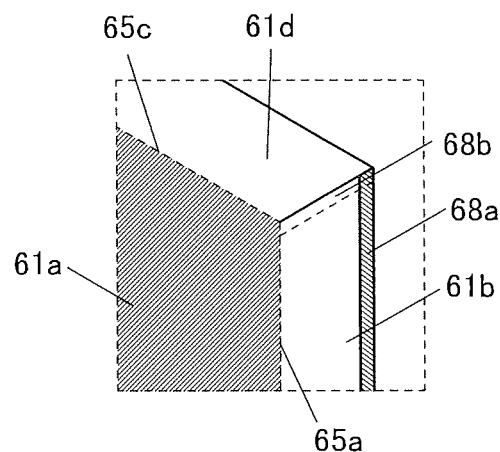

FIG. 14D illustrates the details of an example in which the region A2 and the vicinity thereof are provided along the housing 60b illustrated in FIG. 10A. In a region 25 illustrated in FIG. 14C, there is a slit between the display region 61b and the driver circuit 68b, so that a region provided with the driver circuit 68b can be bent along the housing 60b as illustrated in FIG. 14D. This allows the driver circuit 68b to overlap with part of the display region 61b. Thus, the display region 61d and the display region 61b can be substantially continuous. Note that some display regions are not hatched for simplicity in FIG. 14D.

Figure 14E:
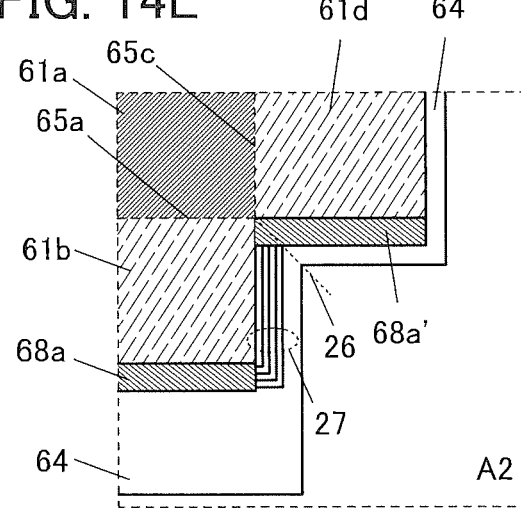

FIG. 14E is a modification example of the region A2 in FIG. 13B in which the driver circuit 68b is not provided and a region 68a' where the driver circuit 68a extends through wirings 27 is provided. In this case, the display region 61d can be driven by the region 68a'; thus, the driver circuits 68b and the FPC 66c are unnecessary.

Figure 14F:
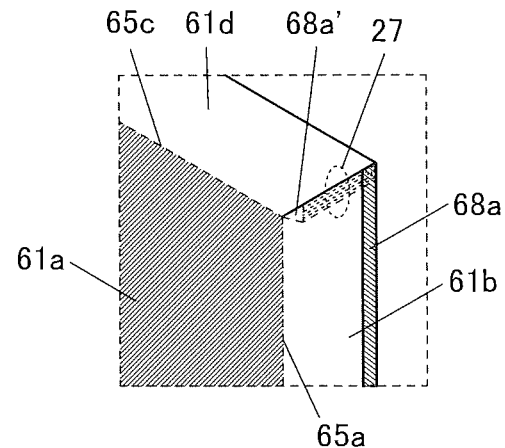

FIG. 14F illustrates the details of an example in which the region A2 and the vicinity thereof are provided along the housing 60b illustrated in FIG. 10A. Bending the region along a broken line 26 illustrated in FIG. 14E allows the region 68a' and the wirings 27 to overlap with part of the display region 61b and part of the driver circuit 68a as illustrated in FIG. 14F. Thus, the display region 61d and the display region 61b can be substantially continuous. Note that some display regions are not hatched for simplicity in FIG. 14F.

The display regions 61a to 61f each include a plurality of pixels, and the pixels are each provided with a display element having a function of emitting visible light. As the display element having a function of emitting visible light, a light-emitting element can be used, for example.

The display regions 61a to 61f are each provided with a display element having a function of reflecting visible light. As the display element having a function of reflecting visible light, a reflective liquid crystal element including a mirror that reflects light incident from the outside can be used, for example.

Figure 15A:
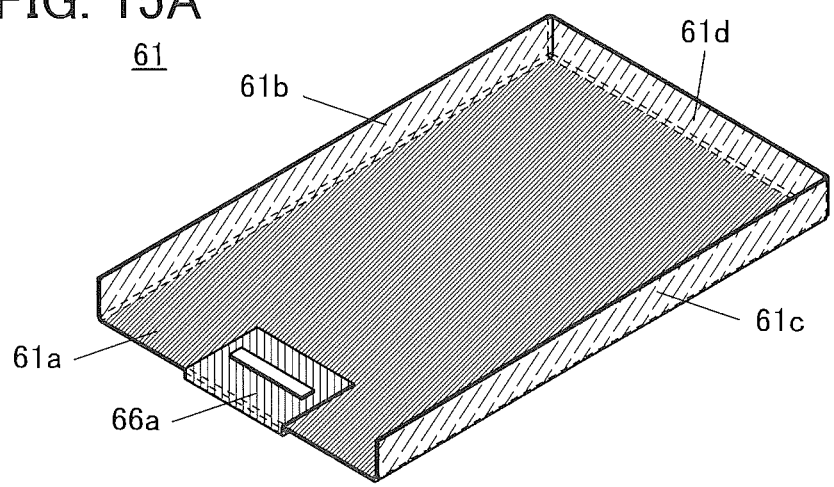
FIGS. 15A to 15C illustrate the structure of a display device and a touch sensor.
Figure 15B:
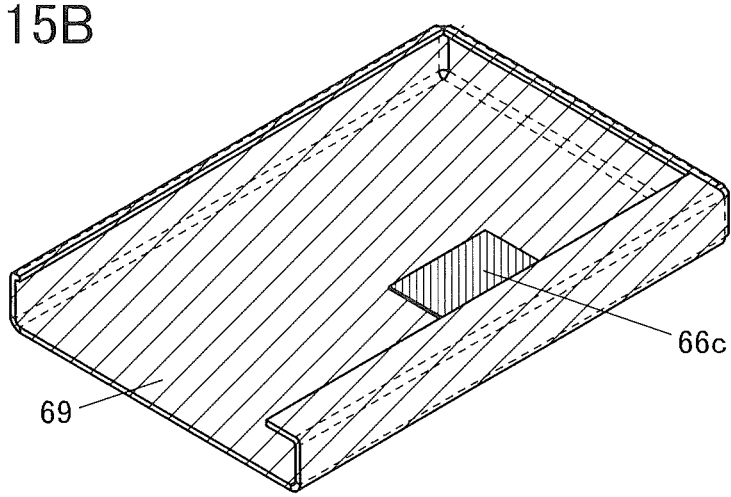
Figure 15C:
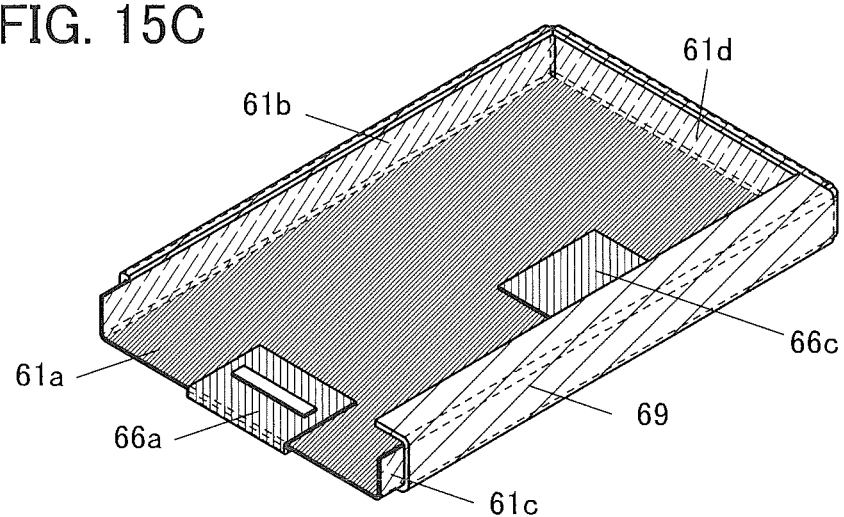

Here, FIGS. 15A to 15C illustrate an example where a sheet-like touch sensor is provided to overlap with the display device 61.

FIG. 15A illustrates a state where part of the display device 61 provided with the FPC 66a is bent. FIG. 15B illustrates a state where a sheet-like touch sensor 69 is bent along a curved surface of the display device 61. The touch sensor 69 is provided with an FPC 66c.

FIG. 15C illustrates a state where the display device 61 and the touch sensor 69 overlap with each other. Here, as illustrated in FIG. 15C, it is preferable that the FPC 66a provided for the display device 61 and the FPC 66c provided for the touch sensor 69 not overlap with each other. Therefore, the display device 61 and the touch sensor 69 preferably do not have the same shape, and in a region to which the FPC 66a or the FPC 66c is attached, the display device 61 and the touch sensor 69 preferably have different shapes so as not to overlap with each other.

As described above, the display device 61 and the sheet-like touch sensor 69 are provided so as to overlap with each other and incorporated in the housing 60a or the housing 60b; thus, a touch function can be added to not only the top surface but also part of a side surface and the bottom surface of the housing.

At least part of this embodiment can be implemented in combination with any of the other embodiments described in this specification as appropriate.

Embodiment 3

In this embodiment, a display device including a first display element that reflects visible light and a second display element that emits visible light will be described. The display device has a structure of either the display region 11a described in Embodiment 1 or the display region 61a described in Embodiment 2.

The display device has a function of displaying an image using one or both of first light reflected by the first display element and second light emitted by the second display element. Alternatively, the display device has a function of producing gray levels by controlling the amount of the first light reflected by the first display element and the amount of the second light emitted by the second display element.

The display device preferably includes first pixels each of which produces gray levels by controlling the amount of light reflected by the first display element and second pixels each of which produces gray levels by controlling the amount of light emitted by the second display element. The first pixels and the second pixels are arranged, for example, in a matrix to form a display portion.

The first pixels and the second pixels are preferably arranged at regular intervals in a display region. The first pixel and the second pixel adjacent to each other can be collectively referred to as a pixel unit.

Furthermore, the first pixels and the second pixels are preferably mixed in the display region of the display device.

In that case, an image displayed by a plurality of first pixels, an image displayed by a plurality of second pixels, and an image displayed by both the plurality of first pixels and the plurality of second pixels can be displayed in the same display region, as described later.

As the first display element included in the first pixel, an element which performs display by reflecting external light can be used. Such an element does not include a light source and thus power consumption in display can be significantly reduced.

As the first display element, a reflective liquid crystal element can typically be used. Alternatively, as the first display element, an element using a microcapsule method, an electrophoretic method, an electrowetting method, an Electronic Liquid Powder (registered trademark) method, or the like can be used, other than a Micro Electro Mechanical Systems (MEMS) shutter element or an optical interference type MEMS element.

As the second display element included in the second pixel, an element which includes a light source and performs display using light from the light source can be used. It is particularly preferable to use a light-emitting element in which light emission from a light-emitting substance can be extracted by application of an electric field. Since the luminance and the chromaticity of light emitted from such a pixel are not affected by external light, an image with high color reproducibility (a wide color gamut) and a high contrast, i.e., a clear image can be displayed.

As the second display element, a self-luminous light-emitting element such as an organic light-emitting diode (OLED), a light-emitting diode (LED), and a quantum-dot light-emitting diode (QLED) can be used. Alternatively, a combination of a backlight as a light source and a transmissive liquid crystal element which controls the amount of transmitted light emitted from a backlight may be used as the second display element.

The first pixel can include subpixels which emit white (W) light or subpixels which emit light of three colors of red (R), green (G), blue (B), for example. The second pixel can also include subpixels which emit white (W) light or subpixels which emit light of three colors of red (R), green (G), and blue (B), for example. Note that the first pixel and the second pixel may each include subpixels of four colors or more. As the number of kinds of subpixels increases, power consumption can be reduced and color reproducibility can be improved.

In one embodiment of the present invention, switching between a first mode in which an image is displayed by the first pixels, a second mode in which an image is displayed by the second pixels, and a third mode in which an image is displayed by the first pixels and the second pixels can be performed.

In the first mode, an image is displayed using light reflected by the first display element. The first mode is a driving mode with extremely low power consumption because a light source is unnecessary, and is effective in the case where, for example, external light has a sufficiently high illuminance and is white light or light near white light. The first mode is a display mode suitable for displaying text information of a book or a document, for example. The first mode can offer eye-friendly display owing to the use of reflected light and thus has an effect of being unlikely to cause eyestrain.

In the second mode, an image is displayed using light emitted by the second display element. Thus, an extremely clear image (with a high contrast and high color reproducibility) can be displayed regardless of the illuminance and chromaticity of external light. For example, the second mode is effective in the case where the illuminance of external light is extremely low, such as during the nighttime or in a dark room. When a bright image is displayed under weak external light, a user may feel that the image is too bright. To prevent this, an image with reduced luminance is preferably displayed in the second mode. In that case, not only a reduction in brightness but also low power consumption can be achieved. The second mode is a mode suitable for displaying a vivid image and a smooth moving image, for example.

In the third mode, display is performed using both light reflected by the first display element and light emitted by the second display element. Specifically, the display device is driven so that light emitted from the first pixel and light emitted from the second pixel adjacent to the first pixel are mixed to express one color. A clearer image than that in the first mode can be displayed and power consumption can be lower than that in the second mode. For example, the third mode is effective when the illuminance of external light is relatively low, such as under indoor illumination or in the morning or evening, or when the external light does not represent a white chromaticity. Furthermore, the use of mixed light of reflected light and emitted light enables display of an image like a real painting.

More specific structure examples will be described below with reference to drawings.

[Structure Example of Display Device]

Figure 16:
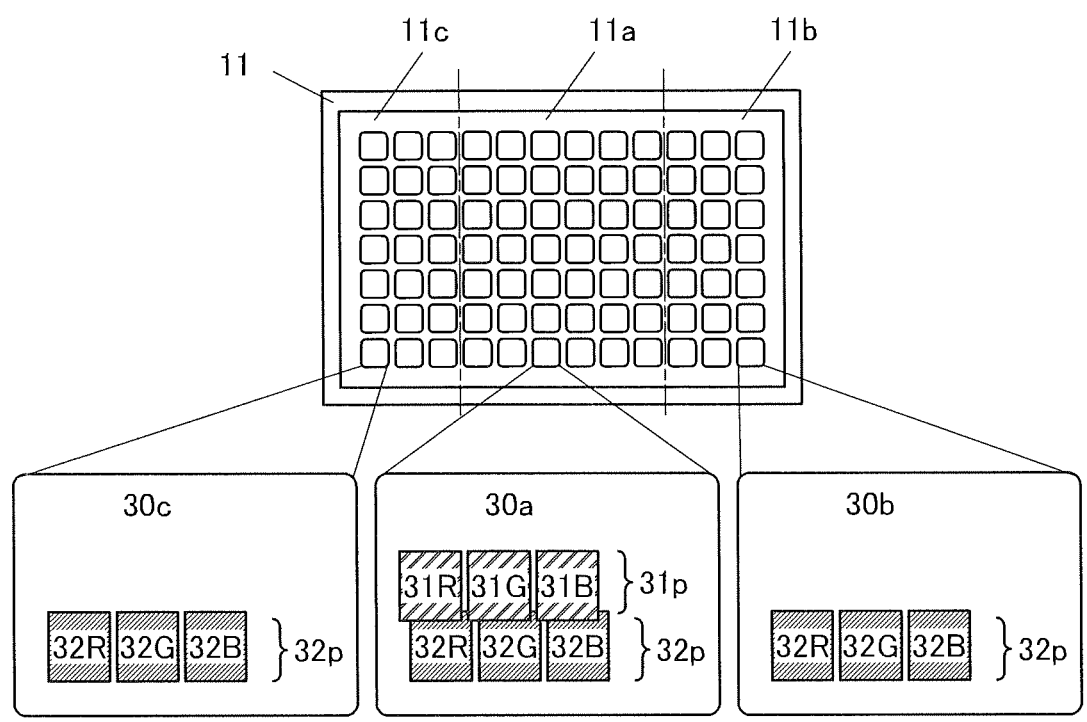
FIG. 16 is a block diagram illustrating a display device.

FIG. 16 is a block diagram of the display device 11 including the display regions 11a to 11c described in Embodiment 1.

The display region 11a includes a plurality of pixel units 30a arranged in a matrix. The pixel unit 30a includes a first pixel 31p and a second pixel 32p.

The display region 11b includes a plurality of pixel units 30b arranged in a matrix. The pixel unit 30b includes the second pixel 32p.

The display region 11c includes a plurality of pixel units 30c arranged in a matrix. The pixel unit 30c includes a second pixel 32p.

Figure 17:
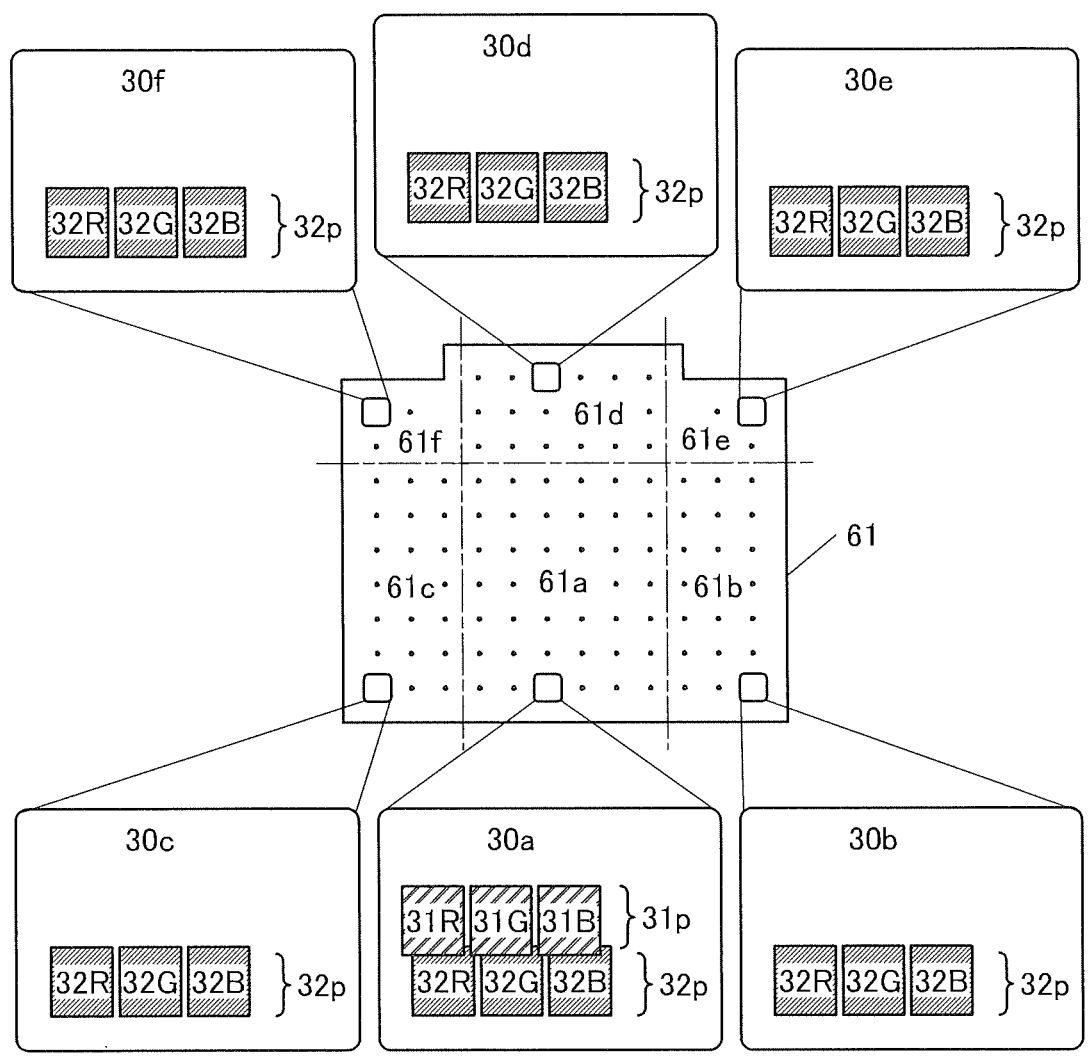
FIG. 17 is a block diagram illustrating a display device.

FIG. 17 is a block diagram of the display device 61 including the display regions 61a to 61f described in Embodiment 1.

The display region 61a includes a plurality of pixel units 30a arranged in a matrix. The pixel unit 30a includes the first pixel 31p and the second pixel 32p.

The display region 61b includes a plurality of pixel units 30b arranged in a matrix. The pixel unit 30b includes the second pixel 32p.

The display region 61c includes a plurality of pixel units 30c arranged in a matrix. The pixel unit 30c includes the second pixel 32p.

The display region 61d includes a plurality of pixel units 30d arranged in a matrix. The pixel unit 30d includes the second pixel 32p.

The display region 61e includes a plurality of pixel units 30e arranged in a matrix. The pixel unit 30e includes the second pixel 32p.

The display region 61f includes a plurality of pixel units 30f arranged in a matrix. The pixel unit 30f includes the second pixel 32p.

FIGS. 16 and 17 each show an example where the first pixel 31p and the second pixel 32p each include display elements for three colors of red (R), green (G), and blue (B).

The first pixel 31p includes a display element 31R for red (R), a display element 31G for green (G), and a display element 31B for blue (B). The display elements 31R, 31G, and 31B each utilize reflection of external light.

The second pixel 32p includes a display element 32R for red (R), a display element 32G for green (G), and a display element 32B for blue (B). The display elements 32R, 32G, and 32B each utilize light of a light source.

[Structure Examples of Pixel Unit]

Figure 18A:
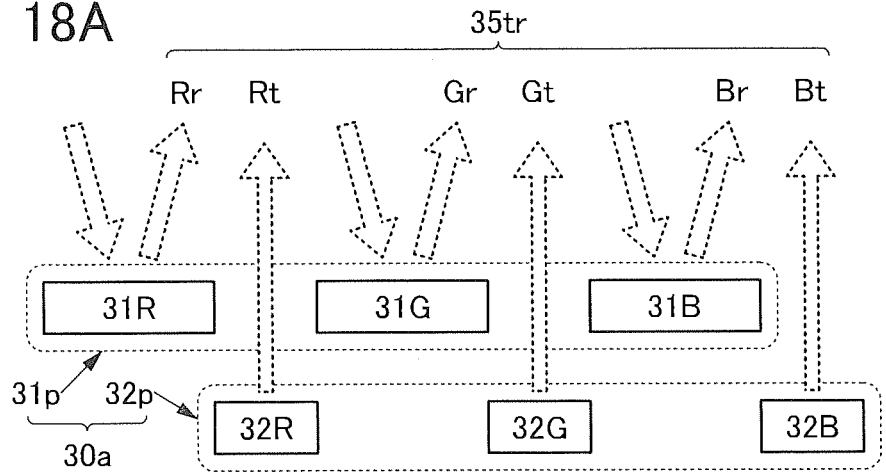
FIGS. 18A to 18C illustrate a pixel unit.
Figure 18B:
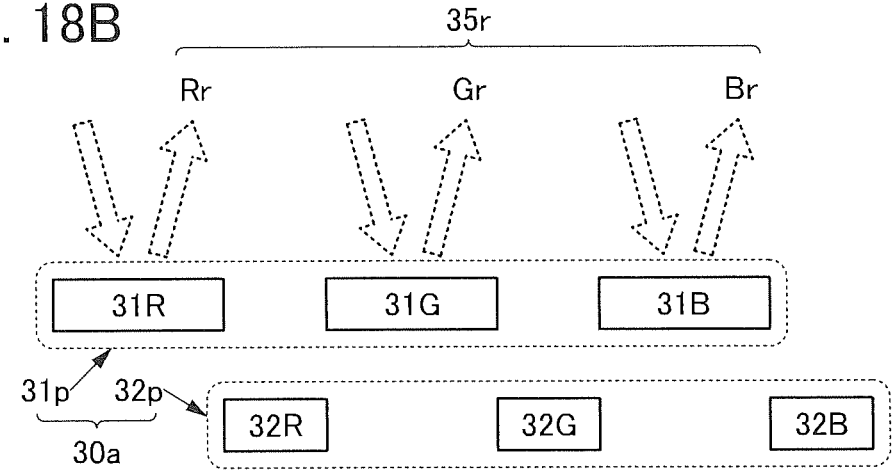
Figure 18C:
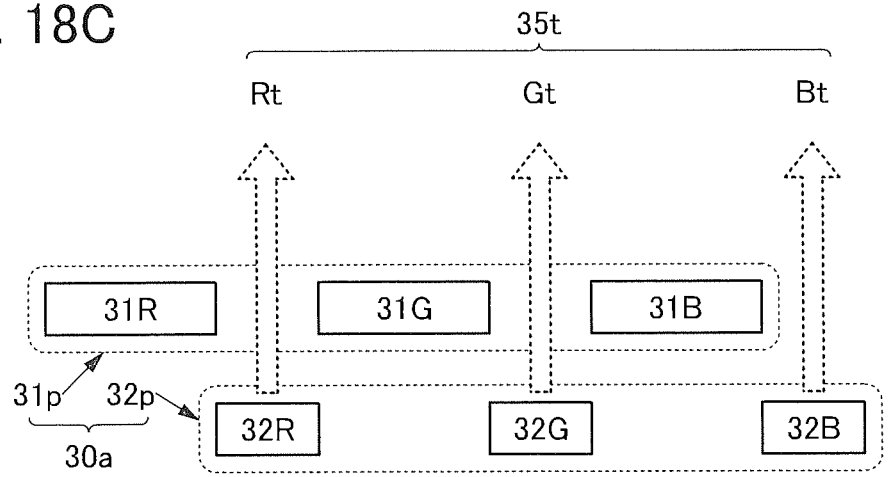

FIGS. 18A to 18C are schematic views illustrating structure examples of the pixel unit 30a. The pixel unit 30a includes the first pixel 31p and the second pixel 32p.

The first pixel 31p includes the display elements 31R, 31G, and 31B. The display elements 31R, 31G, and 31B are each an element that performs display by reflecting external light. The display element 31R reflects external light and emits red light Rr to the display surface side. Similarly, the display element 31G and the display element 31B emit green light Gr and blue light Br, respectively, to the display surface side.

The second pixel 32p includes the display elements 32R, 32G, and 32B. The display elements 32R, 32G, and 32B are each a light-emitting element. The display element 32R emits red light Rt to the display surface side. Similarly, the display element 32G and the display element 32B emit green light Gt and blue light Bt, respectively, to the display surface side. Accordingly, a clear image can be displayed with low power consumption. Furthermore, an image like a real painting can be displayed.

FIG. 18A corresponds to a mode (third mode) in which display is performed by driving both the first pixel 31p and the second pixel 32p. The pixel unit 30a can emit light 35tr of a predetermined color to the display surface side by mixing six kinds of light, the light Rr, the light Gr, the light Br, the light Rt, the light Gt, and the light Bt.

Here, there are many combinations of luminance of light selected from the six kinds of light, the light Rr, the light Gr, the light Br, the light Rt, the light Gt, and the light Bt, where the light 35tr has predetermined luminance and chromaticity. Thus, in one embodiment of the present invention, a combination where the luminance (a gray level) of the light Rr, the light Gr, and the light Br emitted from the first pixel 31p is the largest is preferably selected from the combinations of luminance (gray levels) of six kinds of light which provide the light 35tr with the same luminance and chromaticity. In that case, power consumption can be reduced without impairing color reproducibility.

FIG. 18B corresponds to a mode (first mode) in which display is performed with only reflected light by driving the first pixel 31p. In the case where the illuminance of external light is sufficiently high, for example, the pixel unit 30a can emit light 35r of a predetermined color, which is a reflected light combination, to the display surface side by mixing only light from the first pixel 31p (the light Rr, the light Gr, and the light Br) without driving the second pixel 32p. This enables driving with extremely low power consumption. Furthermore, eye-friendly display can be performed.

FIG. 18C corresponds to a mode (second mode) in which display is performed with only emitted light (transmitted light) by driving the second pixel 32p. In the case where the illuminance of external light is extremely low, for example, the pixel unit 30a can emit the light 35t of a predetermined color to the display surface side by mixing only light from the second pixel 32p (the light Rt, the light Gt, and the light Bt) without driving the first pixel 31p. Accordingly, a clear image can be displayed. Furthermore, luminance is lowered when the illuminance of external light is low, which can prevent a user from feeling glare and reduce power consumption.

MODIFICATION EXAMPLES

Although the example in which the first pixel 31*p* and the second pixel 32*p* each include display elements for three colors of red (R), green (G), and blue (B) is described above, one embodiment of the present invention is not limited thereto. A structure example different from the above will be described below.

FIGS. 19A to 19C and FIGS. 20A to 20C each illustrate a structure example of the pixel unit 30*a*. Although schematic views corresponding to a mode (third mode) in which display is performed by driving both the first pixel 31*p* and the second pixel 32*p* are illustrated here, display can be performed using either the mode (first mode) in which display is performed with only reflected light by driving the first pixel 31*p* or the mode (second mode) in which display is performed with only emitted light (transmitted light) by driving the second pixel 32*p*, as in the above cases.

Figure 19A:
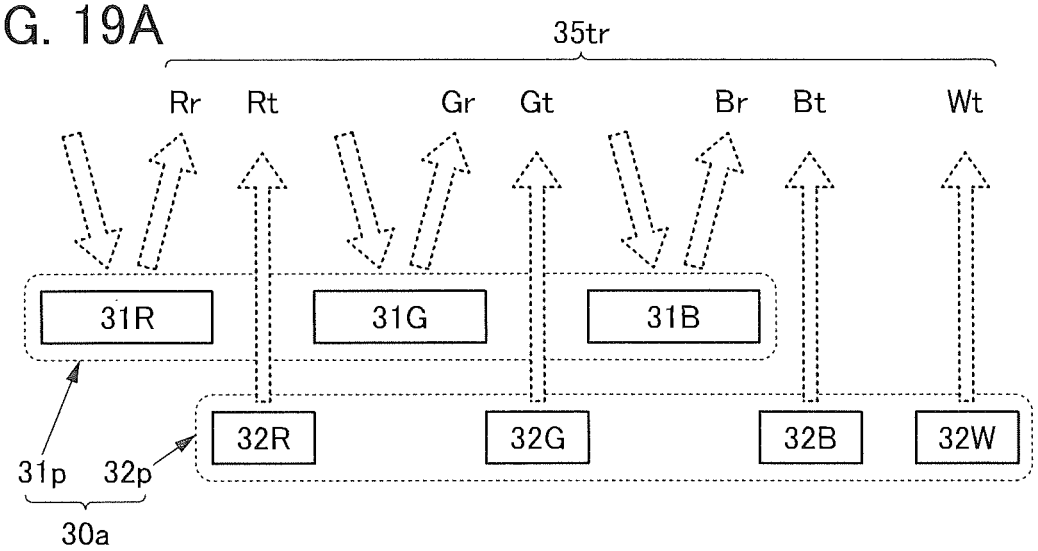
FIGS. 19A to 19C illustrate a pixel unit.

FIG. 19A illustrates an example in which the second pixel 32*p* includes a display element 32W that exhibits white (W) light in addition to the display element 32R, the display element 32G, and the display element 32B. This can reduce power consumption in the display modes each using the second pixel 32*p* (the second mode and the third mode).

Figure 19B:
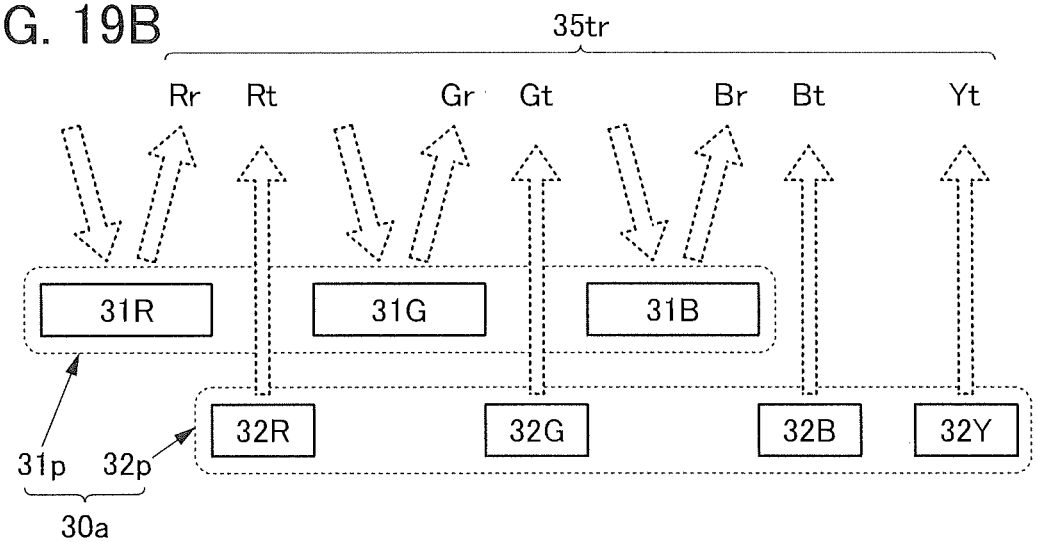

FIG. 19B illustrates an example in which the second pixel 32*p* includes a display element 32Y that exhibits yellow (Y) light in addition to the display element 32R, the display element 32G, and the display element 32B. This can reduce power consumption in the display mode using the second pixel 32*p* (the second mode or the third mode).

Figure 19C:
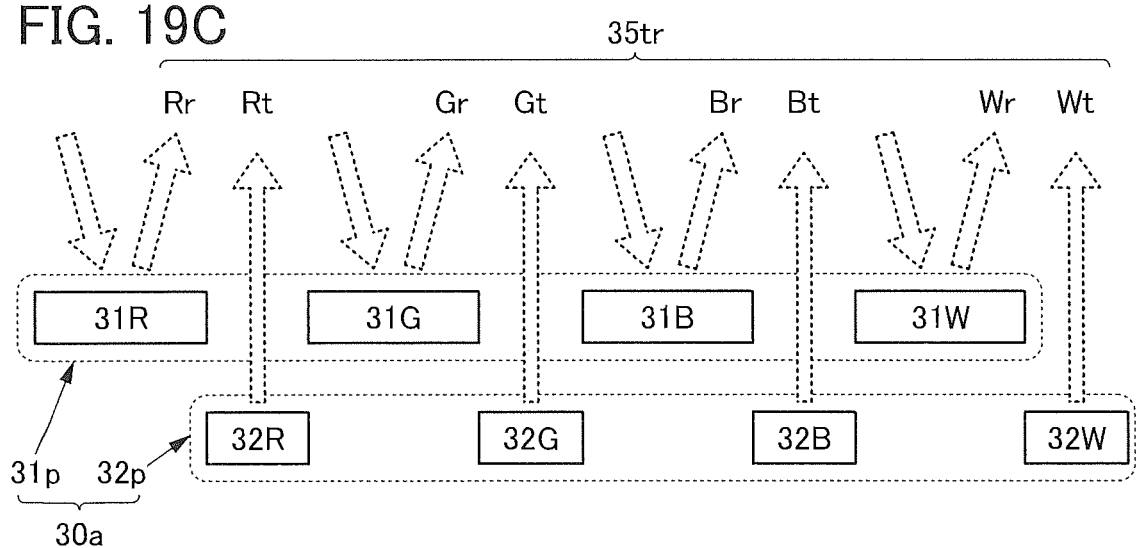

FIG. 19C illustrates an example in which the first pixel 31*p* includes a display element 31W that exhibits white (W) light in addition to the display element 31R, the display element 31G, and the display element 31B and the second pixel 32*p* includes the display element 32W that exhibits white (W) light in addition to the display element 32R, the display element 32G, and the display element 32B. This can reduce power consumption in the display modes each using the first pixel 31*p* (the first mode and the third mode) and in the display modes each using the second pixel 32*p* (the second mode and the third mode).

Figure 20A:
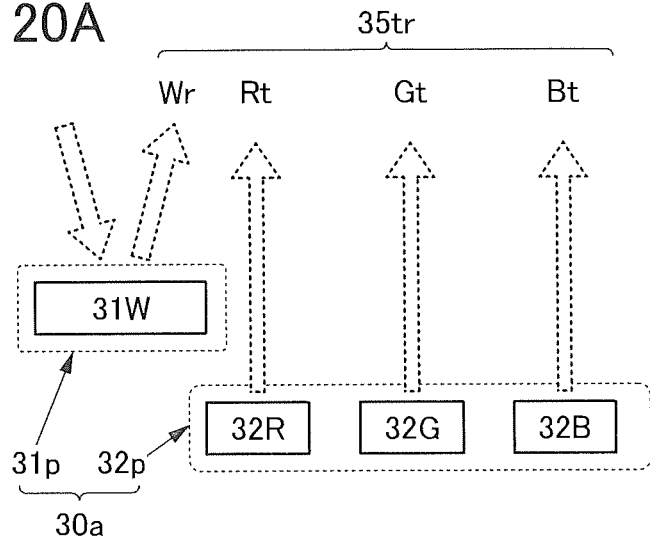
FIGS. 20A to 20C illustrate a pixel unit.

FIG. 20A illustrates an example in which the first pixel 31*p* includes only the display element 31W that exhibits white light. In this case, in the display mode using only the first pixel 31*p* (first mode), monochrome or grayscale images can be displayed, and in the display modes each using the second pixel 32*p* (the second mode and the third mode), color images can be displayed.

Furthermore, such a structure can increase the aperture ratio and the reflectivity of the first pixel 31*p*, allowing a brighter image to be displayed.

The mode (first mode) in which display is performed using only the first pixel 31*p* is suitable for displaying information that does not need to be displayed in color, such as text information. When display is performed in the first mode, an electronic device incorporating the display device can be used like an e-book reader or a textbook, for example.

Figure 20B:
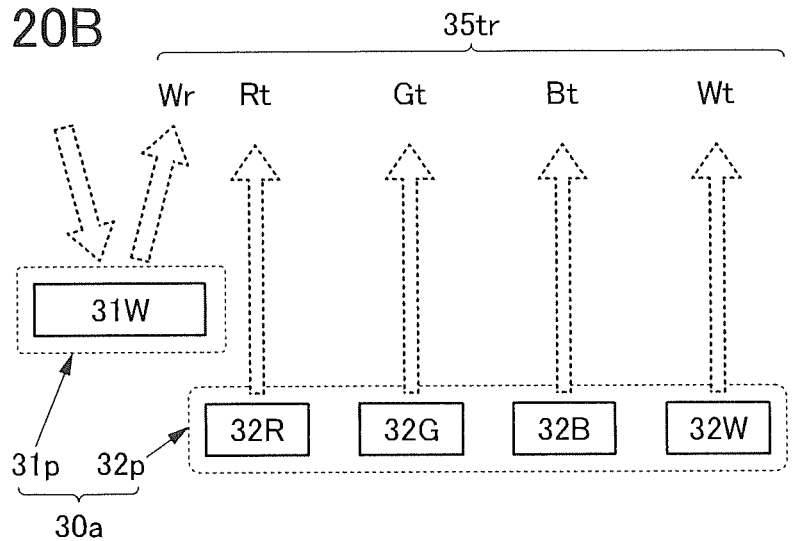

FIG. 20B illustrates an example in which the display element 32W that exhibits white (W) light is also included in the structure of FIG. 20A. This can reduce power consumption in the display modes each using the second pixel 32*p* (the second mode and the third mode).

Figure 20C:
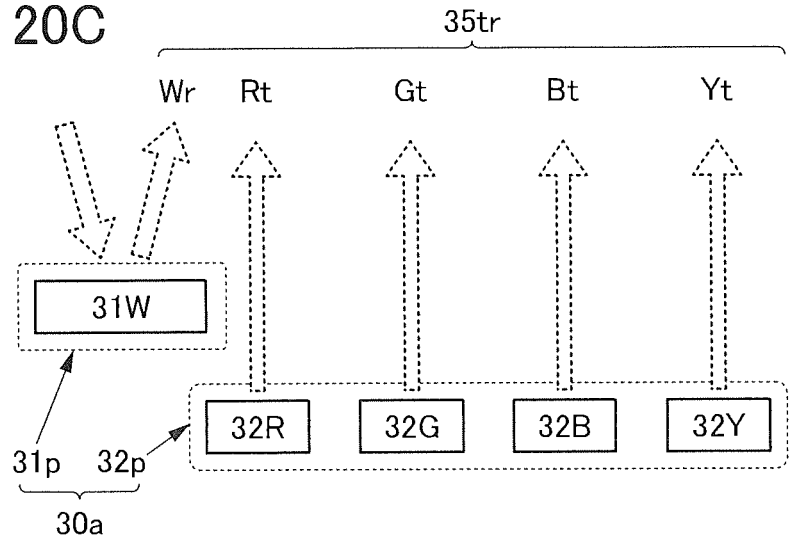

FIG. 20C illustrates an example in which the display element 32Y that exhibits yellow (Y) light is also included in the structure of FIG. 20A. This can reduce power consumption in the display modes each using the second pixel 32*p* (the second mode and the third mode).

The above is the description of the structure examples of display units.

[Cross-Sectional Structure Example of Display Device]

Figure 21A:
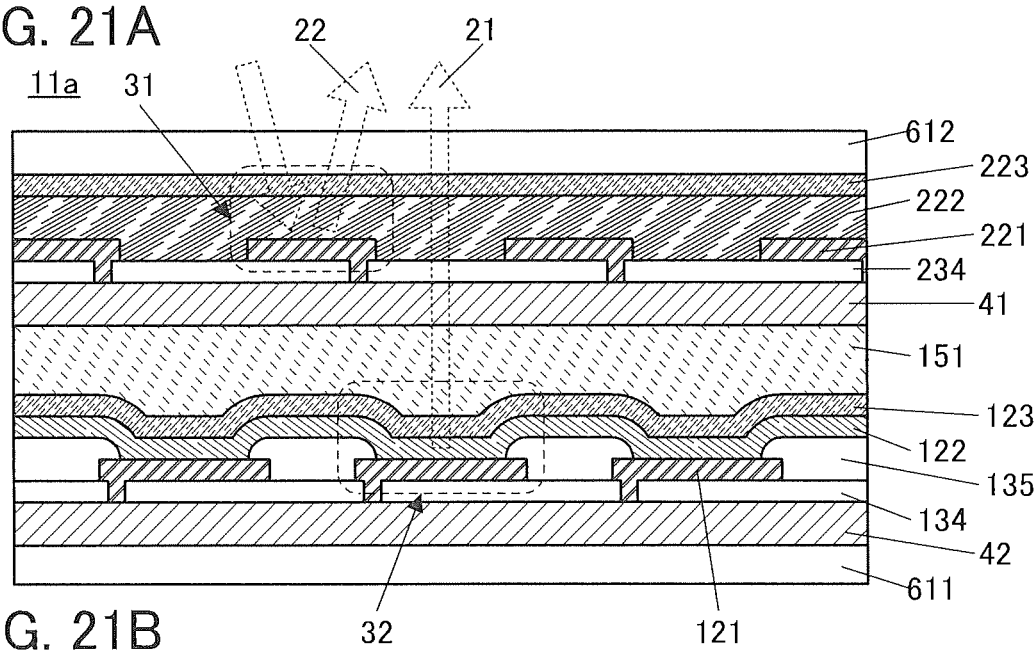
FIGS. 21A to 21C illustrate the structures of display devices.

FIG. 21A illustrates an example of a cross-sectional structure of the display region 11*a* of the display device 11. Note that the display region 61*a* of the display device 61 can have the same structure.

The display region 11*a* includes, between a substrate 611 and a substrate 612, a first layer 41, an insulating layer 134, an insulating layer 135, a display element 32, an adhesive layer 151, a second layer 42, an insulating layer 234, a display element 31, and the like.

The display element 31 includes a conductive layer 221, a conductive layer 223, and liquid crystal 222 between the conductive layers 221 and 223. The conductive layer 221 reflects visible light, and the conductive layer 223 transmits visible light. Thus, the display element 31 is a reflective liquid crystal element that emits reflected light 22 to the substrate 612 side. Here, the conductive layer 221 is provided for each pixel and functions as each pixel electrode. The conductive layer 223 is shared by a plurality of pixels. The conductive layer 223 is connected to a wiring supplied with a constant potential in a region that is not illustrated and functions as a common electrode.

The display element 32 includes a conductive layer 121, a conductive layer 123, and an EL layer 122 between the conductive layers 121 and 123. The EL layer 122 includes at least a light-emitting substance. The conductive layer 121 reflects visible light, and the conductive layer 123 transmits visible light. Thus, the display element 32 is a light-emitting element that emits light 21 to the substrate 612 side by application of voltage between the conductive layers 121 and 123. Here, the conductive layer 121 is provided for each pixel and functions as each pixel electrode. The EL layer 122 and the conductive layer 123 are shared by a plurality of pixels. The conductive layer 123 is connected to a wiring supplied with a constant potential in a region that is not illustrated and functions as a common electrode.

The first layer 41 includes a circuit that drives the display element 31. The second layer 42 includes a circuit that drives the display element 32. For example, the first layer 41 and the second layer 42 each include a pixel circuit including a transistor, a capacitor, a wiring, an electrode, or the like. Note that the circuit that drives the display element 31 and the circuit that drives the display element 32 may be formed in one layer.

The insulating layer 234 is provided between the first layer 41 and the conductive layer 221. The conductive layer 221 and the first layer 41 are electrically connected to each other through an opening formed in the insulating layer 234, whereby the first layer 41 and the display element 31 are electrically connected to each other.

The insulating layer 134 is provided between the second layer 42 and the conductive layer 121. The conductive layer 121 and the second layer 42 are electrically connected to each other through an opening formed in the insulating layer 134, whereby the second layer 42 and the display element 32 are electrically connected to each other.

The first layer 41 and the conductive layer 123 are bonded to each other with the adhesive layer 151. The adhesive layer 151 also functions as a sealing layer that seals the display element 32.

In the case where the pixel circuit of the first layer 41 includes a transistor using an oxide semiconductor and thus having a significantly low off-state current or the case where the pixel circuit includes a memory element, for example, the gray level can be maintained even when writing operation to a pixel is stopped in displaying a still image using the display element 31. That is, display can be maintained even when the frame rate is set to an extremely small value.

Figure 21B:
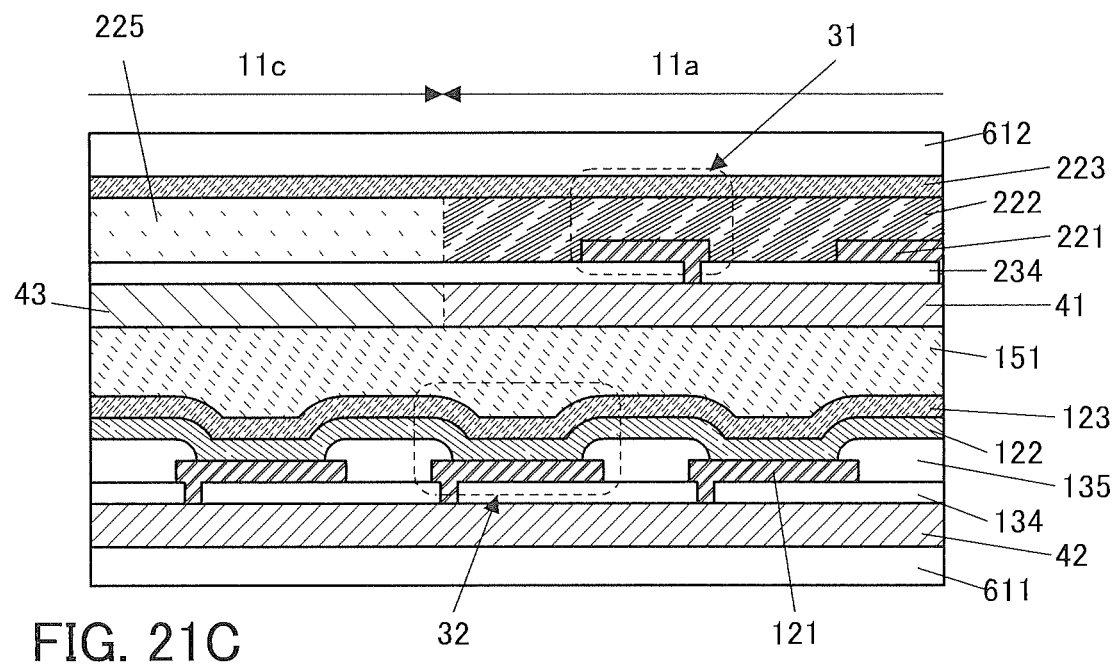

FIG. 21B is a cross-sectional view illustrating the neighborhood of the boundary between the display region 11a and the display region 11c. The display region 11c can have a structure including neither the display element 31 nor an element that relates to the display element 31. A region 43, which corresponds to the first layer 41 in the display region 11a, in the display region 11c, is not provided with a circuit or the like and is partly provided with a light-blocking layer or the like as needed. A region 225, which corresponds to the region of the display region 11a provided with the liquid crystal 222, is provided with a resin layer or the like that transmits light emitted by the display element 32. The region 225 may be provided with the liquid crystal 222.

Note that the display regions 61b to 61f included in the display device 61 can each have a structure similar to that of the display region 11c.

Figure 21C:
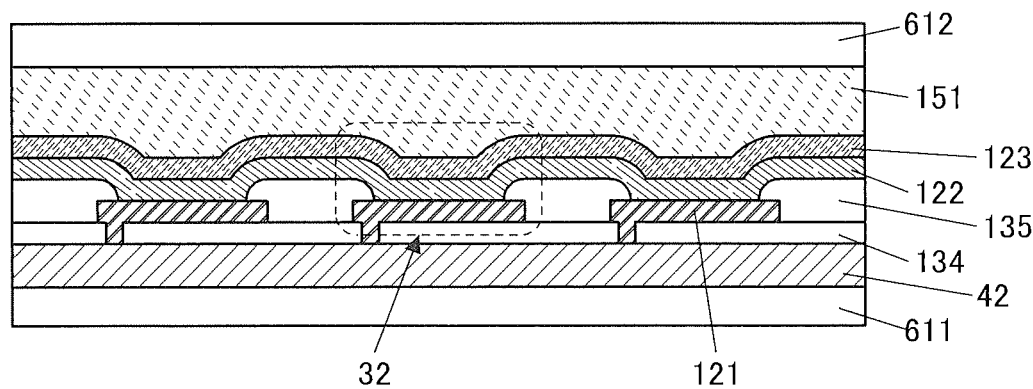

Display elements included in the display device 11 and the display device 61 can be only the display elements 32. In that case, the cross-sectional structure of each of the display regions is the structure illustrated in FIG. 21C.

The above is the description of a cross-sectional structure example of the display device 11.

[Modification Example of Display Mode]

Note that in the third mode, in which display is performed by driving both the first pixel 31p and the second pixel 32p, different images can be displayed at the same time. For example, a background image can be displayed by one of the first pixel 31p and the second pixel 32p, and a moving image can be displayed by the other of the first pixel 31p and the second pixel 32p. Thus, a more realistic image can be displayed.

At least part of this embodiment can be implemented in combination with any of the other embodiments described in this specification as appropriate.

Embodiment 4

In this embodiment, a basic structure of a display device of one embodiment of the present invention will be described.

Embodiments of the display region 11a described in Embodiment 1 and the display region 61a described in Embodiment 2 each have a structure where a first display panel and a second display panel are bonded to each other with an adhesive layer therebetween. In the first display panel, first pixels that include reflective liquid crystal elements are provided. In the second display panel, second pixels that include light-emitting elements are provided. The reflective liquid crystal elements can produce gray levels by controlling the amount of reflected light. The light-emitting elements can produce gray levels by controlling the amount of light emission.

The display device can perform display by using only reflected light, display by using only light emitted from the light-emitting elements, and display by using both reflected light and light emitted from the light-emitting elements, for example.

The first display panel is provided on the viewing side. The second display panel is provided on the side opposite to the viewing side. The first display panel includes a first resin layer in a position closest to the adhesive layer. The second display panel includes a second resin layer in a position closest to the adhesive layer.

It is preferable that a third resin layer be provided on the display surface side of the first display panel and a fourth resin layer be provided on the rear surface side (the side opposite to the display surface side) of the second display panel. Thus, the display device can be extremely lightweight and less likely to be broken.

The first to fourth resin layers (hereinafter also collectively referred to as a resin layer) have a feature of being extremely thin. Specifically, it is preferable that each of the resin layers have a thickness of 0.1 µm or more and 3 µm or less. Thus, even a structure where the two display panels are stacked can have a small thickness. Furthermore, light absorption due to the resin layer positioned in the path of light emitted from the light-emitting element in the second pixel can be reduced, so that light can be extracted with higher efficiency and the power consumption can be reduced.

The resin layer can be formed in the following manner, for example. A thermosetting resin material with a low viscosity is applied to a support substrate and cured by heat treatment to form the resin layer. Then, a structure is formed over the resin layer. Then, the resin layer and the support substrate are separated from each other, whereby one surface of the resin layer is exposed.

As a method of reducing adhesion between the support substrate and the resin layer to separate the support substrate and the resin layer from each other, laser light irradiation is given. For example, it is preferable to perform the irradiation by scanning using linear laser light. By the method, the process time of the case of using a large support substrate can be shortened. As the laser light, excimer laser light with a wavelength of 308 nm can be suitably used.

A thermosetting polyimide is a typical example of a material that can be used for the resin layer. It is particularly preferable to use a photosensitive polyimide. A photosensitive polyimide is a material that is suitably used for formation of a planarization film or the like of the display panel, and therefore, the formation apparatus and the material can be shared. Thus, there is no need to prepare another apparatus and another material to obtain the structure of one embodiment of the present invention.

Furthermore, the resin layer that is formed using a photosensitive resin material can be processed by light exposure and development treatment. For example, an opening can be formed and an unnecessary portion can be removed. Moreover, by optimizing a light exposure method or light exposure conditions, an uneven shape can be formed in a surface of the resin layer. For example, an exposure technique using a half-tone mask or a gray-tone mask or a multiple exposure technique may be used.

Note that a non-photosensitive resin material may be used. In that case, a method of forming an opening or an uneven shape using a resist mask or a hard mask that is formed over the resin layer can be used.

In this case, part of the resin layer that is positioned in the path of light emitted from the light-emitting element is preferably removed. That is, an opening overlapping with the light-emitting element is provided in the first resin layer and the second resin layer. Thus, a reduction in color reproducibility and light extraction efficiency that is caused by absorption of part of light emitted from the light-emitting element by the resin layer can be inhibited.

Alternatively, the resin layer may be provided with a concave portion so that a portion of the resin layer that is positioned in the path of light emitted from the light-emitting element is thinner than the other portion. That is, the resin layer may have a structure where two portions with different thicknesses are included and the portion with a smaller thickness overlaps with the light-emitting element. The resin layer that has the structure can also reduce absorption of light emitted from the light-emitting element.

In the case where the first display panel includes the third resin layer, an opening overlapping with the light-emitting element is preferably provided in a manner similar to that described above. Thus, color reproducibility and light extraction efficiency can be further increased.

In the case where the first display panel includes the third resin layer, part of the third resin layer that is positioned in the path of light of the reflective liquid crystal element is preferably removed. That is, an opening overlapping with the reflective liquid crystal element is provided in the third resin layer. This can increase the reflectivity of the reflective liquid crystal element.

In the case where the opening is formed in the resin layer, a light absorption layer is formed over the support substrate, the resin layer having the opening is formed over the light absorption layer, and a light-transmitting layer covering the opening is formed. The light absorption layer is a layer that emits a gas such as hydrogen or oxygen by absorbing light and being heated. By performing light irradiation from the support substrate side to make the light absorption layer emit a gas, adhesion at the interface between the light absorption layer and the support substrate or between the light absorption layer and the light-transmitting layer can be reduced to cause separation, or the light absorption layer itself can be broken to cause separation.

As another example, the following method can be used. That is, a thin part is formed in a portion where the opening of the resin layer is to be formed, and the support substrate and the resin layer are separated from each other by the above-described method. Then, plasma treatment or the like is performed on a separated surface of the resin layer to reduce the thickness of the resin layer, whereby the opening can be formed in the thin part of the resin layer.

Each of the first pixel and the second pixel preferably includes a transistor. Furthermore, an oxide semiconductor is preferably used as a semiconductor where a channel of the transistor is formed. An oxide semiconductor can achieve high on-state current and high reliability even when the highest temperature in the manufacturing process of the transistor is reduced (e.g., 400° C. or lower, preferably 350° C. or lower). Furthermore, in the case of using an oxide semiconductor, high heat resistance is not required for a material of the resin layer positioned on the surface side on which the transistor is formed; thus, the material of the resin layer can be selected from a wider range of alternatives. For example, the material can be the same as a resin material of the planarization film.

In the case of using low-temperature polysilicon (LTPS), for example, processes such as a laser crystallization process, a baking process before crystallization, and a baking process for activating impurities are required, and the highest temperature in the manufacturing process of the transistor is higher than that in the case of using an oxide semiconductor (e.g., higher than or equal to 500° C., higher than or equal to 550° C., or higher than or equal to 600° C.), though high field-effect mobility can be obtained. Therefore, high heat resistance is required for the resin layer positioned on the surface side on which the transistor is formed. In addition, the thickness of the resin layer needs to be comparatively large (e.g., larger than or equal to 10 µm, or larger than or equal to 20 µm) because the resin layer is also irradiated with laser light in the laser crystallization process.

In contrast, in the case of using an oxide semiconductor, a special material having high heat resistance is not required for the resin layer, and the resin layer need not be formed thick. Thus, the proportion of the cost of the resin layer in the cost of the whole display panel can be reduced.

An oxide semiconductor has a wide band gap (e.g., 2.5 eV or more, or 3.0 eV or more) and transmits light. Thus, even when an oxide semiconductor is irradiated with laser light in a step of separating the support substrate and the resin layer, the laser light is hardly absorbed, so that the electrical characteristics can be less affected. Therefore, the resin layer can be thin as described above.

In one embodiment of the present invention, a display device excellent in productivity can be obtained by using both a resin layer that is formed thin using a photosensitive resin layer with a low viscosity typified by a photosensitive polyimide and an oxide semiconductor with which a transistor having excellent electrical characteristics can be obtained even at a low temperature.

Next, a pixel structure will be described. The first pixels and the second pixels are arranged in a matrix to form the display portion. In addition, the display device preferably includes a first driver portion for driving the first pixels and a second driver portion for driving the second pixels. It is preferable that the first driver portion be provided in the first display panel and the second driver portion be provided in the second display panel.

The first pixels and the second pixels are preferably arranged in a display region with the same pitch. Furthermore, the first pixels and the second pixels are preferably mixed in the display region of the display device. Accordingly, as described later, an image displayed by a plurality of first pixels, an image displayed by a plurality of second pixels, and an image displayed by both the plurality of first pixels and the plurality of second pixels can be displayed in the same display region.

The first pixel is preferably formed of one pixel that emits white (W) light, for example. The second pixel preferably includes subpixels that emit light of three colors of red (R), green (G), and blue (B), for example. In addition, a subpixel that emits white (W) light or yellow (Y) light may be included. By arranging such first pixels and second pixels with the same pitch, the area of the first pixels can be increased and the aperture ratio of the first pixels can be increased.

Note that the first pixel may include subpixels that emit light of three colors of red (R), green (G), and blue (B), and may further include a subpixel that emits white (W) light or yellow (Y) light.

Next, transistors that can be used in the first display panel and the second display panel are described. A transistor provided in the first pixel of the first display panel and a transistor provided in the second pixel of the second display panel may have either the same structure or different structures.

As a structure of the transistor, a bottom-gate structure is given, for example. A transistor having a bottom-gate structure includes a gate electrode below a semiconductor layer (on the formation surface side). A source electrode and a drain electrode are provided in contact with a top surface and a side end portion of the semiconductor layer, for example.

As another structure of the transistor, a top-gate structure is given, for example. A transistor having a top-gate structure includes a gate electrode above a semiconductor layer (on the side opposite to the formation surface side). A first source electrode and a first drain electrode are provided over an insulating layer covering part of a top surface and a side end portion of the semiconductor layer and are electrically connected to the semiconductor layer through openings provided in the insulating layer, for example.

The transistor preferably includes a first gate electrode and a second gate electrode that face each other with the semiconductor layer provided therebetween.

A more specific example of the display device of one embodiment of the present invention will be described below with reference to drawings.

[Structure Example 1]

Figure 22A:
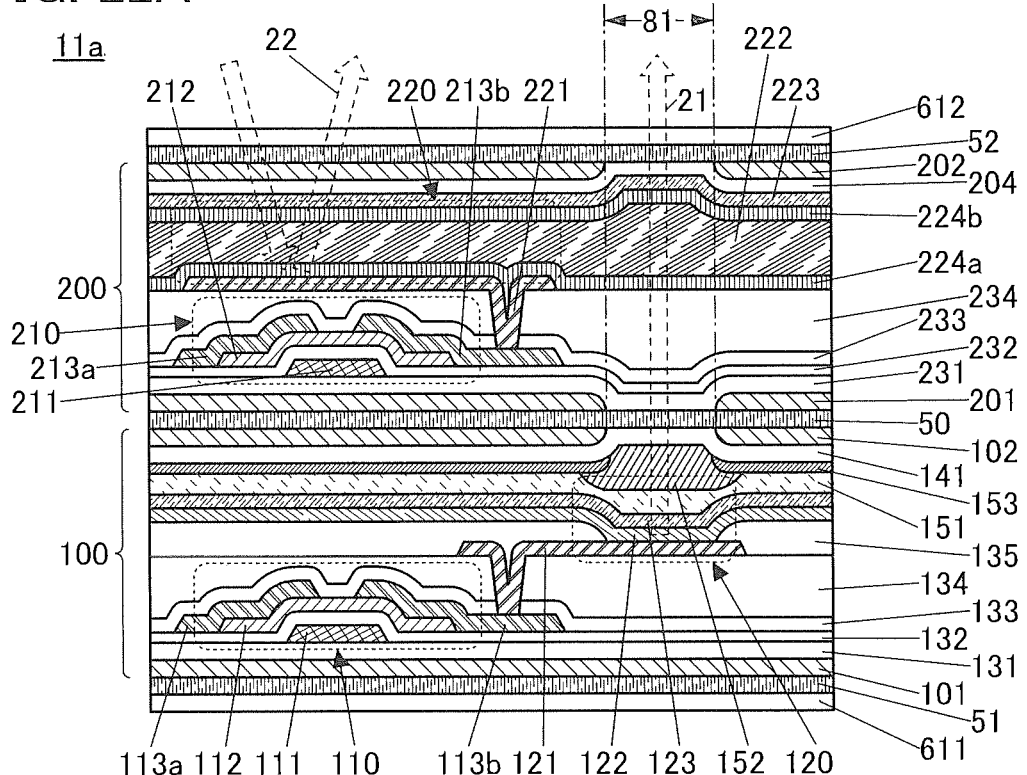
FIGS. 22A and 22B illustrate the structures of display devices.

FIG. 22A is a schematic cross-sectional view of the display region 11a in the display device 11. In the display device 11, a display panel 100 and a display panel 200 are bonded to each other using an adhesive layer 50. The display device 11 includes a substrate 611 on the rear side (the side opposite to the viewing side) and a substrate 612 on the front side (the viewing side). Note that the display region 61a in the display device 61 can have the same structure.

The display panel 100 includes a transistor 110 and a light-emitting element 120 between a resin layer 101 and a resin layer 102. The display panel 200 includes a transistor 210 and a liquid crystal element 220 between a resin layer 201 and a resin layer 202. The resin layer 101 is bonded to the substrate 611 with an adhesive layer 51 positioned therebetween. The resin layer 202 is bonded to the substrate 612 with an adhesive layer 52 positioned therebetween.

The resin layer 102, the resin layer 201, and the resin layer 202 are each provided with an opening. A region 81 shown in FIG. 22A is a region overlapping with the light-emitting element 120 and overlapping with the opening of the resin layer 102, the opening of the resin layer 201, and the opening of the resin layer 202.

[Display Panel 100]

The resin layer 101 is provided with the transistor 110, the light-emitting element 120, an insulating layer 131, an insulating layer 132, an insulating layer 133, the insulating layer 134, the insulating layer 135, and the like. The resin layer 102 is provided with a light-blocking layer 153, a coloring layer 152, and the like. The resin layer 101 and the resin layer 102 are bonded to each other using the adhesive layer 151.

The transistor 110 is provided over the insulating layer 131 and includes a conductive layer 111 serving as a gate electrode, part of the insulating layer 132 serving as a gate insulating layer, a semiconductor layer 112, a conductive layer 113a serving as one of a source electrode and a drain electrode, and a conductive layer 113b serving as the other of the source electrode and the drain electrode.

The semiconductor layer 112 preferably includes an oxide semiconductor.

The insulating layer 133 and the insulating layer 134 cover the transistor 110. The insulating layer 134 serves as a planarization layer.

The light-emitting element 120 includes the conductive layer 121, the EL layer 122, and the conductive layer 123 that are stacked. The conductive layer 121 has a function of reflecting visible light, and the conductive layer 123 has a function of transmitting visible light. Therefore, the light-emitting element 120 is a light-emitting element having a top-emission structure which emits light to the side opposite to the formation surface side.

The conductive layer 121 is electrically connected to the conductive layer 113b through an opening provided in the insulating layer 134 and the insulating layer 133. The insulating layer 135 covers an end portion of the conductive layer 121 and is provided with an opening to expose a top surface of the conductive layer 121. The EL layer 122 and the conductive layer 123 are provided in this order to cover the insulating layer 135 and the exposed portion of the conductive layer 121.

An insulating layer 141 is provided on the resin layer 101 side of the resin layer 102. The light-blocking layer 153 and the coloring layer 152 are provided on the resin layer 101 side of the insulating layer 141. The coloring layer 152 is provided in a region overlapping with the light-emitting element 120. The light-blocking layer 153 includes an opening in a portion overlapping with the light-emitting element 120.

The insulating layer 141 covers the opening of the resin layer 102. A portion of the insulating layer 141 that overlaps with the opening of the resin layer 102 is in contact with the adhesive layer 50.

[Display Panel 200]

The resin layer 201 is provided with the transistor 210, the conductive layer 221, an alignment film 224a, an insulating layer 231, an insulating layer 232, an insulating layer 233, an insulating layer 234, and the like. The resin layer 202 is provided with an insulating layer 204, a conductive layer 223, an alignment film 224b, and the like. Liquid crystal 222 is sandwiched between the alignment film 224a and the alignment film 224b. The resin layer 201 and the resin layer 202 are bonded to each other using an adhesive layer in a region not shown.

The transistor 210 is provided over the insulating layer 231 and includes a conductive layer 211 serving as a gate electrode, part of the insulating layer 232 serving as a gate insulating layer, a semiconductor layer 212, a conductive layer 213a serving as one of a source electrode and a drain electrode, and a conductive layer 213b serving as the other of the source electrode and the drain electrode.

The semiconductor layer 212 preferably includes an oxide semiconductor.

The insulating layer 233 and the insulating layer 234 cover the transistor 210. The insulating layer 234 serves as a planarization layer.

The liquid crystal element 220 includes the conductive layer 221, the conductive layer 223, and the liquid crystal 222 positioned therebetween. The conductive layer 221 has a function of reflecting visible light, and the conductive layer 223 has a function of transmitting visible light. Therefore, the liquid crystal element 220 is a reflective liquid crystal element.

The conductive layer 221 is electrically connected to the conductive layer 213b through an opening provided in the insulating layer 234 and the insulating layer 233. The alignment film 224a covers surfaces of the conductive layer 221 and the insulating layer 234.

The conductive layer 223 and the alignment film 224b are stacked on the resin layer 201 side of the resin layer 202. Note that the insulating layer 204 is provided between the resin layer 202 and the conductive layer 223. In addition, a coloring layer for coloring light reflected by the liquid crystal element 220 may be provided.

The insulating layer 231 covers the opening of the resin layer 201. A portion of the insulating layer 231 that overlaps with the opening of the resin layer 202 is in contact with the adhesive layer 50. The insulating layer 204 covers the opening of the resin layer 202. A portion of the insulating layer 204 that overlaps with the opening of the resin layer 202 is in contact with the adhesive layer 52.

[Display Device 11]

The display device 11 includes a portion where the light-emitting element 120 does not overlap with the reflective liquid crystal element 220 when the display region 11a is seen from above. Thus, the light 21 that is colored by the coloring layer 152 is emitted from the light-emitting element 120 to the viewing side as shown in FIG. 22A. Furthermore, the reflected light 22 that is external light reflected by the conductive layer 221 is emitted through the liquid crystal 222 of the liquid crystal element 220.

The light 21 emitted from the light-emitting element 120 is emitted to the viewing side through the opening of the resin layer 102, the opening of the resin layer 201, and the opening of the resin layer 202. Since the resin layer 102, the resin layer 201, and the resin layer 202 are not provided in the path of the light 21, even in the case where the resin layer 102, the resin layer 201, and the resin layer 202 absorb part of visible light, high light extraction efficiency and high color reproducibility can be obtained.

Note that the substrate 612 serves as a polarizing plate or a circular polarizing plate. A polarizing plate or a circular polarizing plate may be located outward from the substrate 612.

In the above-described structure of the display panel 200, a coloring layer is not included and color display is not performed, but a coloring layer may be provided on the resin layer 202 side to perform color display.

Figure 22B:
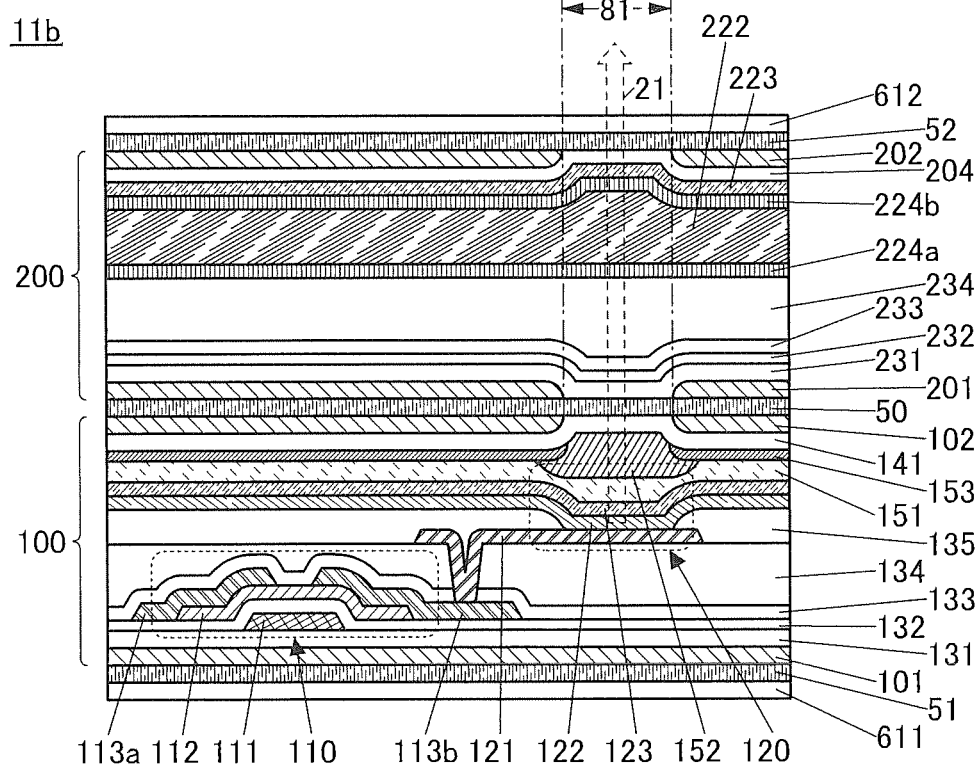

FIG. 22B illustrates the structure of the display region 11*b* described in Embodiment 1. In a region of the display panel 200 in the display region 11*b*, neither the transistor 210 nor a reflective liquid crystal element is provided; thus, display is performed by the operation of the display panel 100. Although the structure is illustrated in which the alignment films 224*a* and 224*b* and the liquid crystal 222 are provided, part or all of them are not necessarily provided and a resin layer or the like that transmits light emitted from the light-emitting element 120 may be provided. Note that the display region 61*b* described in Embodiment 2 can have the same structure as the display region 11*b*.

The above is the description of the structure example.
[Modification Example of Structure Example]

A structure example that is partly different from the structure example shown in FIG. 22A will be described below.

In FIG. 22A, the opening is provided in a portion of the resin layer that is positioned in the path of light emitted from the light-emitting element 120, but an opening may be provided also in a portion of the resin layer that is positioned in the path of light of the reflective liquid crystal element 220.

Figure 23:
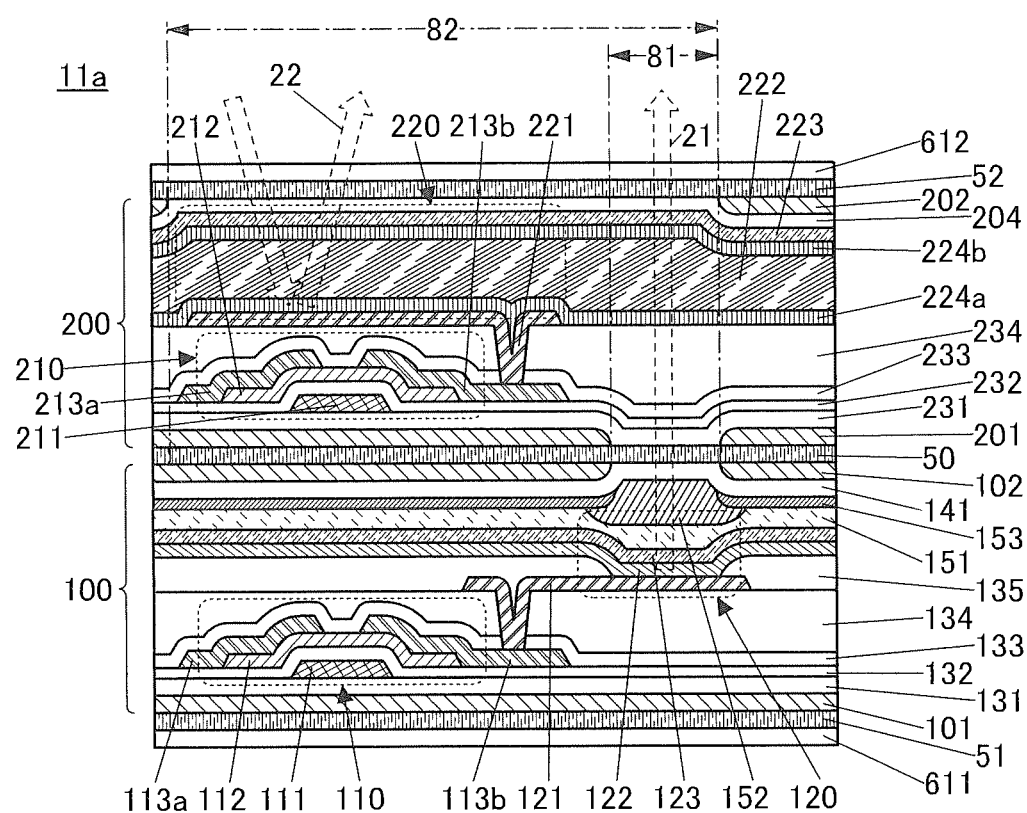
FIG. 23 illustrates the structure of a display device.

FIG. 23 shows an example where a region 82 is included in addition to the region 81. The region 82 overlaps with the opening of the resin layer 202 and the liquid crystal element 220.

In the example shown in FIG. 23, the resin layer 202 is provided with one opening in which an opening portion overlapping with the light-emitting element 120 and an opening portion overlapping with the liquid crystal element 220 are included. Alternatively, the opening overlapping with the light-emitting element 120 and the opening overlapping with the liquid crystal element 220 may be separately provided.
[Transistor]

The display device 11 exemplified in FIG. 22A shows an example of using bottom-gate transistors as the transistor 110 and the transistor 210.

In the transistor 110, the conductive layer 111 serving as a gate electrode is in a position closer to the formation surface (the resin layer 101 side) than the semiconductor layer 112. The insulating layer 132 covers the conductive layer 111. The semiconductor layer 112 covers the conductive layer 111. A region of the semiconductor layer 112 that overlaps with the conductive layer 111 corresponds to a channel formation region. The conductive layer 113*a* and the conductive layer 113*b* are provided in contact with the top surface and side end portions of the semiconductor layer 112.

Note that in the transistor 110 shown as an example, the width of the semiconductor layer 112 is wider than that of the conductive layer 111. In such a structure, the semiconductor layer 112 is positioned between the conductive layer 111 and each of the conductive layer 113*a* and the conductive layer 113*b*. Thus, the parasitic capacitance between the conductive layer 111 and each of the conductive layer 113*a* and the conductive layer 113*b* can be reduced.

The transistor 110 is a channel-etched transistor and can be suitably used for a high-resolution display device because the occupation area of the transistor can be reduced comparatively easily.

The transistor 210 and the transistor 110 have common characteristics.

A structure example of a transistor that can be used for the transistor 110 and the transistor 210 will be described.

Figure 24A:
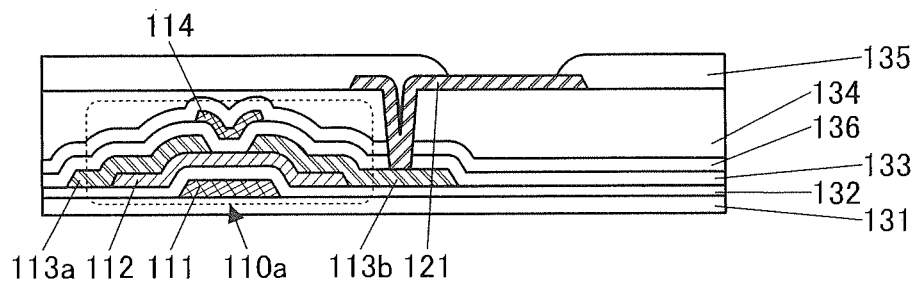
FIGS. 24A to 24C illustrate the structures of display devices.

A transistor 110*a* shown in FIG. 24A is different from the transistor 110 in that the transistor 110*a* includes a conductive layer 114 and an insulating layer 136. The conductive layer 114 is provided over the insulating layer 133 and includes a region overlapping with the semiconductor layer 112. The insulating layer 136 covers the conductive layer 114 and the insulating layer 133.

The conductive layer 114 is positioned to face the conductive layer 111 with the semiconductor layer 112 therebetween. In the case where the conductive layer 111 is used as a first gate electrode, the conductive layer 114 can serve as a second gate electrode. By supplying the same potential to the conductive layer 111 and the conductive layer 114, the on-state current of the transistor 110*a* can be increased. By supplying a potential for controlling the threshold voltage to one of the conductive layer 111 and the conductive layer 114 and a potential for driving to the other, the threshold voltage of the transistor 110*a* can be controlled.

A conductive material including an oxide is preferably used as the conductive layer 114. In that case, a conductive film to be the conductive layer 114 is formed in an atmosphere containing oxygen, whereby oxygen can be supplied to the insulating layer 133. The proportion of an oxygen gas in a film formation gas in a sputtering method is preferably higher than or equal to 90% and lower than or equal to 100%. Oxygen supplied to the insulating layer 133 is supplied to the semiconductor layer 112 by heat treatment to be performed later, so that oxygen vacancies in the semiconductor layer 112 can be reduced.

It is particularly preferable to use, as the conductive layer 114, an oxide semiconductor whose resistance is reduced. In this case, the insulating layer 136 is preferably formed using an insulating film that releases hydrogen, e.g., a silicon nitride film. Hydrogen is supplied to the conductive layer 114 during the formation of the insulating layer 136 or by heat treatment to be performed after that, whereby the electrical resistance of the conductive layer 114 can be reduced effectively.

Figure 24B:
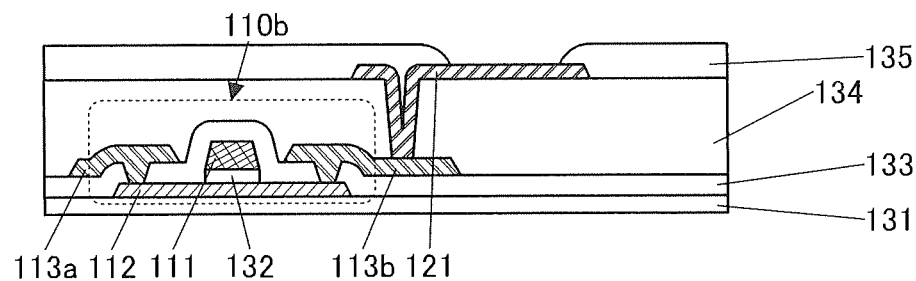

A transistor 110*b* shown in FIG. 24B is a top-gate transistor.

In the transistor 110*b*, the conductive layer 111 serving as a gate electrode is provided over the semiconductor layer 112 (provided on the side opposite to the formation surface side). The semiconductor layer 112 is formed over the insulating layer 131. The insulating layer 132 and the conductive layer 111 are stacked over the semiconductor layer 112. The insulating layer 133 covers the top surface and the side end portions of the semiconductor layer 112, side surfaces of the insulating layer 132, and the conductive layer 111. The conductive layer 113a and the conductive layer 113b are provided over the insulating layer 133. The conductive layer 113a and the conductive layer 113b are electrically connected to the top surface of the semiconductor layer 112 through openings provided in the insulating layer 133.

Note that although the insulating layer 132 is not present in a portion that does not overlap with the conductive layer 111 in the example, the insulating layer 132 may be provided in a portion covering the top surface and the side end portion of the semiconductor layer 112.

In the transistor 110b, the physical distance between the conductive layer 111 and the conductive layer 113a or the conductive layer 113b can be easily increased, so that the parasitic capacitance therebetween can be reduced.

Figure 24C:
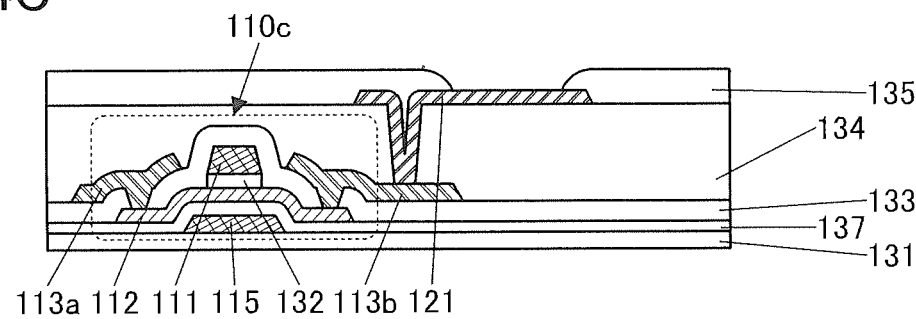

A transistor 110c shown in FIG. 24C is different from the transistor 110b in that the transistor 110c includes a conductive layer 115 and an insulating layer 137. The conductive layer 115 is provided over the insulating layer 131 and includes a region overlapping with the semiconductor layer 112. The insulating layer 137 covers the conductive layer 115 and the insulating layer 131.

The conductive layer 115 serves as a second gate electrode like the conductive layer 114. Thus, the on-state current can be increased and the threshold voltage can be controlled, for example.

In the display device 11, the transistor included in the display panel 100 and the transistor included in the display panel 200 may be different from each other. For example, the transistor 110a or the transistor 110c can be used as the transistor that is electrically connected to the light-emitting element 120 because a comparatively large amount of current needs to be fed to the transistor, and the transistor 110 can be used as the other transistor to reduce the occupation area of the transistor.

Figure 25:
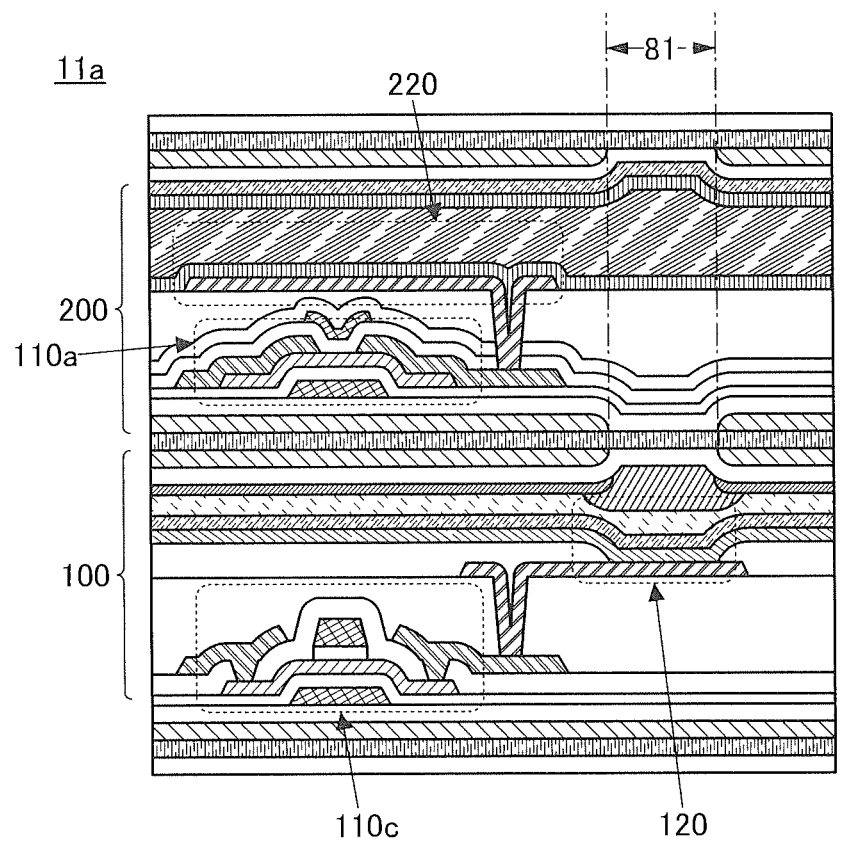
FIG. 25 illustrates the structure of a display device.

FIG. 25 shows an example of the case where the transistor 110a is used instead of the transistor 210 in FIG. 22A and the transistor 110c is used instead of the transistor 110 in FIG. 22A.

The above is the description of the transistor.

At least part of this embodiment can be implemented in combination with any of the other embodiments described in this specification as appropriate.

Embodiment 5

In this embodiment, a specific example of a display device of one embodiment of the present invention will be described. A display device 400 described below includes both a reflective liquid crystal element and a light-emitting element that can be used in the display region 11a described in Embodiment 1 and the display region 61a described in Embodiment 2 and can perform display in a transmission mode and in a reflection mode.

[Structure Example]

FIG. 26A is a block diagram illustrating an example of the structure of a display device 400. The display device 400 includes a plurality of pixels 410 that are arranged in a matrix in a display portion 362a. The display device 400 also includes a circuit GD and a circuit SD. In addition, the display device 400 includes a plurality of wirings G1, a plurality of wirings G2, a plurality of wirings ANO, and a plurality of wirings CSCOM, which are electrically connected to the circuit GD and the plurality of pixels 410 arranged in a direction R. Moreover, the display device 400 includes the plurality of pixels 410 arranged in a direction C, and a plurality of wirings S1 and a plurality of wirings S2, which are electrically connected to the circuit SD.

Although the configuration including one circuit GD and one circuit SD is illustrated here for simplicity, the circuit GD and the circuit SD for driving the liquid crystal element and those for driving the light-emitting element may be provided separately.

The pixel 410 includes a reflective liquid crystal element and a light-emitting element. In the pixel 410, the liquid crystal element and the light-emitting element partly overlap with each other.

FIG. 26B1 illustrates a structure example of an electrode 311b included in the pixel 410. The electrode 311b serves as a reflective electrode of the liquid crystal element in the pixel 410. The electrode 311b includes an opening 451.

In FIG. 26B1, a light-emitting element 360 in a region overlapping with the electrode 311b is shown by a dashed line. The light-emitting element 360 overlaps with the opening 451 included in the electrode 311b. Thus, light from the light-emitting element 360 is emitted to the display surface side through the opening 451.

In FIG. 26B1, the pixels 410 adjacent in the direction R correspond to different emission colors. As illustrated in FIG. 26B1, the openings 451 are preferably provided in different positions in the electrodes 311b so as not to be aligned in the two pixels adjacent to each other in the direction R. This allows the two light-emitting elements 360 to be apart from each other, thereby preventing light emitted from the light-emitting element 360 from entering a coloring layer in the adjacent pixel 410 (such a phenomenon is also referred to as "crosstalk"). Furthermore, since the two adjacent light-emitting elements 360 can be arranged apart from each other, a high-resolution display device can be obtained even when EL layers of the light-emitting elements 360 are separately formed with a shadow mask or the like.

Alternatively, arrangement illustrated in FIG. 26B2 may be employed.

If the ratio of the total area of the opening 451 to the total area except for the opening is too large, display performed using the liquid crystal element is dark. If the ratio of the total area of the opening 451 to the total area except for the opening is too small, display performed using the light-emitting element 360 is dark.

If the area of the opening 451 in the electrode 311b serving as a reflective electrode is too small, light emitted from the light-emitting element 360 is not efficiently extracted.

The opening 451 may have a polygonal shape, a quadrangular shape, an elliptical shape, a circular shape, a cross-like shape, a stripe shape, a slit-like shape, or a checkered pattern, for example. The opening 451 may be close to the adjacent pixel. Preferably, the opening 451 is provided close to another pixel that emits light of the same color, in which case crosstalk can be suppressed.

[Circuit Configuration Example]

Figure 27:
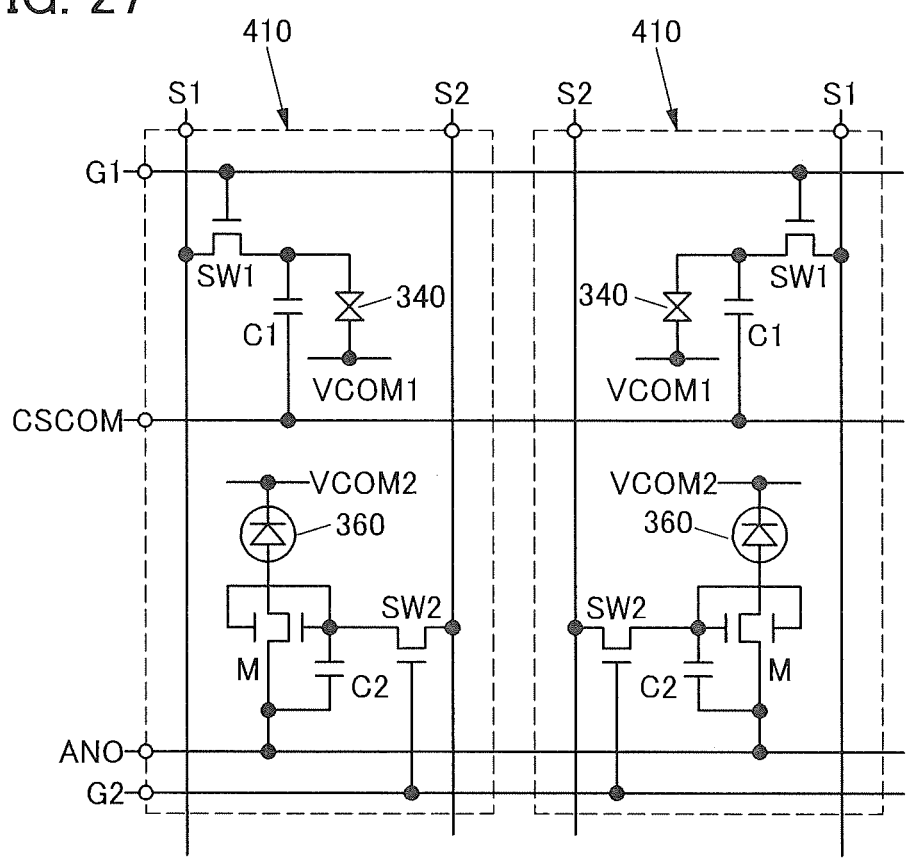
FIG. 27 illustrates a circuit of a display device.

FIG. 27 is a circuit diagram illustrating a configuration example of the pixel 410. FIG. 27 shows two adjacent pixels 410.

The pixel 410 includes a switch SW1, a capacitor C1, a liquid crystal element 340, a switch SW2, a transistor M, a capacitor C2, the light-emitting element 360, and the like. The pixel 410 is electrically connected to the wiring G1, the wiring G2, the wiring ANO, the wiring CSCOM, the wiring S1, and the wiring S2. FIG. 27 also illustrates a wiring VCOM1 electrically connected to the liquid crystal element 340 and a wiring VCOM2 electrically connected to the light-emitting element 360.

FIG. 27 illustrates an example in which a transistor is used as each of the switches SW1 and SW2.

A gate of the switch SW1 is connected to the wiring G1. One of a source and a drain of the switch SW1 is connected to the wiring S1, and the other of the source and the drain is connected to one electrode of the capacitor C1 and one electrode of the liquid crystal element 340. The other electrode of the capacitor C1 is connected to the wiring CSCOM. The other electrode of the liquid crystal element 340 is connected to the wiring VCOM1.

A gate of the switch SW2 is connected to the wiring G2. One of a source and a drain of the switch SW2 is connected to the wiring S2, and the other of the source and the drain is connected to one electrode of the capacitor C2 and a gate of the transistor M. The other electrode of the capacitor C2 is connected to one of a source and a drain of the transistor M and the wiring ANO. The other of the source and the drain of the transistor M is connected to one electrode of the light-emitting element 360. The other electrode of the light-emitting element 360 is connected to the wiring VCOM2.

FIG. 27 illustrates an example in which the transistor M includes two gates between which a semiconductor is provided and which are connected to each other. This structure can increase the amount of current flowing through the transistor M.

The wiring G1 can be supplied with a signal for changing the on/off state of the switch SW1. A predetermined potential can be supplied to the wiring VCOM1. The wiring S1 can be supplied with a signal for changing the orientation of a liquid crystal of the liquid crystal element 340. A predetermined potential can be supplied to the wiring CSCOM.

The wiring G2 can be supplied with a signal for changing the on/off state of the switch SW2. The wiring VCOM2 and the wiring ANO can be supplied with potentials having a difference large enough to make the light-emitting element 360 emit light. The wiring S2 can be supplied with a signal for changing the conduction state of the transistor M.

In the pixel 410 of FIG. 27, for example, an image can be displayed in the reflective mode by driving the pixel with the signals supplied to the wiring G1 and the wiring S1 and utilizing the optical modulation of the liquid crystal element 340. In the case where an image is displayed in the transmissive mode, the pixel is driven with the signals supplied to the wiring G2 and the wiring S2 and the light-emitting element 360 emits light. In the case where both modes are performed at the same time, the pixel can be driven with the signals supplied to the wiring G1, the wiring G2, the wiring S1, and the wiring S2.

Figure 28A:
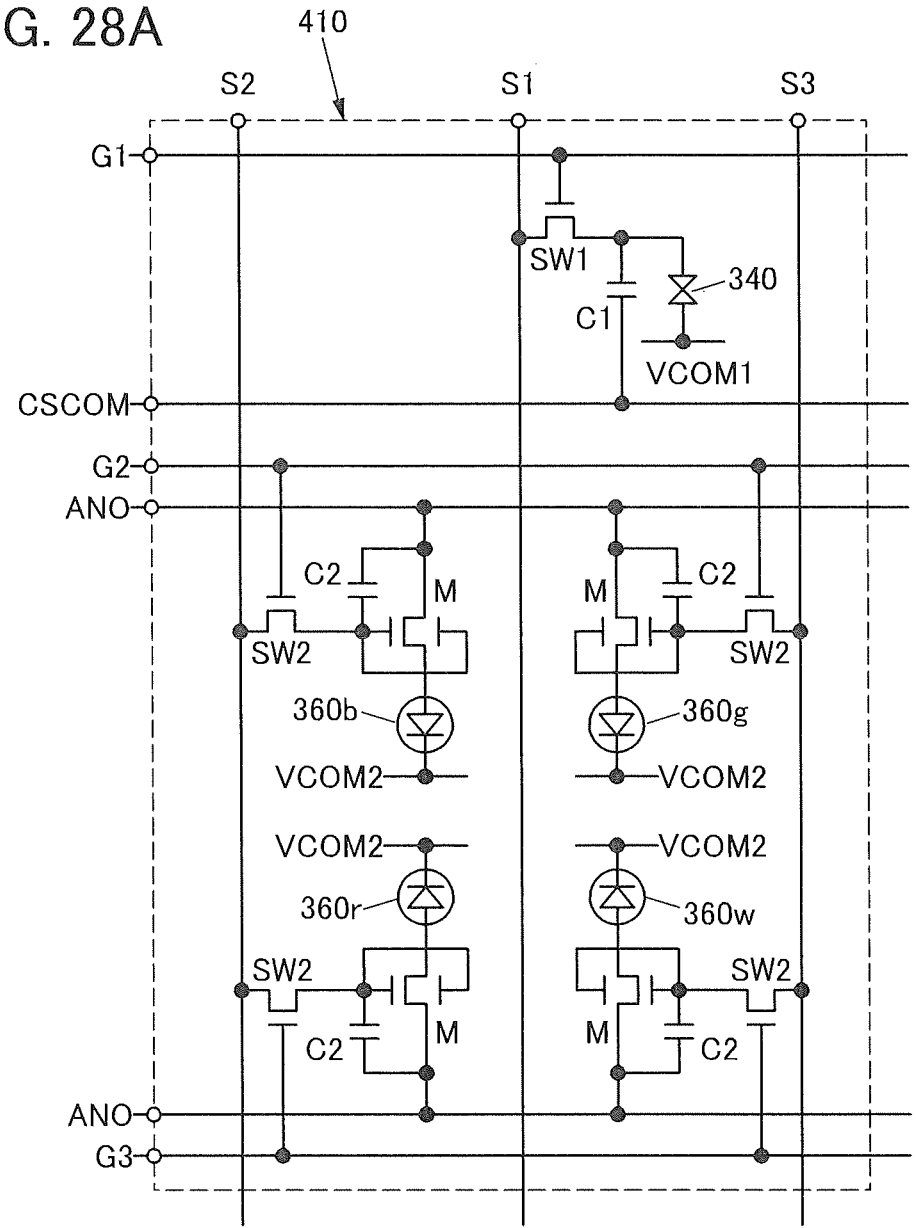
FIG. 28A illustrates a circuit of a display device.

Although FIG. 27 illustrates the example in which one pixel 410 includes one liquid crystal element 340 and one light-emitting element 360, one embodiment of the present invention is not limited to this example. FIG. 28A illustrates an example in which one pixel 410 includes one liquid crystal element 340 and four light-emitting elements 360 (light-emitting elements 360r, 360g, 360b, and 360w). The pixel 410 illustrated in FIG. 28A differs from that in FIG. 27 in being capable of performing full-color display by one pixel.

In addition to the example in FIG. 27, the pixel 410 in FIG. 28A is connected to a wiring G3 and a wiring S3.

In the example illustrated in FIG. 28A, for example, light-emitting elements which exhibit red (R), green (G), blue (B), and white (W) can be used as the four light-emitting elements 360. A reflective liquid crystal element which exhibits white can be used as the liquid crystal element 340. This enables white display with high reflectance in the reflective mode. This also enables display with excellent color-rendering properties and low power consumption in the transmissive mode.

Figure 28B:
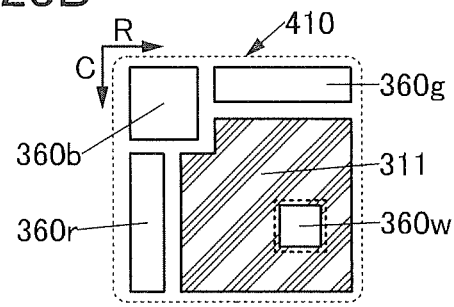
FIG. 28B is a top view of a pixel.

FIG. 28B illustrates a configuration example of the pixel 410. The pixel 410 includes the light-emitting element 360w which overlaps with the opening in the electrode 311 and the light-emitting elements 360r, 360g, and 360b located near the electrode 311. It is preferred that the light-emitting elements 360r, 360g, and 360b have substantially the same light-emitting area.

[Structure Example of Display Device]

Figure 29:
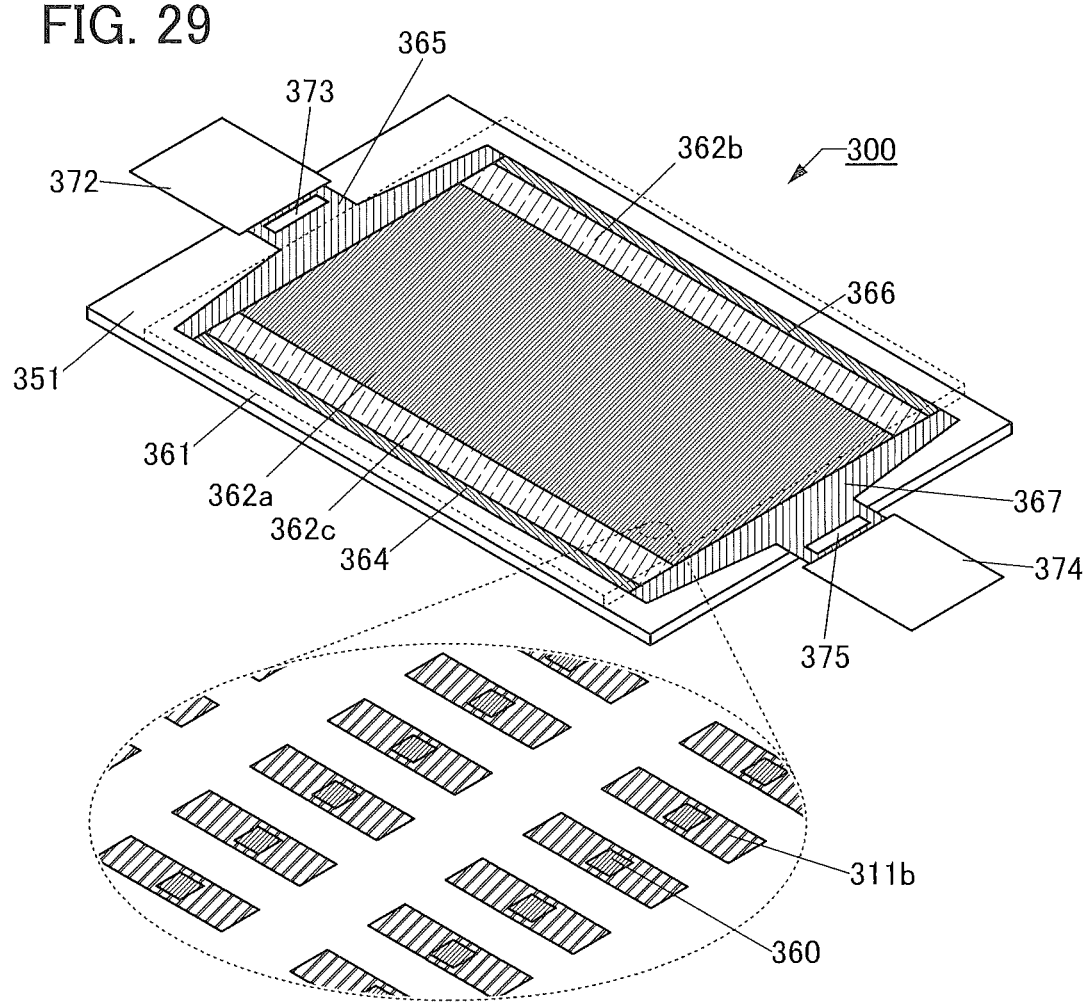
FIG. 29 illustrates the structure of a display device.

FIG. 29 is a schematic perspective view illustrating a display device 300 of one embodiment of the present invention. In the display device 300, a substrate 351 and a substrate 361 are attached to each other. In FIG. 29, the substrate 361 is shown by a dashed line.

The display device 300 includes a display portion 362a, a display portion 362b, a display portion 362c, a circuit portion 364, a wiring 365, a circuit portion 366, a wiring 367, and the like. The substrate 351 is provided with the circuit portion 364, the wiring 365, the circuit portion 366, the wiring 367, the electrode 311b functioning as a pixel electrode, and the like. In FIG. 29, an IC 373, an FPC 372, an IC 375, and an FPC 374 are mounted on the substrate 351. Thus, the structure illustrated in FIG. 29 can be referred to as a display module including the display device 300, the IC 373, the FPC 372, the IC 375, and the FPC 374.

The display device 300 corresponds to the display device 11 described in Embodiment 1, and the display portions 362a, 362b, and 362c correspond to the display regions 11a, 11b, and 11c, respectively.

For the circuit portion 364 and the circuit portion 366, a circuit functioning as a scan line driver circuit can be used, for example.

The wirings 365 and 367 each have a function of supplying signals and electric power to the display portions and the circuit portion 364. The signals and electric power are input to the wiring 365 from the outside through the FPC 372 or from the IC 373.

FIG. 29 shows an example in which the ICs 373 and 375 are provided on the substrate 351 by a chip on glass (COG) method or the like. As the ICs 373 and 375, an IC functioning as a scan line driver circuit or the like can be used. Note that it is possible that the ICs 373 and 375 are not provided, for example, when the display device 300 includes circuits functioning as a scan line driver circuit and a signal line driver circuit and when the circuits functioning as a scan line driver circuit and a signal line driver circuit are provided outside and signals for driving the display device 300 are input through the FPCs 372 and 374. Alternatively, the ICs 373 and 375 may be mounted on the substrate 351 by a chip on film (COF) method or the like.

FIG. 29 is an enlarged view of part of the display portion 362a. The display portion 362a corresponds to the display regions 11a and 11d described in Embodiment 1. Electrodes 311b included in a plurality of display elements are arranged in a matrix in the display portion 362a. The electrode 311b has a function of reflecting visible light and serves as a reflective electrode of the liquid crystal element 340 described later.

As illustrated in FIG. 29, the electrode 311b has an opening. The light-emitting element 360 is positioned closer to the substrate 351 than the electrode 311b is. Light is emitted from the light-emitting element 360 to the substrate 361 side through the opening in the electrode 311b.

Note that the display regions 11b and 11c described in Embodiment 1 correspond to the display portions 362b and 362c. The display portions 362b and 362c do not include the liquid crystal element 340; thus, a region corresponding to the electrode 311b is formed with a light-blocking layer or the like.

[Cross-Sectional Structure Examples]

Figure 30:
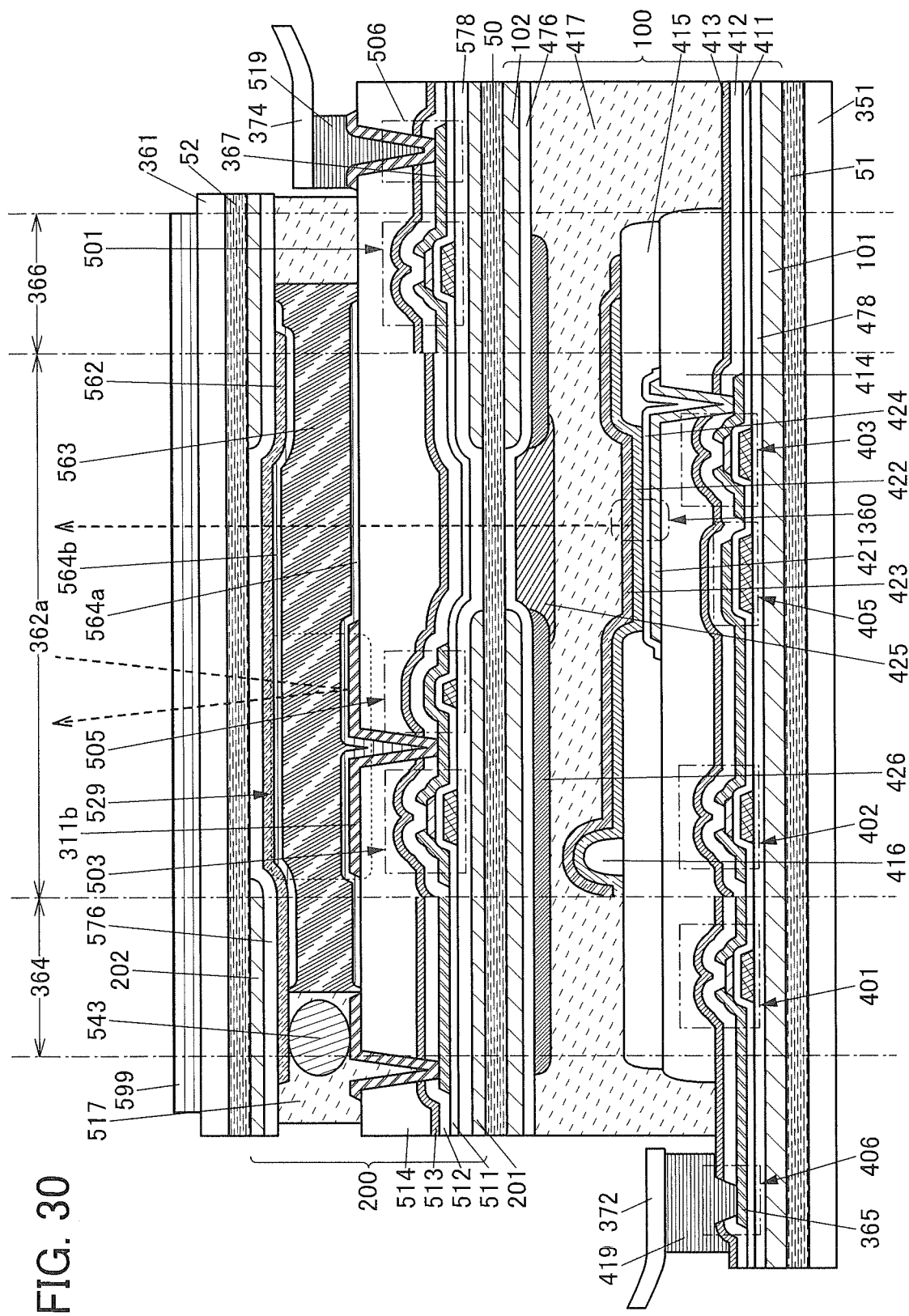
FIG. 30 illustrates the structure of a display device.

FIG. 30 illustrates an example of cross sections of part of a region including the FPC 372, part of a region including the circuit portion 364, part of a region including the display portion 362a, part of a region including the circuit portion 366, and part of a region including the FPC 374 of the display device 300 illustrated in FIG. 29.

The display device illustrated in FIG. 30 includes a structure in which the display panels 100 and 200 are stacked. The display panel 100 includes the resin layers 101 and 102. The display panel 200 includes the resin layers 201 and 202. The resin layers 102 and 201 are bonded to each other with the adhesive layer 50. The resin layer 101 is bonded to the substrate 351 with the adhesive layer 51. The resin layer 202 is bonded to the substrate 361 with the adhesive layer 52.

[Display Panel 100]

The display panel 100 includes the resin layer 101, an insulating layer 478, a plurality of transistors, a capacitor 405, a wiring 407, an insulating layer 411, an insulating layer 412, an insulating layer 413, an insulating layer 414, an insulating layer 415, the light-emitting element 360, a spacer 416, an adhesive layer 417, a coloring layer 425, a light-blocking layer 426, an insulating layer 476, and the resin layer 102.

The resin layer 102 has an opening in a region overlapping with the light-emitting element 360.

The circuit portion 364 includes a transistor 401. The display portion 362a includes a transistor 402 and a transistor 403.

Each of the transistors includes a gate, the insulating layer 411, a semiconductor layer, a source, and a drain. The gate and the semiconductor layer overlap with each other with the insulating layer 411 provided therebetween. Part of the insulating layer 411 functions as a gate insulating layer, and another part of the insulating layer 411 functions as a dielectric of the capacitor 405. A conductive layer that functions as the source or the drain of the transistor 402 also functions as one electrode of the capacitor 405.

The transistors illustrated in FIG. 30 have bottom-gate structures. The transistor structures may be different between the circuit portion 364 and the display portion 362a. The circuit portion 364 and the display portion 362a may each include a plurality of kinds of transistors.

The capacitor 405 includes a pair of electrodes and the dielectric therebetween. The capacitor 405 includes a conductive layer that is formed using the same material and the same process as the gates of the transistors, and a conductive layer that is formed using the same material and the same process as the sources and the drains of the transistors.

The insulating layer 412, the insulating layer 413, and the insulating layer 414 are each provided to cover the transistors and the like. There is no particular limitation on the number of the insulating layers covering the transistors and the like. The insulating layer 414 functions as a planarization layer. It is preferred that at least one of the insulating layer 412, the insulating layer 413, and the insulating layer 414 be formed using a material inhibiting diffusion of impurities such as water and hydrogen. Diffusion of impurities from the outside into the transistors can be effectively inhibited, leading to improved reliability of the display device.

In the case of using an organic material for the insulating layer 414, impurities such as moisture might enter the light-emitting element 360 or the like from the outside of the display device through the insulating layer 414 exposed at an end portion of the display device. Deterioration of the light-emitting element 360 due to the entry of impurities can lead to deterioration of the display device. For this reason, the insulating layer 414 is preferably not positioned at the end portion of the display device, as illustrated in FIG. 30. Since an insulating layer formed using an organic material is not positioned at the end portion of the display device in the structure of FIG. 30, entry of impurities into the light-emitting element 360 can be inhibited.

The light-emitting element 360 includes an electrode 421, an EL layer 422, and an electrode 423. The light-emitting element 360 may include an optical adjustment layer 424. The light-emitting element 360 has a top-emission structure with which light is emitted to the coloring layer 425 side.

The transistors, the capacitor, the wiring, and the like are positioned so as to overlap with a light-emitting region of the light-emitting element 360; accordingly, the aperture ratio of the display portion 362a can be increased.

One of the electrode 421 and the electrode 423 functions as an anode and the other functions as a cathode. When a voltage higher than the threshold voltage of the light-emitting element 360 is applied between the electrode 421 and the electrode 423, holes are injected to the EL layer 422 from the anode side and electrons are injected to the EL layer 422 from the cathode side. The injected electrons and holes are recombined in the EL layer 422 and a light-emitting substance contained in the EL layer 422 emits light.

The electrode 421 is electrically connected to the source or the drain of the transistor 403 directly or through a conductive layer. The electrode 421 functioning as a pixel electrode is provided for each light-emitting element 360. Two adjacent electrodes 421 are electrically insulated from each other by the insulating layer 415.

The EL layer 422 contains a light-emitting substance.

The electrode 423 functioning as a common electrode is shared by a plurality of light-emitting elements 360. A fixed potential is supplied to the electrode 423.

The light-emitting element 360 overlaps with the coloring layer 425 with the adhesive layer 417 provided therebetween. The spacer 416 overlaps with the light-blocking layer 426 with the adhesive layer 417 provided therebetween. Although FIG. 30 illustrates the case where a space is provided between the electrode 423 and the light-blocking layer 426, the electrode 423 and the light-blocking layer 426 may be in contact with each other. Although the spacer 416 is provided on the substrate 351 side in the structure illustrated in FIG. 30, the spacer 416 may be provided on the substrate 361 side (e.g., in a position closer to the substrate 351 than the light-blocking layer 426).

Owing to the combination of a color filter (the coloring layer 425) and a microcavity structure (the optical adjustment layer 424), light with high color purity can be extracted from the display device. The thickness of the optical adjustment layer 424 is varied depending on the color of the pixel.

The coloring layer 425 is a coloring layer that transmits light in a specific wavelength range. For example, a color filter for transmitting light in a red, green, blue, or yellow wavelength range can be used.

Note that one embodiment of the present invention is not limited to a color filter method, and a separate coloring method, a color conversion method, a quantum dot method, and the like may be employed.

The light-blocking layer 426 is provided between the adjacent coloring layers 425. The light-blocking layer 426 blocks light emitted from the adjacent light-emitting element 360 to inhibit color mixture between the adjacent light-emitting elements 360. Here, the coloring layer 425 is provided such that its end portion overlaps with the light-blocking layer 426, whereby light leakage can be reduced. For the light-blocking layer 426, a material that blocks light emitted from the light-emitting element 360 can be used. Note that it is preferable to provide the light-blocking layer 426 in a region other than the display portion 362a, such as the circuit portion 364, in which case undesired leakage of guided light or the like can be inhibited.

The insulating layer 478 is formed on a surface of the resin layer 101. The insulating layer 476 is formed on a surface of the resin layer 102. The insulating layer 476 and the insulating layer 478 are preferably highly resistant to moisture. The light-emitting element 360, the transistors, and the like are preferably provided between a pair of insulating layers which are highly resistant to moisture, in which case impurities such as water can be prevented from entering these elements, leading to an increase in the reliability of the display device.

Examples of the insulating film highly resistant to moisture include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

For example, the moisture vapor transmission rate of the insulating film highly resistant to moisture is lower than or equal to $1\times10^{-5}$ [g/(m$^2$·day)], preferably lower than or equal to $1\times10^{-6}$ [g/(m$^2$·day)], more preferably lower than or equal to $1\times10^{-7}$ [g/(m$^2$·day)], still more preferably lower than or equal to $1\times10^{-8}$ [g/(m$^2$·day)].

A connection portion 406 includes the wiring 365. The wiring 365 can be formed using the same material and the same process as those of the sources and the drains of the transistors. The connection portion 406 is electrically connected to an external input terminal through which a signal and a potential from the outside are transmitted to the circuit portion 364. Here, an example in which the FPC 372 is provided as the external input terminal is described. The FPC 372 is electrically connected to the connection portion 406 through a connection layer 419.

The connection layer 419 can be formed using any of various kinds of anisotropic conductive films (ACF), anisotropic conductive pastes (ACP), and the like.

The above is the description of the display panel 100.

[Display Panel 200]

The display panel 200 is a reflective liquid crystal display device employing a vertical electric field mode.

The display panel 200 includes the resin layer 201, an insulating layer 578, a plurality of transistors, a capacitor 505, a wiring 367, an insulating layer 511, an insulating layer 512, an insulating layer 513, an insulating layer 514, a liquid crystal element 529, an alignment film 564a, an alignment film 564b, an adhesive layer 517, an insulating layer 576, and the resin layer 202.

The resin layers 201 and 202 are bonded to each other with the adhesive layer 517. Liquid crystal 563 is sealed in a region surrounded by the resin layer 201, the resin layer 202, and the adhesive layer 517. A polarizing plate 599 is positioned on an outer surface of the substrate 572.

Furthermore, an opening overlapping with the light-emitting element 360 is formed in the resin layer 201. An opening overlapping with the liquid crystal element 529 and the light-emitting element 360 is formed in the resin layer 202.

The liquid crystal element 529 includes the electrode 311b, an electrode 562, and the liquid crystal 563. The electrode 311b functions as a pixel electrode. The electrode 562 functions as a common electrode. Alignment of the liquid crystal 563 can be controlled with an electric field generated between the electrode 311b and the electrode 562. The alignment film 564a is provided between the liquid crystal 563 and the electrode 311b. The alignment film 564b is provided between the liquid crystal 563 and the electrode 562.

The resin layer 202 is provided with the insulating layer 576, the electrode 562, the alignment film 564b, and the like.

The resin layer 201 is provided with the electrode 311b, the alignment film 564a, the transistor 501, the transistor 503, the capacitor 505, the connection portion 506, the wiring 367, and the like.

Insulating layers such as the insulating layer 511, the insulating layer 512, the insulating layer 513, and the insulating layer 514 are provided over the resin layer 201.

Note that a portion of the conductive layer functioning as the source or the drain of the transistor 503 which is not electrically connected to the electrode 311b may function as part of a signal line. The conductive layer functioning as the gate of the transistor 503 may function as part of a scan line.

FIG. 30 illustrates a structure without a coloring layer as an example of the display portion 362a. Thus, the liquid crystal element 529 is an element that performs monochrome display.

FIG. 30 illustrates an example of the circuit portion 366 in which the transistor 501 is provided.

A material inhibiting diffusion of impurities such as water and hydrogen is preferably used for at least one of the insulating layers 512 and 513 which cover the transistors.

The electrode 311b is provided over the insulating layer 514. The electrode 311b is electrically connected to one of a source and a drain of the transistor 503 through an opening formed in the insulating layer 514, the insulating layer 513, the insulating layer 512, and the like. The electrode 311b is electrically connected to one electrode of the capacitor 505.

Since the display panel 200 is a reflective liquid crystal display device, a conductive material that reflects visible light is used for the electrode 311b and a conductive material that transmits visible light is used for the electrode 562.

For example, a material containing one or more of indium (In), zinc (Zn), and tin (Sn) is preferably used as the conductive material that transmits visible light. Specifically, indium oxide, indium tin oxide (ITO), indium zinc oxide, indium oxide containing tungsten oxide, indium zinc oxide containing tungsten oxide, indium oxide containing titanium oxide, indium tin oxide containing titanium oxide, indium tin oxide containing silicon oxide (ITSO), zinc oxide, and zinc oxide containing gallium are given, for example. Note that a film including graphene can be used as well. The film including graphene can be formed, for example, by reducing a film containing graphene oxide.

Examples of the conductive material that reflects visible light include aluminum, silver, and an alloy including any of these metal materials. A metal material such as gold, platinum, tungsten, chromium, molybdenum, iron, cobalt, copper, or palladium, or an alloy including any of these metal materials can also be used. Lanthanum, neodymium, germanium, or the like may be added to the metal material or the alloy. Furthermore, an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La), or an alloy containing silver such as an alloy of silver and copper, an alloy of silver, palladium, and copper (also referred to as Ag—Pd—Cu or APC), or an alloy of silver and magnesium may be used.

As the polarizing plate 599, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element 529 are controlled in accordance with the kind of the polarizing plate 599 so that desirable contrast is obtained.

The electrode 562 is electrically connected to a conductive layer on the resin layer 201 side through a connector 543 in a portion close to an end portion of the resin layer 202. Thus, a potential or a signal can be supplied from the FPC 374, an IC, or the like placed on the resin layer 201 side to the electrode 562.

As the connector 543, a conductive particle can be used, for example. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. As the connector 543, a material capable of elastic deformation or plastic deformation is preferably used. As illustrated in FIG. 30, the connector 543, which is the conductive particle, has a shape that is vertically crushed in some cases. With the crushed shape, the contact area between the connector 543 and a conductive layer electrically connected to the connector 543 can be increased, thereby reducing contact resistance and suppressing the generation of problems such as disconnection.

The connector 543 is preferably provided so as to be covered with the adhesive layer 517. For example, the connectors 543 are dispersed in the adhesive layer 517 before curing of the adhesive layer 517.

The connection portion 506 is provided in a region near an end portion of the resin layer 201. The connection portion 506 is electrically connected to the FPC 374 through the connection layer 519. In the example of the structure illustrated in FIG. 30, the connection portion 506 is formed by stacking part of the wiring 367 and a conductive layer that is obtained by processing the same conductive film as the electrode 311b.

The above is the description of the display panel 200.

Figure 31:
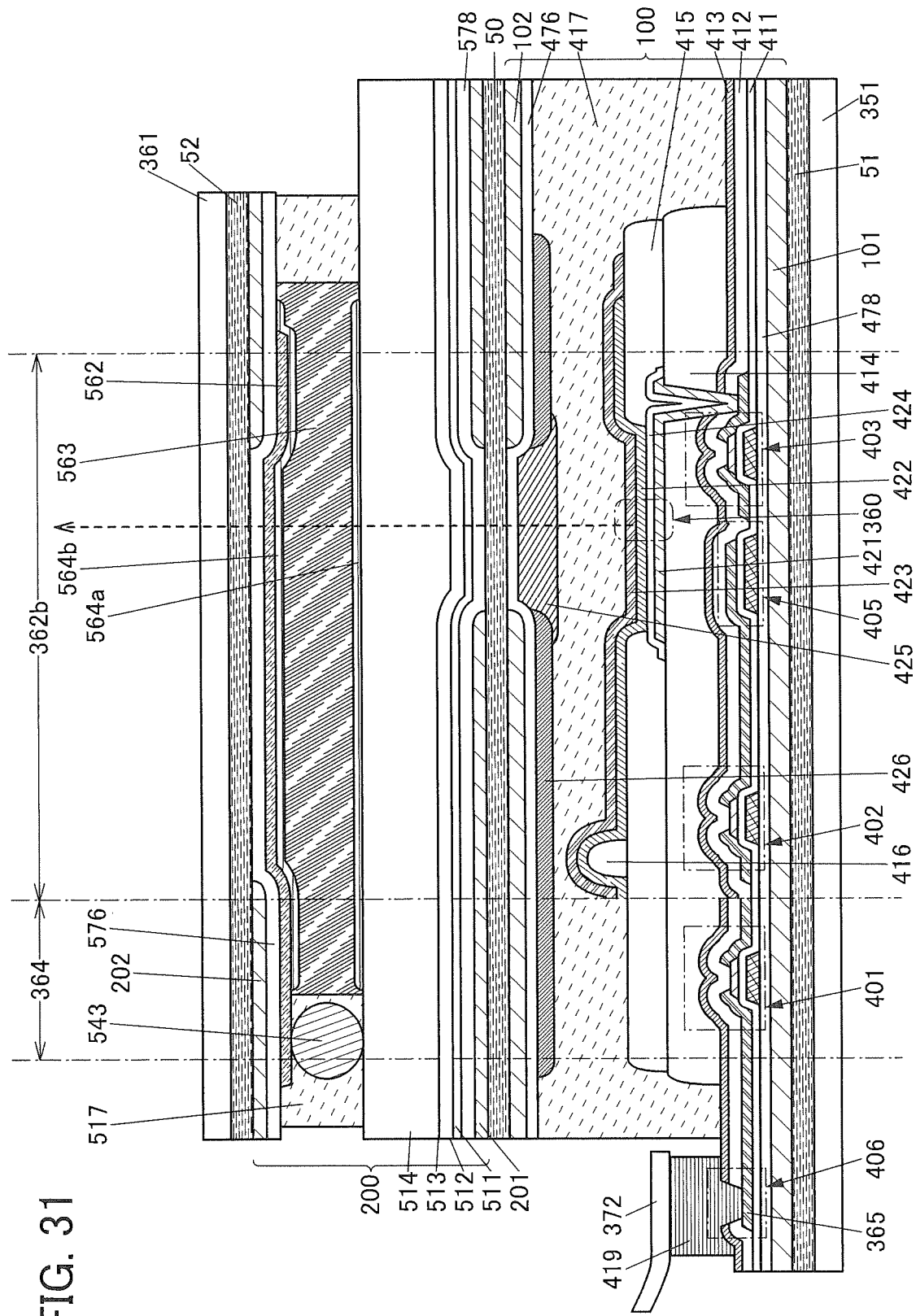
FIG. 31 illustrates the structure of a display device.

FIG. 31 illustrates an example of cross sections of part of a region including the FPC 372, part of a region including the circuit portion 364, and part of a region including the display portion 362b of the display device 300 illustrated in FIG. 29. The display portion 362b can perform display by the operation of the display panel 100. Although the structure is illustrated in which the alignment films 564a and 564b and the liquid crystal 563 are provided, part or all of them are not necessarily provided and a resin layer or the like that transmits light emitted from the light-emitting element 360 may be provided. The polarizing plate 599 is unnecessary and thus is not necessarily provided. Note that the display portion 362c can have a structure similar to that of the display portion 362b.

[Components]
The above components will be described below.
<Substrate>
A material having a flat surface can be used as the substrate included in the display panel. The substrate on the side from which light from the display element is extracted is formed using a material transmitting the light. For example, a material such as glass, quartz, ceramics, sapphire, or an organic resin can be used.

The weight and thickness of the display panel can be reduced by using a thin substrate. A flexible display panel can be obtained by using a substrate that is thin enough to have flexibility.

Since the substrate through which light is not extracted does not need to have a light-transmitting property, a metal substrate or the like can be used, other than the above-mentioned substrates. A metal substrate, which has high thermal conductivity, is preferable because it can easily conduct heat to the whole substrate and accordingly can prevent a local temperature rise in the display panel. To obtain flexibility and bendability, the thickness of a metal substrate is preferably greater than or equal to 10 μm and less than or equal to 400 μm, more preferably greater than or equal to 20 μm and less than or equal to 50 μm.

Although there is no particular limitation on a material of a metal substrate, it is favorable to use, for example, a metal such as aluminum, copper, and nickel, an aluminum alloy, or an alloy such as stainless steel.

It is possible to use a substrate subjected to insulation treatment, e.g., a metal substrate whose surface is oxidized or provided with an insulating film. The insulating film may be formed by, for example, a coating method such as a spin-coating method or a dipping method, an electrodeposition method, an evaporation method, or a sputtering method. An oxide film may be formed on the substrate surface by exposure to or heating in an oxygen atmosphere or by an anodic oxidation method or the like.

Examples of the material that has flexibility and transmits visible light include glass which is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE) resin. It is particularly preferable to use a material with a low thermal expansion coefficient, for example, a material with a thermal expansion coefficient lower than or equal to $30 \times 10^{-6}$/K, such as a polyamide imide resin, a polyimide resin, or PET. A substrate in which a glass fiber is impregnated with an organic resin or a substrate whose thermal expansion coefficient is reduced by mixing an inorganic filler with an organic resin can also be used. A substrate using such a material is lightweight, and thus a display panel using this substrate can also be lightweight.

In the case where a fibrous body is included in the above material, a high-strength fiber of an organic compound or an inorganic compound is used as the fibrous body. The high-strength fiber is specifically a fiber with a high tensile elastic modulus or a fiber with a high Young's modulus. Typical examples thereof include a polyvinyl alcohol-based fiber, a polyester-based fiber, a polyamide-based fiber, a polyethylene-based fiber, an aramid-based fiber, a polyparaphenylene benzobisoxazole fiber, a glass fiber, and a carbon fiber. As the glass fiber, a glass fiber using E glass, S glass, D glass, Q glass, or the like can be used. These fibers may be used in a state of a woven or nonwoven fabric, and a structure body in which this fibrous body is impregnated with a resin and the resin is cured may be used as the flexible substrate. The structure body including the fibrous body and the resin is preferably used as the flexible substrate, in which case the reliability against bending or breaking due to local pressure can be increased.

Alternatively, glass, metal, or the like that is thin enough to have flexibility can be used as the substrate. Alternatively, a composite material where glass and a resin material are attached to each other with an adhesive layer may be used.

A hard coat layer (e.g., a silicon nitride layer and an aluminum oxide layer) by which a surface of a display panel is protected from damage, a layer (e.g., an aramid resin layer) that can disperse pressure, or the like may be stacked over the flexible substrate. Furthermore, to suppress a decrease in lifetime of the display element due to moisture and the like, an insulating film with low water permeability may be stacked over the flexible substrate. For example, an inorganic insulating material such as silicon nitride, silicon oxynitride, silicon nitride oxide, aluminum oxide, or aluminum nitride can be used.

The substrate may be formed by stacking a plurality of layers. When a glass layer is used, a barrier property against water and oxygen can be improved and thus a highly reliable display panel can be provided.

[Transistor]

The transistor includes a conductive layer serving as a gate electrode, a semiconductor layer, a conductive layer serving as a source electrode, a conductive layer serving as a drain electrode, and an insulating layer serving as a gate insulating layer. In the above, a bottom-gate transistor is used.

Note that there is no particular limitation on the structure of the transistor included in the display device of one embodiment of the present invention. For example, a planar transistor, a staggered transistor, or an inverted staggered transistor can be used. A top-gate transistor or a bottom-gate transistor may also be used. Gate electrodes may be provided above and below a channel.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferred that a semiconductor having crystallinity be used, in which case deterioration of the transistor characteristics can be suppressed.

As a semiconductor material used for the transistors, an oxide semiconductor whose energy gap is greater than or equal to 2 eV, preferably greater than or equal to 2.5 eV, more preferably greater than or equal to 3 eV can be used. A typical example thereof is an oxide semiconductor containing indium, and for example, a CAC-OS described later or the like can be used.

A transistor with an oxide semiconductor having a larger band gap and a lower carrier density than silicon has a low off-state current, and therefore, charges stored in a capacitor that is series-connected to the transistor can be held for a long time.

The semiconductor layer can be, for example, a film represented by an In—M—Zn-based oxide that contains indium, zinc, and M (a metal such as aluminum, titanium, gallium, germanium, yttrium, zirconium, lanthanum, cerium, tin, neodymium, or hafnium).

In the case where the oxide semiconductor contained in the semiconductor layer is an In—M—Zn-based oxide, it is preferable that the atomic ratio of metal elements of a sputtering target used to deposit a film of the In-M-Zn oxide satisfy In≥M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio of metal elements in the formed oxide semiconductor layer varies from the above atomic ratios of metal elements of the sputtering targets in a range of ±40%.

The bottom-gate transistor described in this embodiment is preferable because the number of manufacturing steps can be reduced. When an oxide semiconductor, which can be formed at a lower temperature than polycrystalline silicon, is used, materials with low heat resistance can be used for a wiring, an electrode, or a substrate below the semiconductor layer, so that the range of choices of materials can be widened. For example, an extremely large glass substrate can be favorably used.

[Conductive Layer]

As materials for the gates, the source, and the drain of a transistor, and the conductive layers serving as the wirings and electrodes included in the display device, any of metals such as aluminum, titanium, chromium, nickel, copper, yttrium, zirconium, molybdenum, silver, tantalum, and tungsten, or an alloy containing any of these metals as its main component can be used. A single-layer structure or a layered structure including a film containing any of these materials can be used. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because controllability of a shape by etching is increased.

As a light-transmitting conductive material, a conductive oxide such as indium oxide, indium tin oxide, indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium or an alloy material containing any of these metal materials can be used. Alternatively, a nitride of the metal material (e.g., titanium nitride) or the like may be used. In the case of using the metal material or the alloy material (or the nitride thereof), the thickness is set small enough to allow light transmission. Alternatively, a layered film of any of the above materials can be used as the conductive layer. For example, a layered film of indium tin oxide and an alloy of silver and magnesium is preferably used because the conductivity can be increased. They can also be used for conductive layers such as a variety of wirings and electrodes included in a display device, and conductive layers (e.g., conductive layers serving as a pixel electrode or a common electrode) included in a display element.

[Insulating Layer]

As an insulating material that can be used for the insulating layers, acrylic, epoxy, a silicone resin, or an inorganic insulating material such as silicon oxide, silicon oxynitride, silicon nitride oxide, silicon nitride, or aluminum oxide can be used.

The light-emitting element is preferably provided between a pair of insulating films with low water permeability, in which case entry of impurities such as water into the light-emitting element can be inhibited. Thus, a decrease in device reliability can be suppressed.

As an insulating film with low water permeability, a film containing nitrogen and silicon, such as a silicon nitride film or a silicon nitride oxide film, a film containing nitrogen and aluminum, such as an aluminum nitride film, or the like can be used. Alternatively, a silicon oxide film, a silicon oxynitride film, an aluminum oxide film, or the like may be used.

For example, the amount of water vapor transmission of the insulating film with low water permeability is lower than or equal to $1\times10^{-5}$ [g/(m$^2$·day)], preferably lower than or equal to $1\times10^{-6}$ [g/(m$^2$·day)], more preferably lower than or equal to $1\times10^{-7}$ [g/(m$^2$·day)], still more preferably lower than or equal to $1\times10^{-8}$ [g/(m$^2$·day)].

[Display Element]

As a display element included in the first pixel located on the display surface side, an element which performs display by reflecting external light can be used. Such an element does not include a light source and thus power consumption in display can be significantly reduced. As the display element included in the first pixel, a reflective liquid crystal element can typically be used. Alternatively, as the first display element, an element using a microcapsule method, an electrophoretic method, an electrowetting method, an Electronic Liquid Powder (registered trademark) method, or the like can be used, other than a Micro Electro Mechanical Systems (MEMS) shutter element or an optical interference type MEMS element.

As a display element included in the second pixel located on the side opposite to the display surface side, an element which includes a light source and performs display using light from the light source can be used. Since the luminance and the chromaticity of light emitted from such a pixel are not affected by external light, an image with high color reproducibility (a wide color gamut) and a high contrast, i.e., a clear image can be displayed. As the display element included in the second pixel, a self-luminous light-emitting element such as an organic light-emitting diode (OLED), a light-emitting diode (LED), and a quantum-dot light-emitting diode (QLED) can be used. Alternatively, a combination of a backlight as a light source and a transmissive liquid crystal element which controls the amount of transmitted light emitted from a backlight may be used as the display element included in the second pixel.

[Liquid Crystal Element]

The liquid crystal element can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element can employ a variety of modes; for example, other than the VA mode, a twisted nematic (TN) mode, an in-plane switching (IPS) mode, a fringe field switching (FFS) mode, an axially symmetric aligned microcell (ASM) mode, an optically compensated birefringence (OCB) mode, a ferroelectric liquid crystal (FLC) mode, or an antiferroelectric liquid crystal (AFLC) mode can be used.

The liquid crystal element controls transmission or non-transmission of light utilizing an optical modulation action of liquid crystal. Note that the optical modulation action of liquid crystal is controlled by an electric field applied to the liquid crystal (including a horizontal electric field, a vertical electric field, and an oblique electric field). As the liquid crystal used for the liquid crystal element, thermotropic liquid crystal, low-molecular liquid crystal, high-molecular liquid crystal, polymer dispersed liquid crystal (PDLC), ferroelectric liquid crystal, anti-ferroelectric liquid crystal, or the like can be used. These liquid crystal materials exhibit a cholesteric phase, a smectic phase, a cubic phase, a chiral nematic phase, an isotropic phase, or the like depending on conditions.

As the liquid crystal material, either a positive liquid crystal or a negative liquid crystal may be used, and an appropriate liquid crystal material can be used depending on the mode or design to be used.

An alignment film can be provided to adjust the alignment of liquid crystal. In the case where a horizontal electric field mode is employed, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time and has optical isotropy. In addition, the liquid crystal composition which includes liquid crystal exhibiting a blue phase and a chiral material does not need alignment treatment and has small viewing angle dependence. An alignment film is not necessarily provided and rubbing treatment is thus not necessary; accordingly, electrostatic discharge damage caused by the rubbing treatment can be prevented and defects and damage of the liquid crystal display device in the manufacturing process can be reduced.

In one embodiment of the present invention, in particular, a reflective liquid crystal element can be used.

In the case where a reflective liquid crystal element is used, a polarizing plate is provided on the display surface side. In addition, a light diffusion plate is preferably provided on the display surface side to improve visibility.

[Light-Emitting Element]

As the light-emitting element, a self-luminous element can be used, and an element whose luminance is controlled by current or voltage is included in the category of the light-emitting element. For example, an LED, a QLED, an organic EL element, an inorganic EL element, or the like can be used.

In one embodiment of the present invention, in particular, the light-emitting element preferably has a top emission structure. A conductive film that transmits visible light is used as the electrode through which light is extracted. A conductive film that reflects visible light is preferably used as the electrode through which light is not extracted.

The EL layer includes at least a light-emitting layer. In addition to the light-emitting layer, the EL layer may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer, either a low-molecular compound or a high-molecular compound can be used, and an inorganic compound may also be used. Each of the layers included in the EL layer can be formed by any of the following methods: an evaporation method (including a vacuum evaporation method), a transfer method, a printing method, an inkjet method, a coating method, and the like.

When a voltage higher than the threshold voltage of the light-emitting element is applied between a cathode and an anode, holes are injected to the EL layer from the anode side and electrons are injected to the EL layer from the cathode side. The injected electrons and holes are recombined in the EL layer and a light-emitting substance contained in the EL layer emits light.

In the case where a light-emitting element emitting white light is used as the light-emitting element, the EL layer preferably contains two or more kinds of light-emitting substances. For example, the two or more kinds of light-emitting substances are selected so as to emit light of complementary colors to obtain white light emission. Specifically, it is preferable to contain two or more selected from light-emitting substances that emit light of red (R), green (G), blue (B), yellow (Y), orange (O), and the like and light-emitting substances that emit light containing two or more of spectral components of R, G, and B. The light-emitting element preferably emits light with a spectrum having two or more peaks in the wavelength range of a visible light region (e.g., 350 nm to 750 nm). An emission spectrum of a material that emits light having a peak in a yellow wavelength range preferably includes spectral components also in green and red wavelength ranges.

A light-emitting layer containing a light-emitting material that emits light of one color and a light-emitting layer containing a light-emitting material that emits light of another color are preferably stacked in the EL layer. For example, the plurality of light-emitting layers in the EL layer may be stacked in contact with each other or may be stacked with a region not including any light-emitting material therebetween. For example, between a fluorescent layer and a phosphorescent layer, a region containing the same material as one in the fluorescent layer or the phosphorescent layer (for example, a host material or an assist material) and no light-emitting material may be provided. This facilitates the manufacture of the light-emitting element and reduces the drive voltage.

The light-emitting element may be a single element including one EL layer or a tandem element in which a plurality of EL layers are stacked with a charge generation layer therebetween.

Note that the aforementioned light-emitting layer and layers containing a substance with a high hole-injection property, a substance with a high hole-transport property, a substance with a high electron-transport property, a substance with a high electron-injection property, a substance with a bipolar property, and the like may include an inorganic compound such as a quantum dot or a high molecular compound (e.g., an oligomer, a dendrimer, and a polymer). For example, when used for the light-emitting layer, the quantum dot can function as a light-emitting material.

The quantum dot may be a colloidal quantum dot, an alloyed quantum dot, a core-shell quantum dot, a core quantum dot, or the like. A quantum dot containing elements belonging to Groups 12 and 16, elements belonging to Groups 13 and 15, or elements belonging to Groups 14 and 16 may be used. Alternatively, a quantum dot containing an element such as cadmium, selenium, zinc, sulfur, phosphorus, indium, tellurium, lead, gallium, arsenic, or aluminum may be used.

The conductive film that transmits visible light can be formed using, for example, indium oxide, indium tin oxide, indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stack of any of the above materials can be used for the conductive layers. For example, a stack of indium tin oxide and an alloy of silver and magnesium is preferably used, in which case conductivity can be increased. Still alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Furthermore, lanthanum, neodymium, germanium, or the like may be added to the metal material or the alloy. Alternatively, an alloy containing aluminum (an aluminum alloy) such as an alloy of aluminum and titanium, an alloy of aluminum and nickel, or an alloy of aluminum and neodymium may be used. Alternatively, an alloy containing silver such as an alloy of silver and copper, an alloy of silver and palladium, or an alloy of silver and magnesium may be used. An alloy containing silver and copper is preferable because of its high heat resistance. Furthermore, when a metal film or a metal oxide film is stacked in contact with an aluminum film or an aluminum alloy film, oxidation can be suppressed. Examples of a material for the metal film or the metal oxide film include titanium and titanium oxide. Alternatively, the above conductive film that transmits visible light and a film containing a metal material may be stacked. For example, a stack of silver and indium tin oxide, a stack of an alloy of silver and magnesium and indium tin oxide, or the like can be used.

Each of the electrodes can be formed by an evaporation method or a sputtering method. Alternatively, a discharging method such as an inkjet method, a printing method such as a screen printing method, or a plating method may be used.

[Adhesive Layer]

As the adhesive layer, any of a variety of curable adhesives, e.g., a photo-curable adhesive such as an ultraviolet curable adhesive, a reactive curable adhesive, a thermosetting curable adhesive, and an anaerobic adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Still alternatively, an adhesive sheet or the like may be used.

Furthermore, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can inhibit entry of impurities such as moisture into an element, leading to an improvement in the reliability of the display panel.

In addition, a filler with a high refractive index or a light-scattering member may be mixed into the resin, in which case light extraction efficiency can be improved. For example, titanium oxide, barium oxide, zeolite, or zirconium can be used.

[Connection Layer]

As a connection layer, an anisotropic conductive film (ACF), an anisotropic conductive paste (ACP), or the like can be used.

[Coloring Layer]

Examples of materials that can be used for the coloring layer include a metal material, a resin material, and a resin material containing a pigment or dye.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked structure of a film containing a material of a coloring layer which transmits light of a certain color and a film containing a material of a coloring layer which transmits light of another color can be employed. It is preferred that the coloring layer and the light-blocking layer be formed using the same material because the same manufacturing apparatus can be used and the process can be simplified.

The above is the description of each of the components.

Modification Example

Structure examples which partly differ from the display device described in the above cross-sectional structure example will be described below. Note that the description of the portions already described above is omitted and only different portions are described.

Modification Example 1 of Cross-Sectional Structure Example

Figure 32:
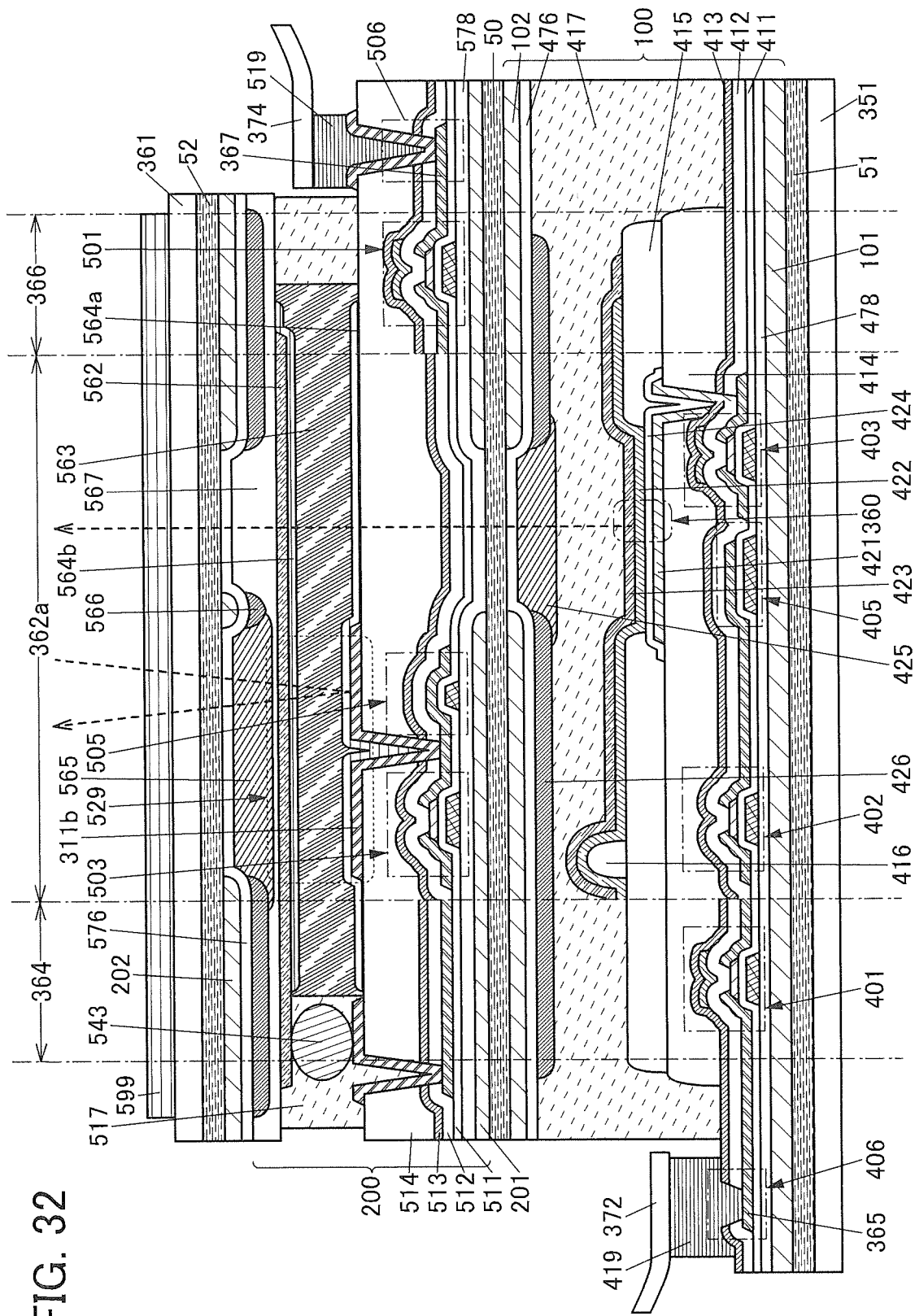
FIG. 32 illustrates the structure of a display device.

FIG. 32 is different from FIG. 30 in the structures of transistors and the resin layer 202 and in that a coloring layer 565, a light-blocking layer 566, and an insulating layer 567 are provided.

The transistors 401, 403, and 501 illustrated in FIG. 32 each include a second gate electrode. In this manner, a transistor including a pair of gates is preferably used as each of the transistors provided in the circuit portion 364 and the circuit portion 366 and the transistor that controls current flowing to the light-emitting element 360.

In the resin layer 202, an opening overlapping with the liquid crystal element 529 and an opening overlapping with the light-emitting element 360 are separately formed, whereby the reflectance of the liquid crystal element 529 can be increased.

The light-blocking layer 566 and the coloring layer 565 are provided on a surface of the insulating layer 576 on the liquid crystal element 529 side. The coloring layer 565 is provided so as to overlap with the liquid crystal element 529. Thus, the display panel 200 can perform color display. The light-blocking layer 566 has an opening overlapping with the liquid crystal element 529 and an opening overlapping with the light-emitting element 360. This allows fabrication of a display device that suppresses mixing of colors between adjacent pixels and thus has high color reproducibility.

Modification Example 2 of Cross-Sectional Structure Example

Figure 33:
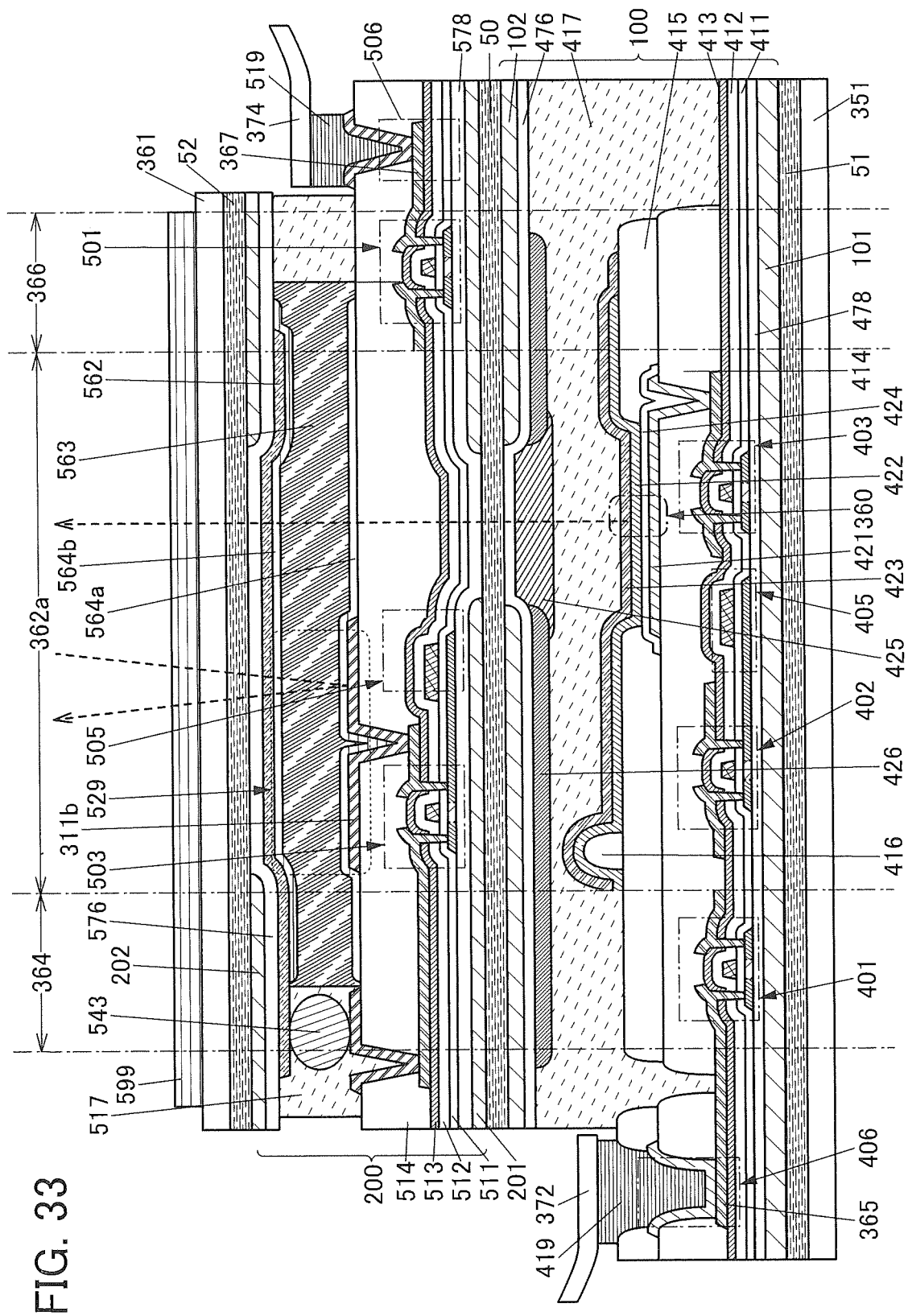
FIG. 33 illustrates the structure of a display device.

FIG. 33 illustrates an example in which a top-gate transistor is used as each transistor. The use of a top-gate transistor can reduce parasitic capacitance, leading to an increase in the frame frequency of display. Furthermore, a top-gate transistor can favorably be used for a large display panel with a size of 8 inches or more.

Modification Example 3 of Cross-Sectional Structure Example

Figure 34:
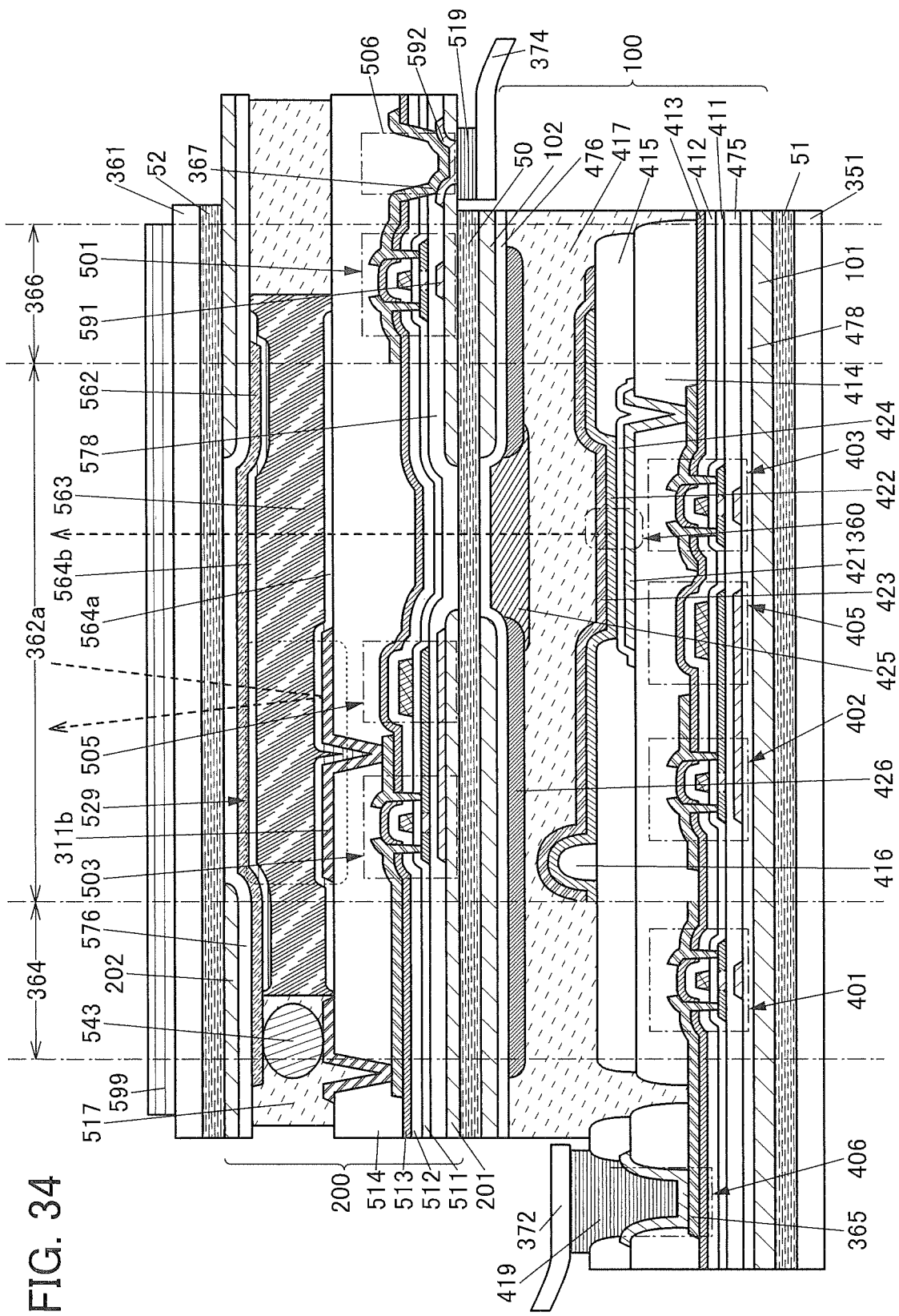
FIG. 34 illustrates the structure of a display device.

FIG. 34 illustrates an example in which a top-gate transistor including a second gate electrode is used as each transistor.

Each of the transistors includes a conductive layer 591 so as to overlap with a channel region. An insulating layer 475 or the insulating layer 578 is provided so as to cover the conductive layer 591.

In the connection portion 506 of the display panel 200, part of the resin layer 201 is opened, and a conductive layer 592 is provided so as to fill the opening. The conductive layer 592 is provided such that the back surface (a surface on the display panel 100 side) thereof is exposed. The conductive layer 592 is electrically connected to the wiring 367. The FPC 374 is electrically connected to the exposed surface of the conductive layer 592 through the connection layer 519. The conductive layer 592 can be formed by processing the conductive film with which the conductive layer 591 is formed. The conductive layer 592 functions as an electrode that can also be called a back electrode.

Such a structure can be obtained by using a photosensitive organic resin for the resin layer 201. For example, in forming the resin layer 201 over a support substrate, an opening is formed in the resin layer 201 and the conductive layer 592 is formed so as to fill the opening. When the resin layer 201 and the support substrate are separated from each other, the conductive layer 592 and the support substrate are also separated from each other, whereby the conductive layer 592 illustrated in FIG. 34 can be formed.

Such a structure allows the FPC 374 connected to the display panel 200 located on the display surface side to be positioned on the side opposite to the display surface. Thus, a space for bending the FPC 374 in incorporating a display device in an electronic device can be eliminated, which enables the electronic device to be smaller.

Modification Example 4 of Cross-Sectional Structure Example

Figure 35:
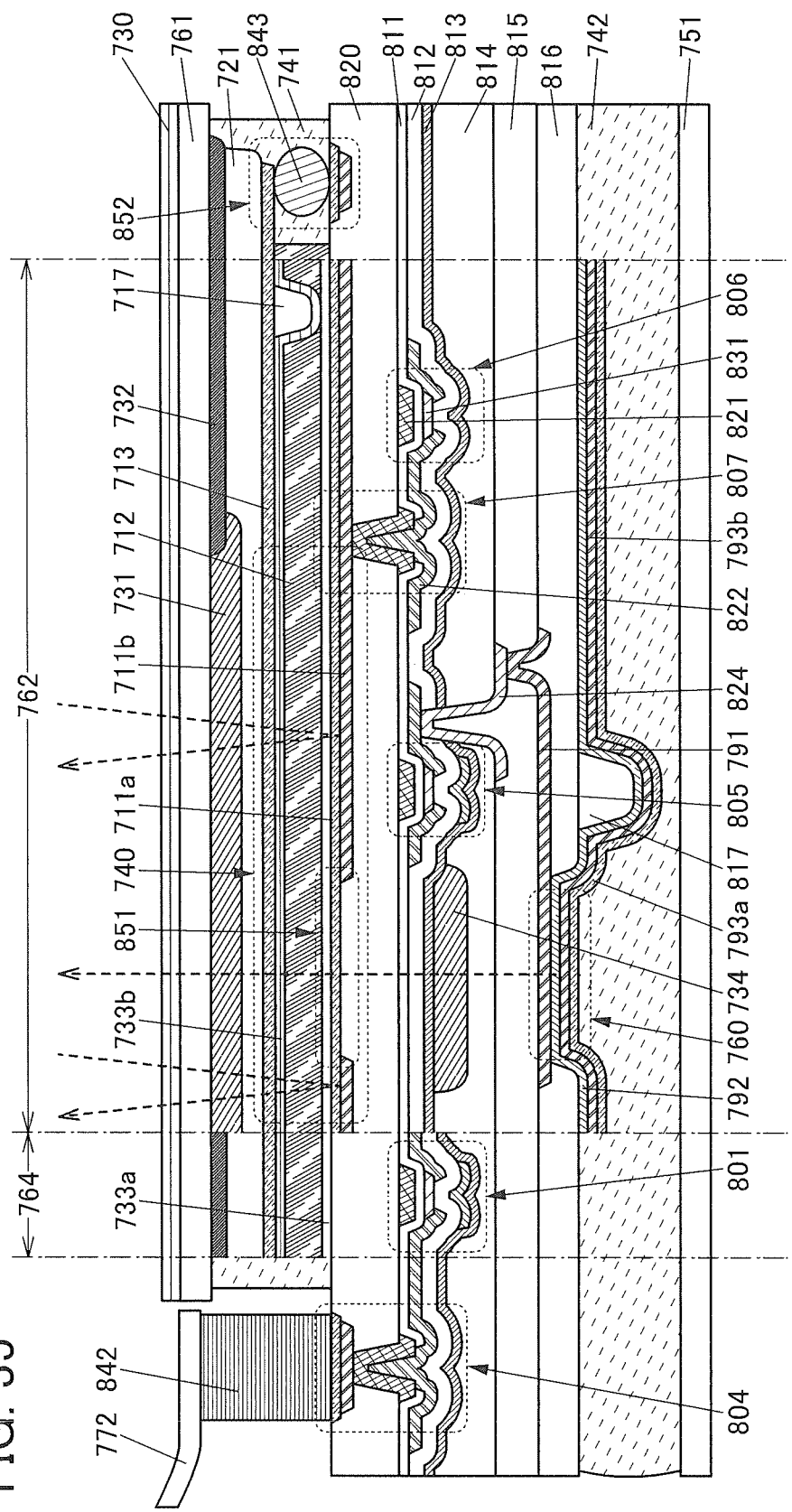
FIG. 35 illustrates the structure of a display device.
Figure 36A:
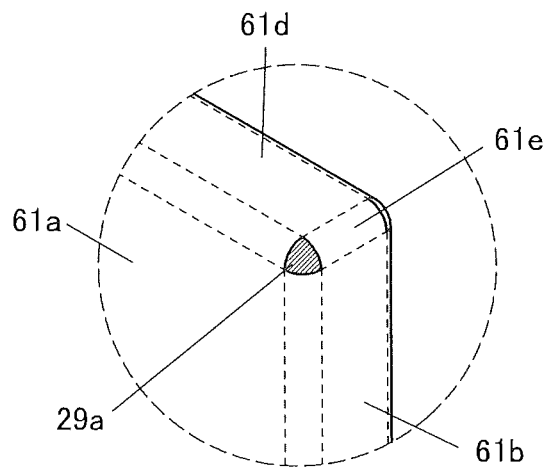
FIGS. 36A to 36D illustrate the structures of display devices.
Figure 36B:
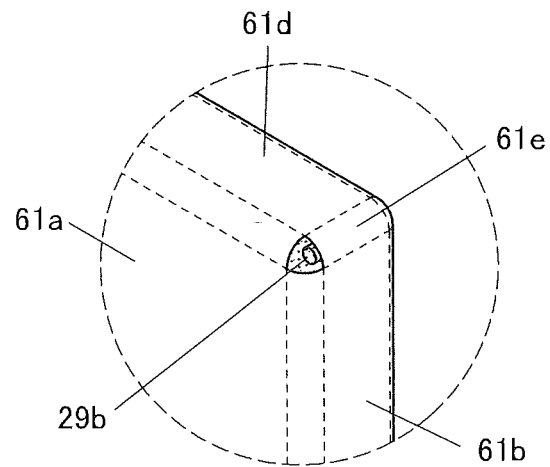
Figure 36C:
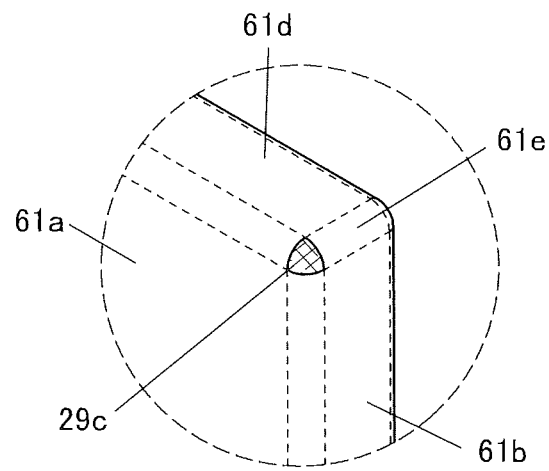
Figure 36D:
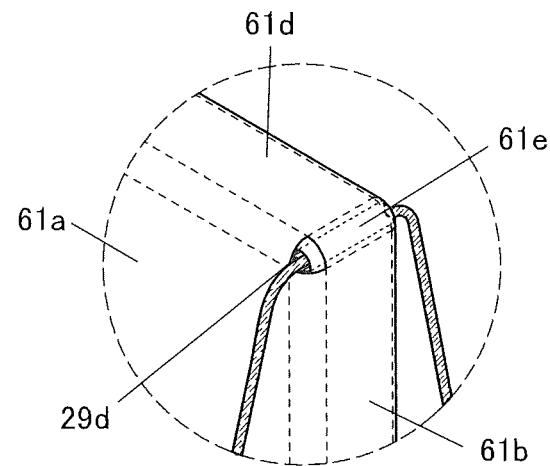

FIG. 35 illustrates an example of cross sections of the display portion 762 and the circuit portion 764 in a display device having a structure different from those of FIGS. 30 to 34.

The display panel includes an insulating layer 820 between the substrates 751 and 761. The display panel also includes the light-emitting element 760, a transistor 801, a transistor 805, a transistor 806, a coloring layer 734, and the like between the substrate 751 and the insulating layer 820. Furthermore, the display panel includes the liquid crystal element 740, the coloring layer 731, and the like between the insulating layer 820 and the substrate 761. The substrate 761 and the insulating layer 820 are bonded with an adhesive layer 741. The substrate 751 and the insulating layer 820 are bonded with an adhesive layer 742.

The transistor 806 is electrically connected to the liquid crystal element 740 and the transistor 805 is electrically connected to the light-emitting element 760. Since the transistors 805 and 806 are formed on a surface of the insulating layer 820 which is on the substrate 751 side, the transistors 805 and 806 can be formed through the same process.

The substrate 761 is provided with the coloring layer 731, a light-blocking layer 732, an insulating layer 721, and a conductive layer 713 serving as a common electrode of the liquid crystal element 740, an alignment film 733b, an insulating layer 717, and the like. The insulating layer 717 serves as a spacer for holding a cell gap of the liquid crystal element 740.

Insulating layers such as an insulating layer 811, an insulating layer 812, an insulating layer 813, an insulating layer 814, and an insulating layer 815 are provided on the substrate 751 side of the insulating layer 820. Part of the insulating layer 811 functions as a gate insulating layer of each transistor. The insulating layer 812, the insulating layer 813, and the insulating layer 814 are provided to cover each transistor and the like. The insulating layer 815 is provided to cover the insulating layer 814. The insulating layers 814 and 815 each function as a planarization layer. Note that an example where the three insulating layers, the insulating layers 812, 813, and 814, are provided to cover the transistors and the like is described here; however, one embodiment of the present invention is not limited to this example, and four or more insulating layers, a single insulating layer, or two insulating layers may be provided. The insulating layer 814 functioning as a planarization layer is not necessarily provided when not needed.

The transistors 801, 805, and 806 each include a conductive layer 821 part of which functions as a gate, conductive layers 822 part of which functions as a source or a drain, and a semiconductor layer 831. Here, a plurality of layers obtained by processing the same conductive film are shown with the same hatching pattern.

The liquid crystal element 740 is a reflective liquid crystal element. The liquid crystal element 740 has a structure in which a conductive layer 711a, a liquid crystal 712, and the conductive layer 713 are stacked. A conductive layer 711b which reflects visible light is provided in contact with the surface of the conductive layer 711a that is on the substrate 751 side. The conductive layer 711b includes an opening 851. The conductive layers 711a and 713 contain a material transmitting visible light. In addition, an alignment film 733a is provided between the liquid crystal 712 and the conductive layer 711a and the alignment film 733b is provided between the liquid crystal 712 and the conductive layer 713. A polarizing plate 730 is provided on an outer surface of the substrate 761.

In the liquid crystal element 740, the conductive layer 711b has a function of reflecting visible light, and the conductive layer 713 has a function of transmitting visible light. Light that enters the substrate 761 side is polarized by the polarizing plate 730, passes through the conductive layer 713 and the liquid crystal 712, and is reflected by the conductive layer 711b. Then, the light passes through the liquid crystal 712 and the conductive layer 713 again and reaches the polarizing plate 730. In this case, the alignment of the liquid crystal 712 is controlled with a voltage that is applied between the conductive layer 711b and the conductive layer 713, and thus optical modulation of light can be controlled. That is, the intensity of light emitted through the polarizing plate 730 can be controlled. Light other than one in a particular wavelength region of the light is absorbed by the coloring layer 731, and thus, emitted light is red light, for example.

The light-emitting element 760 is a bottom-emission light-emitting element. The light-emitting element 760 has a structure in which a conductive layer 791, an EL layer 792, and a conductive layer 793b are stacked in this order from the insulating layer 820 side. In addition, a conductive layer 793a is provided to cover the conductive layer 793b. The conductive layer 793b contains a material reflecting visible light, and the conductive layers 791 and 793a contain a material transmitting visible light. Light is emitted from the light-emitting element 760 to the substrate 761 side through the coloring layer 734, the insulating layer 820, the opening 851, the conductive layer 713, and the like.

Here, as illustrated in FIG. 35, the conductive layer 711a transmitting visible light is preferably provided for the opening 851. In that case, the liquid crystal 712 has alignment in a region overlapping with the opening 851 as well as in the other regions; thus, an alignment defect of the liquid crystal is prevented from being caused in the boundary portion of these regions and undesired light leakage can be suppressed.

As the polarizing plate 730 provided on an outer surface of the substrate 761, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element used as the liquid crystal element 740 are controlled in accordance with the kind of the polarizing plate so that desirable contrast is obtained.

The insulating layer 816 covering an end portion of the conductive layer 791 is provided with an insulating layer 817. The insulating layer 817 has a function of a spacer for preventing the insulating layer 820 and the substrate 751 from getting closer more than necessary. In addition, in the case where the EL layer 792 or the conductive layer 793a is formed using a shielding mask (metal mask), the insulating layer 817 may have a function of preventing the shielding mask from being in contact with a surface on which the EL layer 792 or the conductive layer 793a is formed. Note that the insulating layer 817 is not necessarily provided.

One of a source and a drain of the transistor 805 is electrically connected to the conductive layer 791 of the light-emitting element 760 through a conductive layer 824.

One of a source and a drain of the transistor 806 is electrically connected to the conductive layer 711b through a connection portion 807. The conductive layers 711b and 711a are in contact with and electrically connected to each other. Here, in the connection portion 807, the conductive layers provided on both surfaces of the insulating layer 820 are connected to each other through an opening in the insulating layer 820.

A connection portion 804 is provided in a region where the substrates 751 and 761 do not overlap with each other. The connection portion 804 is electrically connected to the FPC 772 through a connection layer 842. The connection portion 804 has a structure similar to that of the connection portion 807. On the top surface of the connection portion 804, a conductive layer obtained by processing the same conductive film as the conductive layer 711a is exposed.

Thus, the connection portion 804 and the FPC 772 can be electrically connected to each other through the connection layer 842.

A connection portion 852 is provided in part of a region where the adhesive layer 741 is provided. In the connection portion 852, the conductive layer obtained by processing the same conductive film as the conductive layer 711a is electrically connected to part of the conductive layer 713 with a connector 843. Accordingly, a signal or a potential input from the FPC 772 connected to the substrate 751 side can be supplied to the conductive layer 713 formed on the substrate 761 side through the connection portion 852.

The above is the description of the modification examples.

At least part of this embodiment can be implemented in combination with any of the other embodiments described in this specification as appropriate.

Embodiment 6

A cloud-aligned composite oxide semiconductor (CAC-OS) and a CAC-metal oxide applicable to the transistor disclosed in one embodiment of the present invention will be described below.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. That is to say, an OS FET is a transistor including a metal oxide or an oxide semiconductor.

In this specification and the like, a metal oxide including nitrogen is also called a metal oxide in some cases. Moreover, a metal oxide including nitrogen may be called a metal oxynitride.

In this specification and the like, "c-axis aligned crystal (CAAC)" or "cloud-aligned composite (CAC)" may be stated. CAAC refers to an example of a crystal structure, and CAC refers to an example of a function or material composition.

An example of the crystal structure of an oxide semiconductor or a metal oxide will be described. Note that an oxide semiconductor deposited by a sputtering method using an In—Ga—Zn oxide target (In:Ga:Zn=4:2:4.1 in an atomic ratio) will be described below as an example. An oxide semiconductor deposited by a sputtering method using the above-mentioned target at a substrate temperature of higher than or equal to 100° C. and lower than or equal to 130° C. is referred to as sIGZO, and an oxide semiconductor deposited by a sputtering method using the above-mentioned target with the substrate temperature set at room temperature (R.T.) is referred to as tIGZO. For example, sIGZO has one or both crystal structures of nano crystal (nc) and CAAC. Furthermore, tIGZO has the crystal structure of nc. Note that room temperature (R.T.) herein also refers to a temperature of the time when a substrate is not heated intentionally.

In this specification and the like, CAC-OS or CAC-metal oxide has a function of a conductor in a part of the material and has a function of a dielectric (or insulator) in another part of the material; as a whole, CAC-OS or CAC-metal oxide has a function of a semiconductor. In the case where CAC-OS or CAC-metal oxide is used in an active layer of a transistor, conductors have a function of letting electrons (or holes) serving as carriers flow, and dielectrics have a function of not letting electrons serving as carriers flow. By the complementary action of the function as a conductor and the function as a dielectric, CAC-OS or CAC-metal oxide can have a switching function (on/off function). In the CAC-OS or CAC-metal oxide, separation of the functions can maximize each function.

In this specification and the like, CAC-OS or CAC-metal oxide includes conductor regions and dielectric regions. The conductor regions have the above-described function of the conductor, and the dielectric regions have the above-described function of the dielectric. In some cases, the conductor regions and the dielectric regions in the material are separated at the nanoparticle level. In some cases, the conductor regions and the dielectric regions are unevenly distributed in the material. When observed, the conductor regions are coupled in a cloud-like manner with their boundaries blurred, in some cases.

In other words, CAC-OS or CAC-metal oxide can be called a matrix composite or a metal matrix composite.

Furthermore, in the CAC-OS or CAC-metal oxide, each of the conductor regions and the dielectric regions has a size of more than or equal to 0.5 nm and less than or equal to 10 nm, preferably more than or equal to 0.5 nm and less than or equal to 3 nm and is dispersed in the material, in some cases.

Note that an OS preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0), and gallium oxide (GaO$_{X3}$, where X3 is a real number greater than 0) or gallium zinc oxide (Ga$_{X4}$Zn$_{Y4}$O$_{Z4}$, where X4, Y4, and Z4 are real numbers greater than 0), and a mosaic pattern is formed. Then, InO$_{X1}$ or In$_{X2}$Zn$_{Y2}$O$_{Z2}$ forming the mosaic pattern is evenly distributed in the film. This composition is also referred to as a cloud-like composition.

That is, the CAC-OS is a composite oxide semiconductor with a composition in which a region including GaO$_{X3}$ as a main component and a region including In$_{X2}$Zn$_{Y2}$O$_{Z2}$ or InO$_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by InGaO$_3$(ZnO)$_{m1}$ (m1 is a natural number) and a crystalline compound represented by In$_{(1+x0)}$Ga$_{(1-x0)}$O$_3$(ZnO)$_{m0}$ (−1≤x0≤1; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component and nanoparticle regions including In as a main component are observed in parts of the CAC-OS. These nanoparticle regions are randomly dispersed to form a mosaic pattern. Therefore, the crystal structure is a secondary element for the CAC-OS.

Note that in the CAC-OS, a layered structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) and nanoparticle regions including In as a main component are observed in parts of the CAC-OS, and these nanoparticle regions are randomly dispersed to form a mosaic pattern in the CAC-OS.

The CAC-OS can be deposited by a sputtering method under conditions where a substrate is not heated intentionally, for example. In the case of depositing the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow rate of an oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

As described above, the CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility (μ) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, a leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and high field-effect mobility (μ) can be achieved.

A semiconductor element including a CAC-OS has high reliability. Thus, the CAC-OS is suitably used in a variety of semiconductor devices typified by a display.

At least part of this embodiment can be implemented in combination with any of the other embodiments described in this specification as appropriate.

EXPLANATION OF REFERENCE

10: housing, 11: display device, 11*a*: display region, 11*b*: display region, 11*c*: display region, 11*d*: display region, 12*a*: surface, 12*b*: surface, 12*c*: surface, 12*d*: surface, 12*e*: surface, 13*a*: icon, 13*b*: notification information, 13*c*: icon, 14: substrate, 15*a*: side, 15*b*: side, 16*a*: FPC, 16*b*: FPC, 16*c*: FPC, 17: IC, 18: driver circuit, 19: touch sensor, 21: light, 22: reflected light, 25: region, 26: broken line, 27: wiring, 29*a*: lamp, 29*b*: camera, 29*c*: audio device, 29*d*: charm hole, 30*a*: pixel unit, 30*b*: pixel unit, 30*c*: pixel unit, 30*d*: pixel unit, 30*e*: pixel unit, 30*f*: pixel unit, 31: display element, 31B: display element, 31G: display element, 31*p*: pixel, 31R: display element, 32: display element, 32B: display element, 32G: display element, 32*p*: pixel, 32R: display element, 32Y: display element, 35*r*: light, 35*t*: light, 35*tr*: light, 41: layer, 42: layer, 43: region, 50: adhesive layer, 51: adhesive layer, 52: adhesive layer, 60*a*: housing, 60*b*: housing, 61: display device, 61*a*: display region, 61*b*: display region, 61*c*: display region, 61*d*: display region, 61*e*: display region, 61*f*: display region, 61*g*: display region, 61*h*: display region, 61*i*: display region, 61*j*: display region, 62*a*: surface, 62*b*: surface, 62*c*: surface, 62*d*: surface, 62*e*: surface, 62*f*: surface, 62*g*: surface, 62*h*: surface, 62*i*: surface, 62*j*: surface, 63*a*: icon, 63*b*: notification information, 63*c*: icon, 63*d*: notification information, 64: substrate, 65*a*: side, 65*b*: side, 65*c*: side, 65*d*: side, 65*e*: side, 66*a*: FPC, 66*b*: FPC, 66*c*: FPC, 67: IC, 68*a*: driver circuit, 68*a*': region, 68*b*: driver circuit, 69: touch sensor, 81: region, 82: region, 100: display panel, 101: resin layer, 102: resin layer, 110: transistor, 110*a*: transistor, 110*b*: transistor, 110*c*: transistor, 111: conductive layer, 112: semiconductor layer, 113*a*: conductive layer, 113*b*: conductive layer, 114: conductive layer, 115: conductive layer, 120: light-emitting element, 121: conductive layer, 122: EL layer, 123: conductive layer, 131: insulating layer, 132: insulating layer, 133: insulating layer, 134: insulating layer, 135: insulating layer, 136: insulating layer, 137: insulating layer, 141: insulating layer, 151: adhesive layer, 152: coloring layer, 153: light-blocking layer, 200: display panel, 201: resin layer, 202: resin layer, 204: insulating layer, 210: transistor, 211: conductive layer, 212: semiconductor layer, 213a: conductive layer, 213b: conductive layer, 220: liquid crystal element, 221: conductive layer, 222: liquid crystal, 223: conductive layer, 224a: alignment film, 224b: alignment film, 225: region, 231: insulating layer, 232: insulating layer, 233: insulating layer, 234: insulating layer, 300: display device, 311: electrode, 311b: electrode, 340: liquid crystal element, 351: substrate, 360: light-emitting element, 360b: light-emitting element, 360g: light-emitting element, 360r: light-emitting element, 360w: light-emitting element, 361: substrate, 362a: display portion, 362b: display portion, 362c: display portion, 364: circuit portion, 365: wiring, 366: circuit portion, 367: wiring, 372: FPC, 373: IC, 374: FPC, 375: IC, 400: display device, 401: transistor, 402: transistor, 403: transistor, 404: light-emitting element, 405: capacitor, 406: connection portion, 407: wiring, 410: pixel, 411: insulating layer, 412: insulating layer, 413: insulating layer, 414: insulating layer, 415: insulating layer, 416: spacer, 417: adhesive layer, 419: connection layer, 421: electrode, 422: EL layer, 423: electrode, 424: optical adjustment layer, 425: coloring layer, 426: light-blocking layer, 451: opening, 475: insulating layer, 476: insulating layer, 478: insulating layer, 501: transistor, 503: transistor, 505: capacitor, 506: connection portion, 511: insulating layer, 512: insulating layer, 513: insulating layer, 514: insulating layer, 517: adhesive layer, 519: connection layer, 529: liquid crystal element, 543: connector, 562: electrode, 563: liquid crystal, 564a: alignment film, 564b: alignment film, 565: coloring layer, 566: light-blocking layer, 567: insulating layer, 572: substrate, 576: insulating layer, 578: insulating layer, 591: conductive layer, 592: conductive layer, 599: polarizing plate, 610: display device, 611: substrate, 612: substrate, 711a: conductive layer, 711b: conductive layer, 712: liquid crystal, 713: conductive layer, 717: insulating layer, 721: insulating layer, 730: polarizing plate, 731: coloring layer, 732: light-blocking layer, 733a: alignment film, 733b: alignment film, 734: coloring layer, 740: liquid crystal element, 741: adhesive layer, 742: adhesive layer, 751: substrate, 760: light-emitting element, 761: substrate, 762: display portion, 764: circuit portion, 772: FPC, 791: conductive layer, 792: EL layer, 793a: conductive layer, 793b: conductive layer, 801: transistor, 804: connection portion, 805: transistor, 806: transistor, 807: connection portion, 811: insulating layer, 812: insulating layer, 813: insulating layer, 814: insulating layer, 815: insulating layer, 816: insulating layer, 817: insulating layer, 820: insulating layer, 821: conductive layer, 822: conductive layer, 824: conductive layer, 831: semiconductor layer, 842: connection layer, 843: connector, 851: opening, 852: connection portion This application is based on Japanese Patent Application serial no. 2016-116264 filed with Japan Patent Office on Jun. 10, 2016 and Japanese Patent Application serial no. 2016-124684 filed with Japan Patent Office on Jun. 23, 2016, the entire contents of which are hereby incorporated by reference.

The invention claimed is:

1. An electronic device comprising:
   a display panel including display regions in both end portions of a first direction of the display panel,
   wherein the display regions in both end portions of the first direction of the display panel each comprise a protruded portion extending in a second direction of the display panel, the second direction being perpendicular to the first direction,
   wherein a width of the protruded portion in the first direction is smaller than a width of one of the display regions in the first direction, and
   wherein the display panel comprises an EL element.

2. The electronic device according to claim 1, wherein the second direction is a longitudinal direction of the display panel.

3. The electronic device according to claim 1, wherein the display regions are bendable in the first direction.

4. The electronic device according to claim 1, further comprising a housing,
   wherein the housing comprises side surfaces facing each other,
   wherein the display regions are over the side surfaces of the housing, and
   wherein the display regions each include a curved surface.

* * * * *